United States Patent [19]
Saito et al.

[11] Patent Number: 5,629,888
[45] Date of Patent: May 13, 1997

[54] SEMICONDUCTOR MEMORY DEVICE AND METHOD OF OPERATION THEREOF

[75] Inventors: Ryuichi Saito; Hidekatsu Onose, both of Hitachi; Yutaka Kobayashi, Katsuta; Michio Ohue, Hitachi, all of Japan

[73] Assignee: Hitachi, Ltd., Tokyo, Japan

[21] Appl. No.: 182,503

[22] Filed: Jan. 18, 1994

Related U.S. Application Data

[62] Division of Ser. No. 738,601, Jul. 31, 1991, Pat. No. 5,307,304.

[30] Foreign Application Priority Data

Aug. 3, 1990 [JP] Japan ................................. 2-205004

[51] Int. Cl.$^6$ ................................................. G11C 11/22
[52] U.S. Cl. ........................ 365/145; 365/149; 365/210
[58] Field of Search .................................. 365/145, 149, 365/210; 257/295

[56] References Cited

U.S. PATENT DOCUMENTS

| | | | |
|---|---|---|---|
| 3,990,057 | 11/1976 | Kumada | 365/145 |
| 4,873,664 | 10/1989 | Eaton, Jr. | 365/145 |
| 4,914,627 | 4/1990 | Eaton, Jr. et al. | 365/145 |
| 5,010,518 | 4/1991 | Toda | 365/145 |

*Primary Examiner*—Joseph A. Popek
*Attorney, Agent, or Firm*—Antonelli, Terry, Stout & Kraus, LLP

[57] ABSTRACT

A semiconductor memory device has a plurality of memory cells in an array, into which the memory cells data is writable, and which can subsequently be read. Each memory cell has a switching element with one terminal connected to a bit line of the array another terminal connected to at least one ferroelectric capacitor, and a control terminal connected to a word line. The cell may then be operated to detect the change in polarization of the ferroelectric capacitor when a voltage is applied which is not sufficient to cause a change of state of the ferroelectric capacitor. Alternatively, a ferroelectric capacitor and a capacitor other than a ferroelectric capacitor is connected to the switching element. In a further alternative, a plurality of ferroelectric capacitors are connected to the switching element, so that different data are writable into each.

21 Claims, 38 Drawing Sheets

SEMICONDUCTOR MEMORY DEVICE AND METHOD OF OPERATION THEREOF

This is a divisional of application Ser. No. 738,601, filed Jul. 31, 1991, now U.S. Pat. No. 5,307,304.

BACKGROUND OF THE INVENTION

1. Field of the Invention

The present invention relates to a semiconductor memory device, having at least one, normally a plurality, of memory cells. It also relates to a method of operating such a semiconductor memory device.

2. Summary of the Prior Art

In a semiconductor memory device, such as a DRAM or SRAM, a plurality of memory cells are provided, each having a switching element and a capacitive element connected to the switching element. Peripheral control circuits control the voltage across the connected switching element and capacitive element, and also control the signal to a control terminal of the switching element, to permit data to be stored in the respective memory cells by suitable storage of charge in each capacitive elements. The capacitive elements are controlled so that they define logical "1" and logical "0" states, and thus the memory device, as a whole, can store data in the form of logical signals in each of the memory cells.

In U.S. Pat. No. 4,873,664 it was proposed that the capacitive element of such a memory device be in the form of a ferroelectric capacitive element. Such an element may be polarised in different directions, and exhibits a hysteresis effect in the change from one polarisation to another. Thus, if the ferroelectric capacitive element is in one polarisation state, it may be changed to another polarisation state by application of a suitable voltage. However, when that voltage is removed, the polarisation will not change back to the first state, but will remain in the second state. In order to change back to the first state, a suitable voltage in an opposite direction must be applied. Thus, the use of ferroelectric capacitive elements in memory cells of a memory device gives the advantage that the data stored by the memory is not lost even when power is removed from the memory device.

In U.S. Pat. No. 4,914,627, the idea of U.S. Pat. No. 4,873,664 was developed further, by providing two ferroelectric capacitive elements in each memory cell. The two ferroelectric capacitive elements were connected in common to a terminal of the switching element of the memory cell. In U.S. Pat. No. 4,914,627, it was proposed that the same data be written in to each of the two ferroelectric capacitive elements of the memory cell, and then the data read out separately.

SUMMARY OF THE PRESENT INVENTION

The present invention seeks to develop further the idea of using one or more ferroelectric capacitive elements in a memory cell of a semiconductor memory device, by considering various problems that have been found to exist in such devices. The present invention has a number of aspects, and these aspects fall into three groups.

The first group of aspects of the present invention considers the energy (power) used by the semiconductor memory device. In the semiconductor memory device of U.S. Pat. Nos. 4,873,664 and 4,914,627, data was written into the ferroelectric capacitive element by applying a suitable voltage across that ferroelectric capacitive element to change the polarisation state thereof. This used energy, but this energy requirement could not be avoided since it was the change of state which indicated the logical status of the memory cell. However, in order to read that information, the arrangements of U.S. Pat. No. 4,873,664 and U.S. Pat. No. 4,914,627 used a read-out method in which the polarisation of the ferroelectric capacitive element was reversed, and the change in voltage detected. That change depended on the initial polarisation state, and therefore the initial logical state could be determined. Of course, this then changed the logical state of the ferroelectric capacitive element, and therefore it was necessary to apply a reverse voltage to return the ferroelectric capacitive element to its original state. Thus, on read-out, the ferroelectric capacitive element passed through the whole of its hysteresis cycle. Hence, the read-out operation used a considerable amount of power.

It has now been appreciated that an alternative read-out method is possible. Consider a ferroelectric capacitive element in one of its polarisation states. If a voltage is applied across it in one direction, there are then two possibilities. Firstly, if the direction of that voltage is such to maintain the device in its present polarisation state, then there will be no change in the polarisation, or possibly a small increase in polarisation, depending on the exact shape of the hysteresis curve of the ferroelectric capacitive element. If, on the other hand, the voltage applied is in a direction which, if the voltage is sufficient, will cause it to change its state, then the change in polarisation is larger. Of course, if the voltage applied is in the direction corresponding to a change in state, and the voltage is sufficiently large, then that change of state will occur, as in the prior art. If, however, the voltage is smaller than that needed to change the state, then the removal of that voltage will cause the ferroelectric capacitive element to return to its original state. Therefore, a first aspect of the present invention proposes that this effect is used for the read-out of the logical state of the ferroelectric capacitive element.

Thus, a voltage may be applied which is not sufficient towards a change of state, and the change in polarisation detected. If the ferroelectric capacitive element is one polarisation, the change in polarisation due to the electric field will be zero or small. If the ferroelectric capacitive element is in the other polarisation state, the change in polarisation will be larger, and this difference can then be detected to determine the initial polarisation state. When the voltage is removed, the initial state will be restored, so that less power is consumed. Normally, the ferroelectric capacitive element of the or each memory cell will have one terminal thereof connected to a terminal of a switching element, and thus the polarisation is controlled and determined by signals applied to the other terminal of the ferroelectric capacitive element, and to the control and other terminal of the switching element.

Preferably, the determination of the change in polarisation is on the basis of comparison with a further ferroelectric capacitive element of another cell ("dummy cell") which is in a fixed polarisation. If the same voltage is applied to the ferroelectric capacitive element of the dummy cell, then either the two ferroelectric capacitive elements will both exhibit substantially the same change in polarisation (in which case they are both in the same polarisation state) or they will exhibit different changes in polarisation, in which case they are in opposite polarisation states. Since the polarisation state of the ferroelectric capacitive element of the dummy cell is fixed, the comparison determines the polarisation state, and hence the logical state, of the ferroelectric capacitive element from which data is to be read out.

The second aspect of the present invention also considers energy saving, and proposes that each memory cell has at least one ferroelectric capacitive element, and at least one capacitive element which is not a ferroelectric capacitive element. The ferroelectric capacitive element(s) and the other capacitive element(s) each have a terminal connected in common to a terminal of a switching element of the memory cell. Data can be written into such a memory cell by controlling the polarisation of the ferroelectric capacitive element, and this data will not be lost even if power is removed from the semiconductor memory device. In the read-out operation, respective signals are applied to the ferroelectric capacitive element(s) and the other capacitive element(s). The voltage appearing at their common connection will then depend on the polarisation state of the ferroelectric capacitive element(s), and by detecting that voltage it is then possible to determine the polarisation state of the ferroelectric capacitive element.

Thus, the second aspect permits detection of the polarisation state without applying a signal causing a change in state, so again power consumption can be reduced.

The second group of aspects of the present invention are concerned with increasing the amount of data that can be stored in the memory device without a substantial increase in area. In U.S. Pat. No. 4,914,627, it was proposed that each memory cell had two ferroelectric capacitive elements, also required that the same data was to be written into each. A third aspect of the present invention proposes that the memory cell has two or more ferroelectric capacitive elements, and that those ferroelectric capacitive elements are controlled independently, so that each may receive different data signals. Thus, the memory cell may store as many bits as there are ferroelectric capacitive elements.

This third aspect of the present invention has the disadvantage that the terminal of each ferroelectric capacitive element of the memory cell which is not connected to the switching element has to be connected to a respective plate line, so that the number of plate lines increases with the number of bits which each memory cell will store. However, it has also been realised that the ferroelectric properties of a ferroelectric capacitive element will depend on the characteristics of that element, and therefore it is possible to provide a memory cell with a plurality of ferroelectric capacitive elements, with those ferroelectric capacitive elements having different characteristics. Thus, a first ferroelectric capacitive element may have its voltage changed by a first voltage, a second ferroelectric element have its voltage changed at a second voltage higher than the first, a third ferroelectric capacitive element have its polarisation changed at a third voltage higher than the second, etc. Thus, the terminals of the ferroelectric elements which are not connected to the switching element may be connected to a common line, and their switching will depend on the voltage applied on that line, so it is possible to switch one or more of the ferroelectric capacitive elements without switching others. Thus, again, the memory cell may store more than one bit. Therefore, the use of such ferroelectric capacitive elements with different characteristic represents a fourth aspect of the present invention.

In both the third and fourth aspects of the present invention, which make use of a plurality of ferroelectric capacitive elements, the ferroelectric capacitive elements may be stacked one above the other, to reduce the area of the semiconductor memory device occupied thereby. Furthermore, they can be stacked above the switching element, which again reduces the space needed for the cell.

In a fifth aspect of the present invention, which again permits a multi-bit cell, it is proposed that the ferroelectric capacitive element is designed to have a plurality of polarisation states, so that it is possible to selectively put the ferroelectric element into one of those states, and the different states permit different bits to be stored.

The third group of aspects of the present invention concern the design of the ferroelectric capacitive element itself.

Firstly, in a sixth aspect of the present invention, it is proposed that the ferroelectric body of the ferroelectric element has its polarisation direction substantially parallel to the direction of the electric field which will be applied across in this way, the polarisation characteristics may be maximized. Preferably, the direction of polarisation is exactly parallel to the field for the whole of the body, but this is difficult to achieve in practice. It has been found that satisfactory characteristics are obtained if at least 80% of the body has a polarisation axis within 5° of the direction of the field.

The polarisation effect will also be sffected by the relationship by the direction of polarisation and the crystal surfaces, and therefore a seventh aspect of the present invention proposes that a surface of the crystal or crystals of the ferroelectric body is parallel to the polarisation direction. Again, this gives improved ferroelectric properties.

In an eighth aspect of the present invention, the ferroelectric capacitive element is given a random polarisation, which means that it will not exhibit ferroelectric properties and thus can be used as a standard capacitive element.

Finally, in investigation of ferroelectric capacitive elements, it has been found that problems occur if the ohmic contact of the terminals of the capacitive element is in direct contact with the ferroelectric body of the capacitive element. Therefore, a ninth aspect of the present invention proposes that the respective terminals are separated from the ferroelectric body by an insulation layer.

It should be noted that although each of these aspects are independent, practical semiconductor device may embody any one, or more than one, of these aspects. Thus, the aspects may be combined if desired. It should also be noted that, for each of these aspects, the present invention relates to both the semiconductor memory device itself, and to a method of operation thereof.

BRIEF DESCRIPTION OF THE DRAWINGS

Embodiments of the invention will now be described in detail, by way of example, with reference to the accompanying drawings, in which:

FIG. 23 is a diagram showing the crystal grain of ferroelectric material to be used in Embodiment 15 of the present invention;

DETAILED DESCRIPTION

Before discussing embodiments of the present invention, the general principles of operation of a ferroelectric capacitor will be explained.

Figure 1:
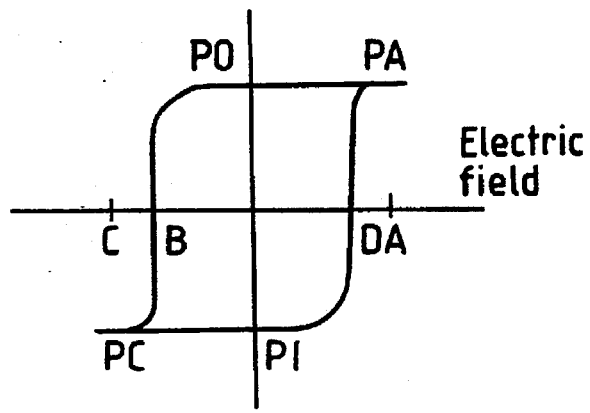
FIG. 1 is a diagram showing the relationship between the electric field applied to ferroelectric material and the polarization.
Figure 2:
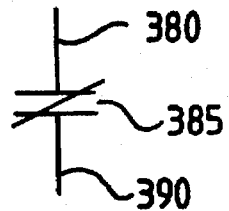
FIG. 2 is a circuit diagram showing a ferroelectric capacitor.

FIG. 1 shows a hysteresis curve representing the operation characteristics of ferroelectric material and the relationship between an electric field applied to the ferroelectric material and the polarization. FIG. 2 shows the standard circuit symbol for a ferroelectric capacitor 385.

First suppose a polarization PA is established if an electric field is applied of a value corresponding to point A in FIG. 1 by applying a positive potantial between a lower electrode 390 of the ferroelectric capacitor 385 and an upper electrode 380. If the electric field is then reduced to zero, the polarization does not reduce to zero (0) but reduces to a residual polarization, as indicated at point PO. If the electric field is then reversed and is applied with a value indicated by point B in FIG. 2, the polarization disappears. If a larger electric field, in the reversed direction, is applied to a value indicated by point C, a reverse polarization PC is established.

If the electric field is returned to zero (0) the polarization then takes a value P1, i.e. has a polarisation opposite to that at point PO. If the electric field is changed to a value indicated by point D, the polarization disappears. The electric fields at the points B and D are called the "field resistance". If the electric fiueld is again applied with a value corresponding to point A, the polarization takes the value PA. As a result, two different residual polarized states P0 and P1 are present in the state of zero (0) electric field. These hysteresis characteristics are caused by the chagne in the relative positions of the atoms of the ferroelectric crystals, and the residual polarization does not change with time unless an electric field is applied.

Moreover, the hysteresis characteristics are generally rectangular, as shown in FIG. 1 so there is no change in the state corresponding to the case where residual polarization is present (i.e. the residual polarized state) even if a positive or negative electric field lower than the field resistance is applied. If, therefore, the residual polarized state at the valie indicated at P0 is considered to correspond to logical "0" whereas the residual polarized state at the value indicated at P1 is cosidered to correspond to logical "1" a nonvolatile memory can be achieved.

Figure 3:
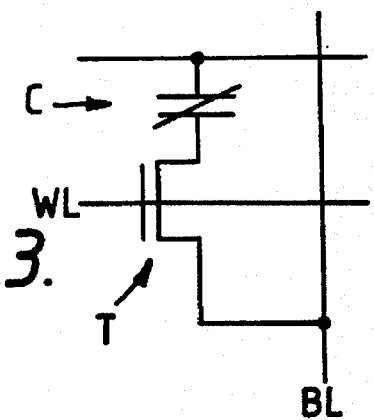
FIG. 3 is an equivalent circuit diagram of the memory cell incorporating the capacitor of FIG. 2.

FIG. 3 shows the equivalent circuit of a memory cell using such a ferroelectric capacitor. This memory cell has one switching element in the form of a transistor T and one capacitive element (e) connected in series with the transistor T to provide a memory, cell of 1 bit. The dielectric material used to make the capacitive element of the memory cell is of the ferroelectric material. Then the memory state of the cell can be stored in a nonvolatile manner by making use of the residual polarization of the ferroelectric material.

The basic principles of a ferroelectric capacitor and of the memory cell shown in FIG. 3 are also discussed in U.S. Pat. No. 4,873,664 and U.S. Pat. No. 4,914,627.

Embodiment 1

Figure 4:
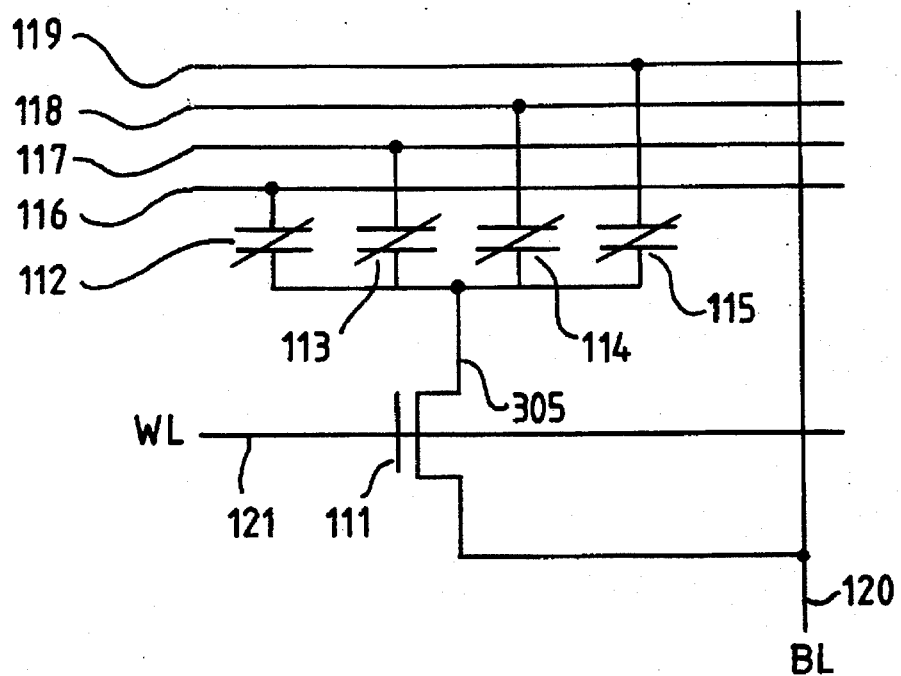
FIG. 4 is an equivalent circuit diagram showing a memory cell according to the Embodiment 1 of the present invention.

FIG. 4 is an equivalent circuit showing one memory cell of a first embodiment according to the present invention. In the first embodiment, a field effect transistor (MOSFET) is used as the switching element (selection transistor).

As shown in FIG. 4, the source (or drain) electrode of a MOSFET 111, being the switching element, forms a common electrode 305 connected to electrodes of four ferroelectric capacitors 112, 113, 114 and 115.

Four ferroelectric capacitors are shown in FIG. 1 for exemplifying the description but the number of ferroelectric capacitors may be two or more, in accordance with this embodiment. The electrodes of the capacitors 112, 113,114 and 115 which are not connected to the MOSFET 111 are independently connected to respective plate lines 116, 117, 118 and 119, respectively. The MOSFET 111 has its other electrode (source or drain depending on whether the electrode 305 is drain or source) connected to a bit line 120 (BL) and its control electrode (gate electrode) connected to a word line 121 (WL). The plate lines 116, 117, 118 and 119 are shown to be arranged in parallel with the word line 121 (WL) in FIG. 4 but may be strictly or generally in parallel in a memory cell array of an actual semiconductor device exemplifying the present embodiment.

As will be described in more detail subsequently, the increase in the area to be occupied by one memory cell can be kept small or eliminated by stacking the ferroelectric capacitors and the plate lines, even if the numbers of elements and wiring lines are increased for one memory cell.

Figure 5:
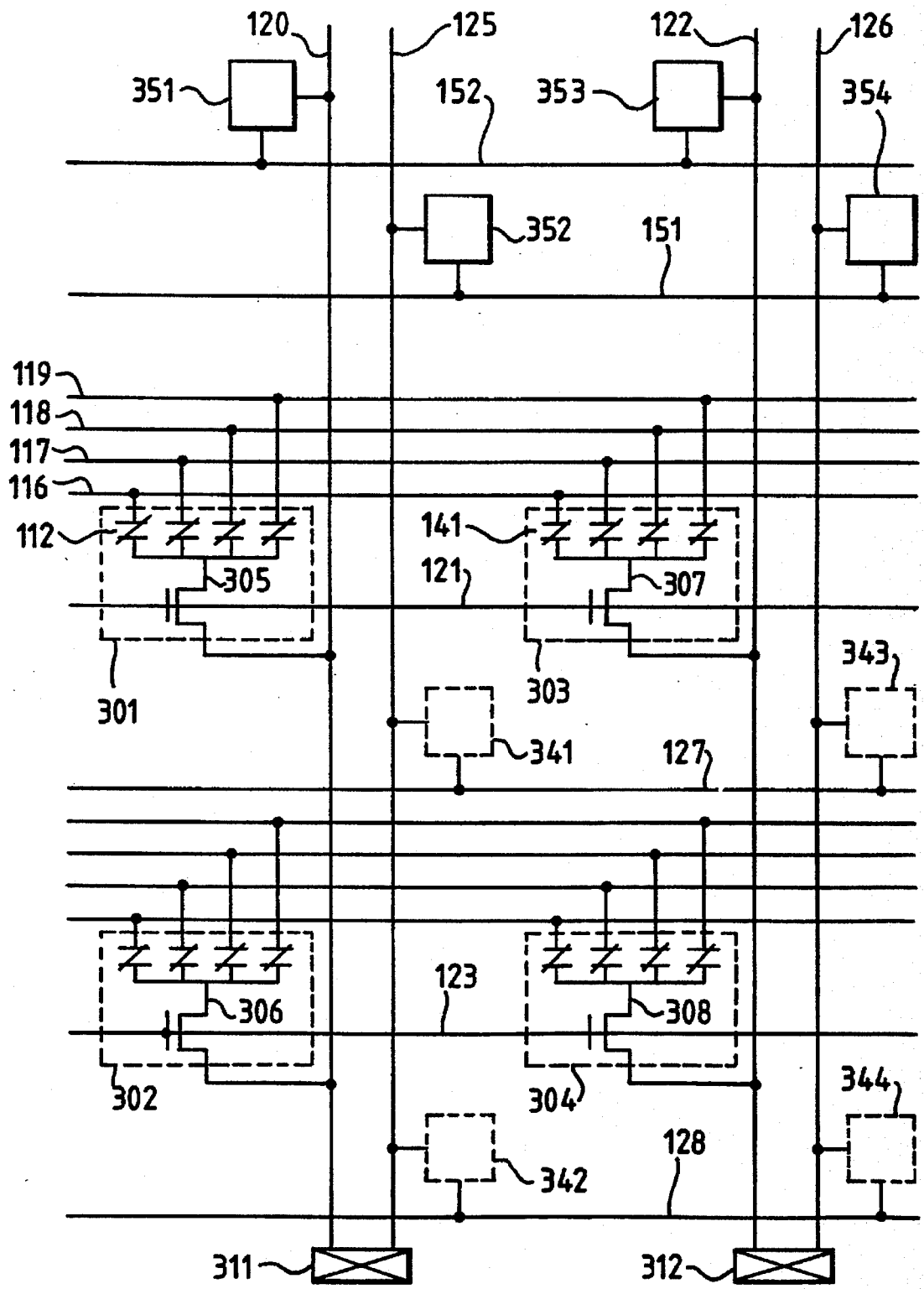
FIG. 5 is an equivalent circuit diagram showing the memory cell group according to Embodiment 1 of the present invention.

In order to clarify the operation of the elements in the structure of the present embodiment, other adjoining and neighboring memories are shown in FIG. 5. FIG. 5 shows eight memory cells, each corresponding to the circuit shown in FIG. 4. This number of memory cells is shown for descriptive convenience but the number of memory cells will be more in a practical memory device incorporating the present invention.

Each memory cell is indicated by a respective block 301, 302, 303 and 304 and 341, 342, 343 and 344, as enclosed by broken lines. The memory cells 341, 342, 343 and 344 are merely framed by broken lines, and have detailed structures identical to those of the memory cells 301, 302, 303 and 304 and are likewise connected with bit lines, word lines and plate lines. It should be noted that each memory cell can store 4 bits in the present embodiment.

FIG. 5 further shows dummy memory cells 351, 352, 353 and 354, which are shown only as a block, but have a circuit structure identical to that shown in FIG. 3. Moreover, the ferroelectric capacitors in the dummy memory cells may have capacitances which have higher values than the capacitances of one ferroelectric capacitor in a memory cell. Furthermore, the polarization state of the ferroelectric capacitors in the dummy cells are always set at a fixed value, for example, the value corresponding to logical "0".

The memory cells 301 and 302 are connected to the common bit line 120, one end of which is connected to a sense amplifier 311. The memory cells 341 and 342 are connected to a common bit line 125, which also has one end connected to the sense amplifier 311. In a similar way, the memory cells 303 and 304 are connected to a common bit line 122 whereas the memory cells 343 and 344 are connected to a common bit line 126, and their ends are connected to a sense amplifier 312. The bit lines 120 and 125 and the bit lines 122 and 126 make individually complementary pairs.

Furthermore: the memory cells 301 and 303 are connected to the common word line 121; the memory cells 302 and 304 are connected to a common word line 123; the memory cells 341 and 343 are connected to a common word line 127; and the memory cells 342 and 344 are connected to a common word line 128. The word lines 121 and 127 and the word lines 123 and 128 may be considered to be adjoining each other. Likewise, the memory cells arrayed in the direction of the word lines are connected to common plate lines. Moreover, a dummy memory cell is connected to each bit line. The dummy memory cells 351 and 353 are connected to a common dummy word line 152, and the dummy memory cells 352 and 354 are connected to a common dummy word line 151. If a memory cell or a dummy memory cell is present at a node of a word line (or dummy word line) and a bit line, neither any memory cell nor any dummy memory cell is present at a node of the adjoining complementary bit line and word line (or dummy word line).

When the word line 121 or 123 is selected, the dummy word line 151 is simultaneously selected. Similarly, when the word line 127 or 128 is selected, the dummy word line 152 is simultaneously selected. When a certain memory cell is thus selected, a dummy memory cell is simultaneously selected which is connected to a bit line complementary to the bit line connected with the former memory cell. For each bit line, moreover, there is equivalently connected Thereto a bit line capacitance. This bit line capacitance is far higher than the ordinary bit capacitance. For each plate line, on the other hand, there is equivalently connected thereto a plate line capacitance. This plate line capacitance is set, for example, at a sufficiently lower level than that of the bit capacitance.

Figure 6:
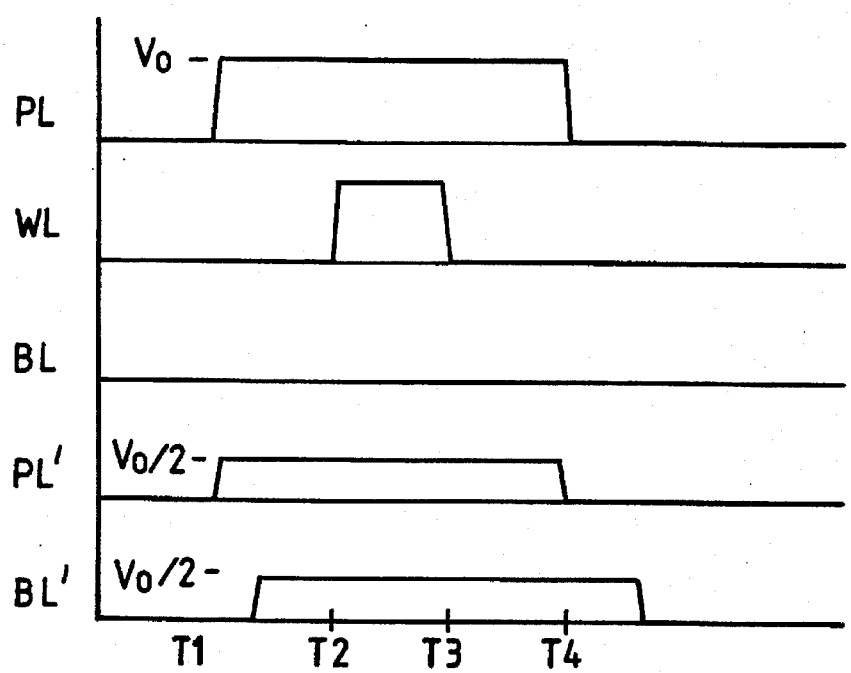
FIG. 6 is a diagram showing the writing waveforms for the memory cell of Embodiment 1.

The writing operation waveforms for the memory of FIG. 5 will now be discussed with reference to FIG. 6. Suppose that, initially, the word line is OFF, corrisponding to a standby state, so that the common electrodes 305, 306, 307 and 308 are substantially in a floating state. At this time, all the plate lines are at an earth potential. As a result, no potential is applied to any of the ferroelectric capacitors so that their polarization states are maintained unchanged. Consider now the memory cell 301 shown in FIG. 5. When information corresponding to logical "0" is to be written in the ferroelectric capacitor 112, a write voltage Vo (as indicated at PL in FIG. 6) is applied at a time T1 to the plate line 118. Simultaneously with this, a voltage such as Vo/2 (as indicated at PL' in FIG. 6) to other plate lines. These other plate lines (PL') are precharged with the voltage of Vo/2 and are brought into floating states. As a result, for the period from the time T1 to a time T2, all the ferroelectric capacitors are supplied with a potential equal to or lower than Vo/2 so that their states are unchanged by controlling the hysteresis characteristics rectangularly and by setting the value of the field resistance suitable. The bit line 120 is fixed at the earth potential (as indicated at BL in FIG. 5) during a series of operations. Other bit lines are precharged to Vo/2 till the time T2 and are brought into floating states (as indicated at BL' in FIG. 6). For the period from the time T2 to a time T3, a voltage (as indicated at WL in FIG. 6) is applied to the word line 121 to turn ON the MOSFET 111. Then, the potentials of the bit line 120 (BL) and the common electrode 305 are equalized a positive voltage with respect to the lower electrode of the ferroelectric capacitor 112 is applied to the upper electrode so that the information "0" is written in. For the time period between T2 and T3, what are applied to the upper and lower electrodes of other ferroelectric capacitors of the memory cell 301 are the floating voltage Vo/2 and the earth voltage so that their states are unchanged. In the memory cell 303 connected with the identical word line 121, on the other hand, the bit line 122 is precharged to Vo/2 so that the common electrode 307 is at about Vo/2 apply only the potential equal to or lower than Vo/2 to the ferroelectric capacitors in the same cell. The word line (WL) is turned OFF at the time T3, and the potentials of all the plate lines (PL and PL') restore their initial earth potential at a time T4. Moreover, the potentials of other bit lines (BL') restore their initial values, thus ending a series of operations. Incidentally, when an information "1" is to be written in, the operation waveforms of the plate line (PL) and the bit line (BL) may be interchanged.

The bit lines and plate lines left unselected by the foregoing operations are suitably precharged in the floating states but are not essential in the present invention. In other words, the bit line capacities need not be precharged if their magnitudes are suitably selected. In the ordinary structure, however, the bit line capacities are far higher than the bit capacities. As a result, for the time period between T2 and T3, for example, the voltage Vo is applied to the series connection between a ferroelectric capacitor 141 of the memory cell 303 and the bit line capacity because the potential of the plate line 116 (PL) is at Vo and because the other electrode of the bit line capacity is the earth potential. Since the bit line capacity is far higher than the bit capacity of the ferroelectric capacitor 141, the voltage is substantially applied to the capacitor 141 so that the state becomes liable to be broken. If, however, the precharge of Vo/2, for example, is suitably performed, as has been described hereinbefore, the precharge voltage is held so that the polarized state becomes hard to break. Thus, the drive method using the precharge suitably is a more effective method. It may also be noted that the series operations should normally be completed before the precharges are released. A precharge voltage of Vo/2 has been referred to in the foregoing description but may be set at or changed to another voltage in dependence upon the suitably selected timing.

Embodiment 2

Next, an embodiment of the reading operations will be described.

Figure 7:
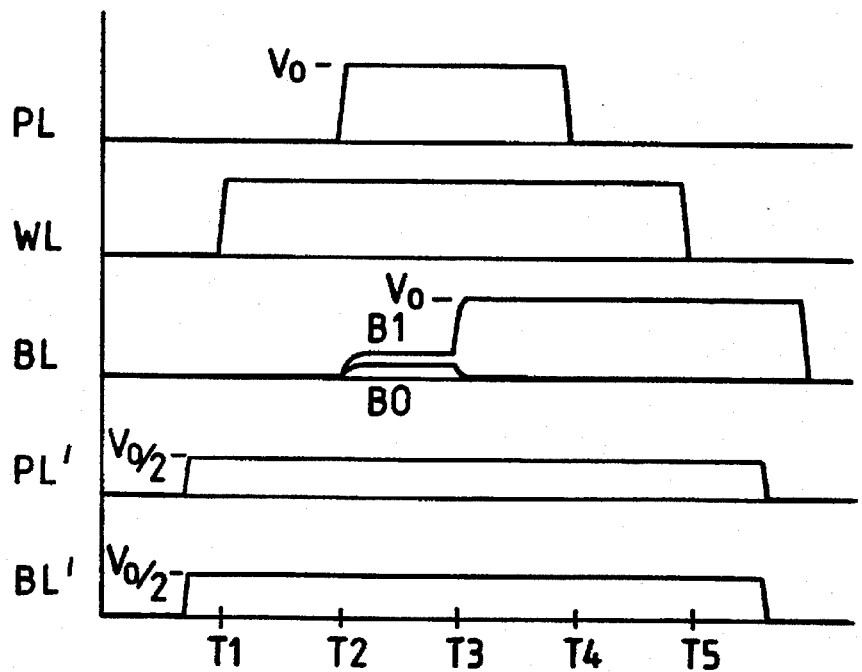
FIG. 7 is a diagram showing the reading waveforms for Embodiment 2 of the present invention.

FIG. 7 shows the reading waveforms, in which all the ferroelectric capacitors are fixed in the polarization states corresponding to logical "0" or "1". The reading of the state of the ferroelectric capacitor 112 of the memory cell 301 of FIG. 5 will be considered.

In this embodiment, the bit lines connected to the memory cell to be read and the complementary bit lines are brought into driven states different from those of other bit lines.

Initially, until the time T1, all the plate lines (PL') other than the plate line 116 (PL) and all the bit lines (BL') other than the bit lines 120 and 125 are precharged with a potential of Vo/2, for example, and brought into floating states.

Next, at the time T1, a voltage is applied to the word line 121 (WL) to ground the common electrode 305 and the bit line 120 to earth. The bit lines 120 and 125 (BL) are precharged to the earth potential and are held in the floating state.

At the time T2, voltage Vo is applied to the plate line 116 (PL). Then, the potential B1 or B0 appears on the bit line 120 (BL) in accordance with the polarization state of the ferroelectric capacitor 112. The potentials B1 and B0 correspond to the polarized states "1" and "0", respectively.

In the state "0", the polarization state is unchanged because the direction of polarization and the direction of voltage application are identical. In this case, there may be a slight change in the charge or polarization value proportion to the electric field. As a result, a small amount of charge flows through the bit line 120 so that the increase in the potential of the bit line 120 is small.

Simultaneously, the dummy cell 352 connected to the complementary bit line 125 is likewise read out. The polarization state of the dummy cell is always set at "0", as mentioned above. Since the ferroelectric capacitor of the dummy cell has a large capacity, the potential increase of the bit line 125 is larger than that of the bit line 120 so that the bit line 120 is detected to be "Low".

In the state "1", the direction of polarization and the direction of voltage application are opposite to each other. As a result, the polarization is inverted for the period between T2 and T3. In other words, the read operation in the present embodiment is destructive in the sense that it changes the polarization state. Since the polarization value is highly charged at this time, a large amount of charge flows through the bit line 120 so that the potential of the bit line 120 changes greatly. Since the potential increase of the complementary bit line 125 is as before, the potential increase in the bit line 120 is higher than that of the bit line 125 so that the potential appearing on the bit line 120 is detected to be "High".

At the time T3, the sense amplifier 311 starts to amplify the voltage to voltage Vo for the potential B1 and to the earth potential for the potential B0.

At the time T4, the potential on the plate line 116 (PL) is changed to the earth potential. Then, a positive potential with respect to the upper electrode is applied to the lower electrode, when the ferroelectric capacitor 112 is in the state "1", so that the initial state is rewritten into the memory cell.

When the capacitor 112 is in the state "0", no electric field is applied in the direction opposite to the initial direction of polarization so that the polarization state then remains unchanged.

After this, the word line 121 (WL) is turned OFF at the time T5, and the other electrodes are suitably set to the initial states.

Since no potential other than Vo/2 or less is applied during a series of operations to the capacitors other than the ferroelectric capacitor 112, their polarization states may be kept the same by controlling the hysteresis characteristics and by controlling the value of the field resistance.

Since, in the present embodiment, the precharge voltage to, or the timing for, the bit lines and the plate lines can be suitably selected, the potential to be applied to the ferroelectric capacitors left unselected can be reduced thereby improving the information latching characteristics.

Figure 8:
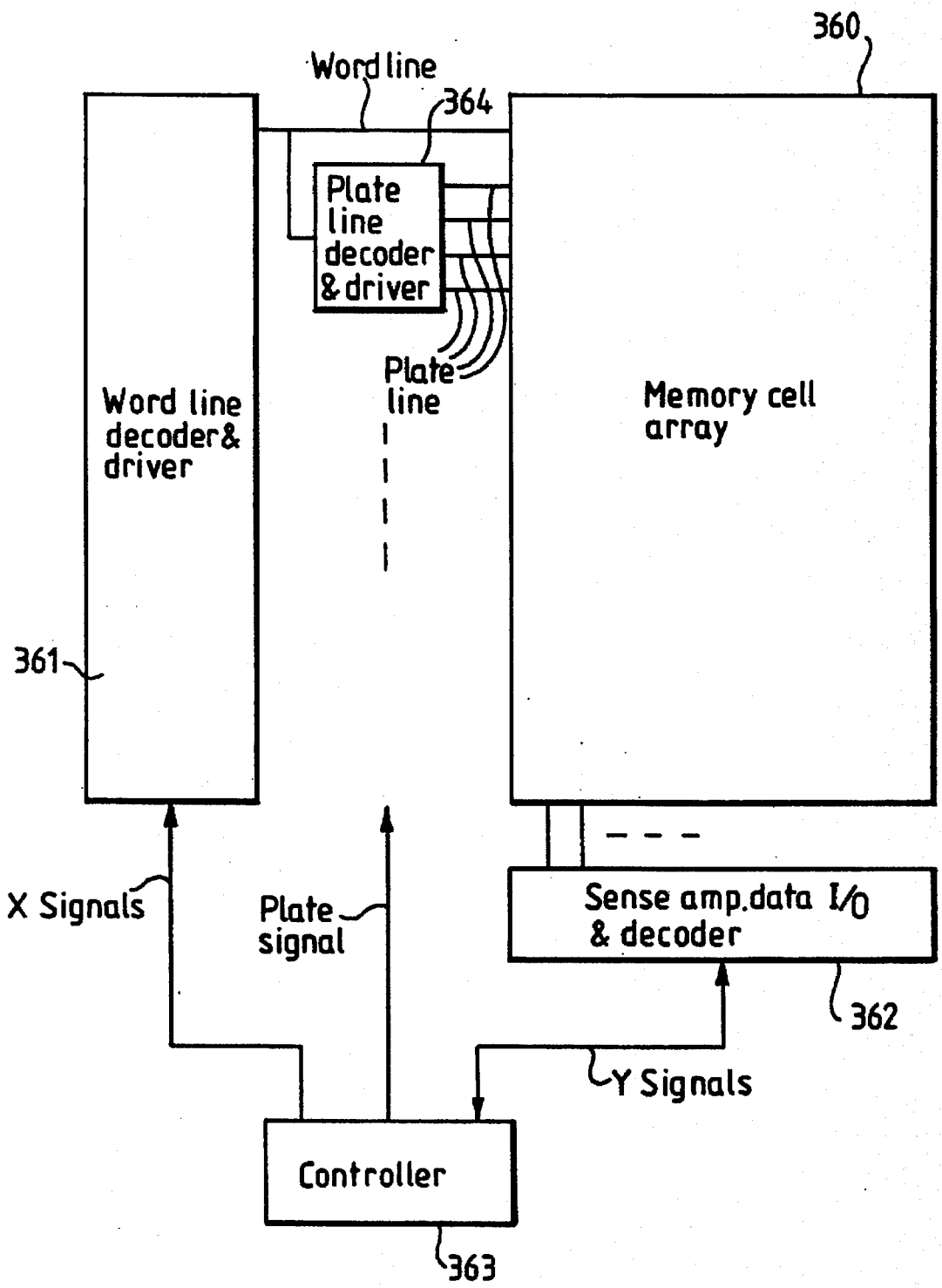
FIG. 8 shows one peripheral circuit arrangement.

In embodiments 1 and 2 above, the plate lines are parallel to the word lines. FIG. 8 shows the peripheral circuits for controlling the memory cell array in order to achieve the operations discussed with reference to FIGS. 6 and 7. FIG. 8 shows that the memory cell array 360, corresponding to the arrangement shown in FIG. 5, has the word lines thereof connected to a word line decoder and driver 361. In a similar way, a sense amplifier and decoder 362 is connected to the bit lines. The sense amplifier 362 thus incorporates the sense amplifiers 311 and 312 of FIG. 5. The word line decoder and driver 361 and the sense amplifier 362 are connected to a controller 363 which generates respective signals for controlling the word line decoder and driver 361 and sense amplifier 362 to apply suitable signals to the word lines and bit lines. This structure is generally similar to a conventional memory cell array and, because of the rectangular arrangement, the signals from the word line decoder and driver 361 are referred to as "X signals" and the signals from the sense amplifier 362 are called "Y signals".

Unlike conventional devices, however, a plate line decoder and driver 364 is provided for each group of plate lines (e.g. the group corresponding to plate lines 116, 117, 118, 119 in FIG. 5). Only one plate line decoder and driver 364 is shown in FIG. 8, for simplicity. The plate line decoder and driver 364 is connected to the controller 363, so that a suitable plate signal may be sent to the plate line decoder and driver 364 for selecting one or more of the plate lines connected to the plate line decoder and driver 354. The plate line decoder and driver 364 is activated when the corresponding word line is selected, and drives one or more of the plate lines of the selected memory cells in the manner described with reference to FIGS. 6 and 7.

Figure 9:
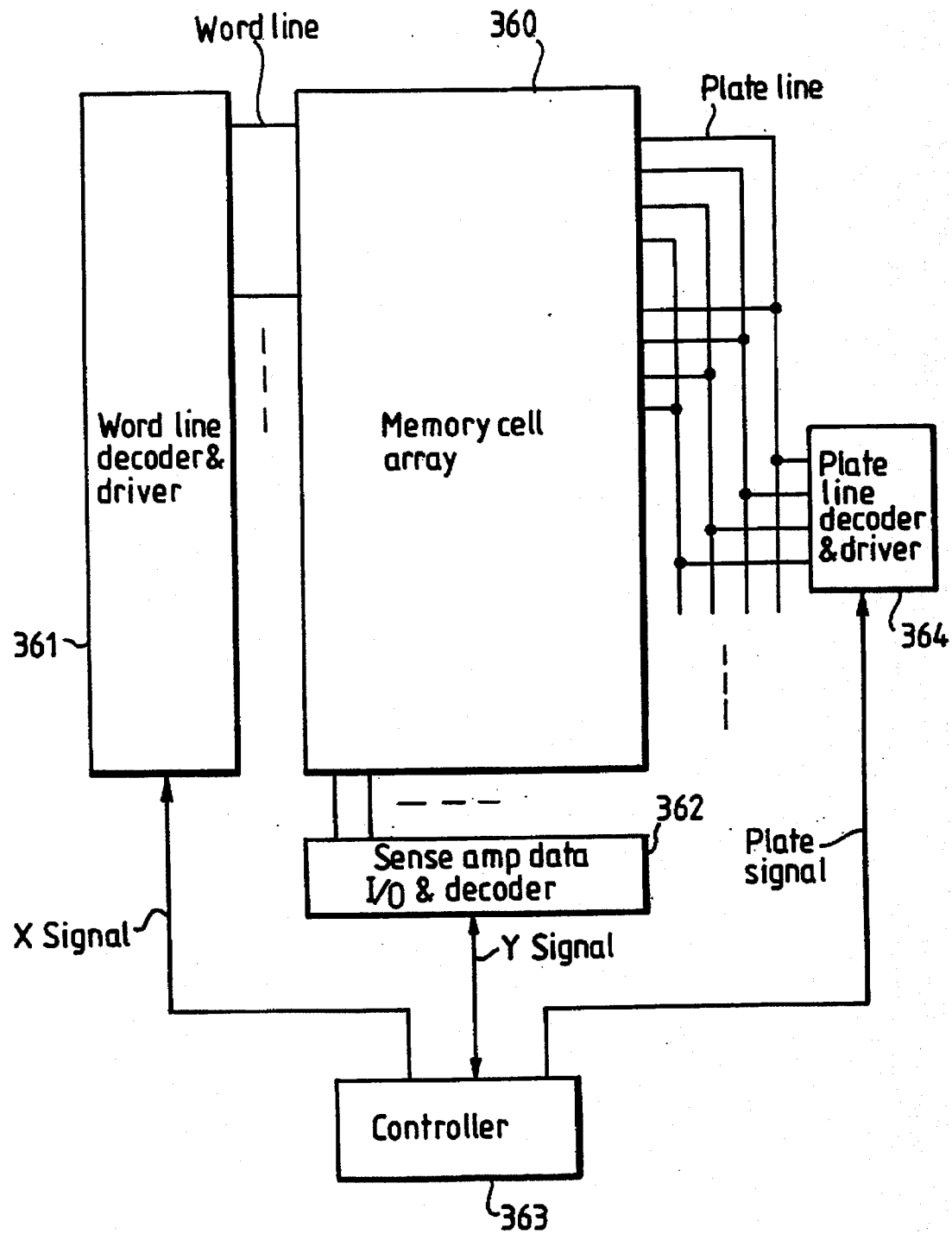
FIG. 9 shows a further peripheral circuit arrangement.

In the arrangement shown in FIG. 8, the plate line decoder and driver 364 is located between the memory cell array 360 and the word line decoder and driver 361. FIG. 9 shows another arrangement in which the plate line decoder and driver 364 is located on the opposite side of the memory cell array 360 from the word line decoder and driver 361. Furthermore, in the arrangement of FIG. 9, individual plate lines of each group of plate lines are connected to the corresponding plate line of the other groups, so that the plate line decoder and driver 364 is connected in common to the corresponding member of each group of plate lines.

Embodiment 3

In the present embodiment, the plate lines are arranged parallel to the bit lines, rather than the word lines as in the previous embodiments.

Figure 10:
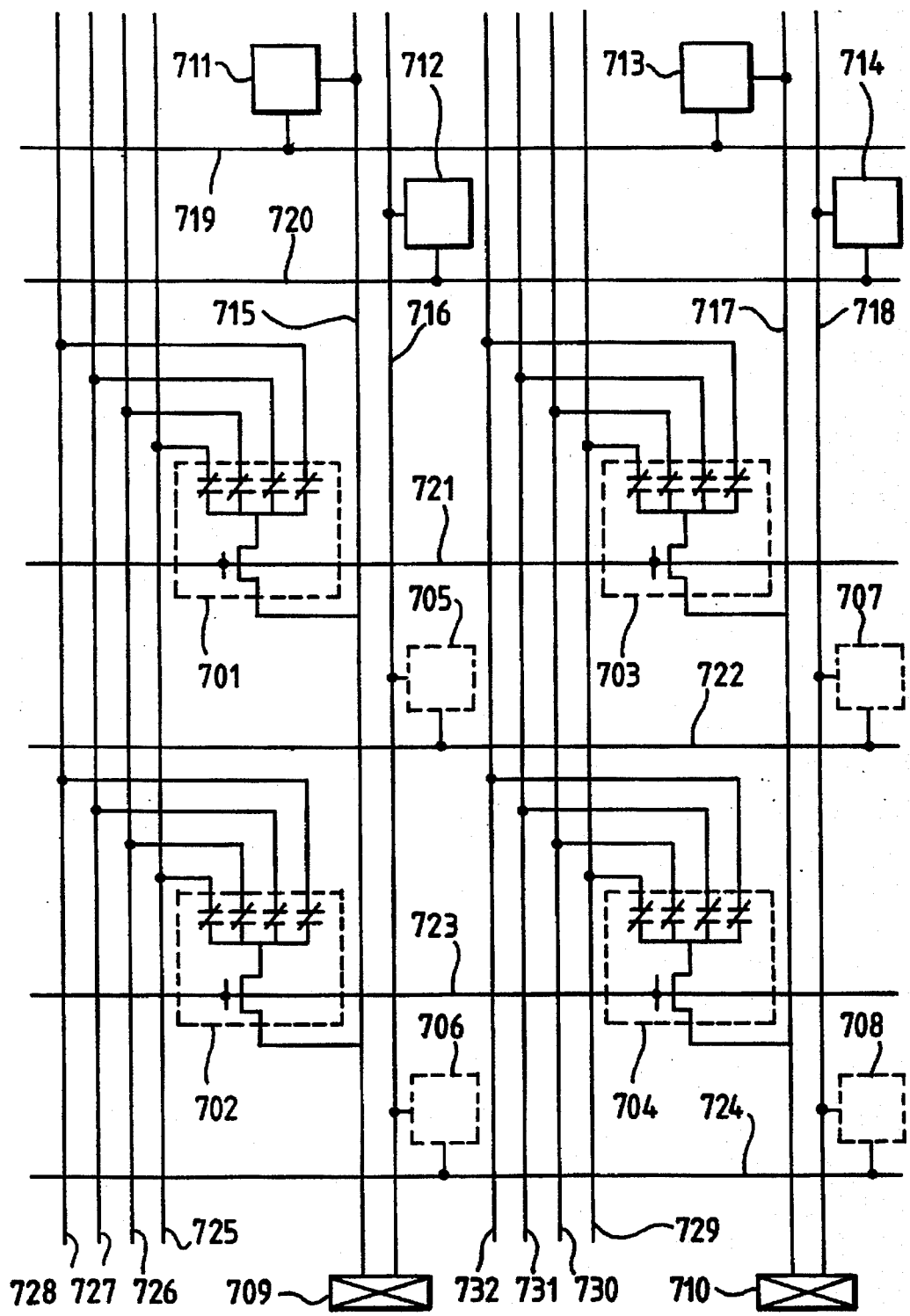
FIG. 10 is an equivalent circuit diagram showing the memory cell group of Embodiment 3 of the present invention.

FIG. 10 is a circuit connection diagram showing the resulting structure. In the present embodiment, like that of FIG. 5, only four memory cells will be described complementary memory cells and dummy cells. The memory cell has a structure which, like that of FIG. 5 gives 4 bits per cell, i.e., four ferroelectric capacitors and one selection transistor but may have a structure which gives more bits per cell.

The 4-bit memory cells 701, 702, 703 and 704, as shown in the present embodiment, have connections similar to those of FIG. 5 in respect of the word lines and the bit lines. Thus, the memory cells 701 and 703, and 702 and 704 are connected to common word lines 721 and 723, respectively. The memory cells 701 and 702, and 703 and 704 are further connected to common bit lines 715 and 717, respectively. These bit lines 715 and 717 are respectively connected to sense amplifiers 709 and 710, which in turn are connected to bit lines 716 and 718 complementary to the bit lines 715 and 717. No memory cell is present at the nodes between the word lines 721 and 723 and the bit lines 716 and 718, nor is there a memory cell at the nodes between word lines 722 and 724 and the bit lines 715 and 717. There are the memory cells 705, 706, 707 and 708, nodes between the word lines 722 and 724 and the bit lines 716 and 718, which memory cells have circuit structures similar to those of the memory cells 701, 702, 703 and 704, although framed by dotted lines, and which are connected to the plate lines.

Dummy cells 711, 712, 713 and 714, as framed by solid lines, are connected to the bit lines 715, 716, 717 and 718 respectively. The dummy cells 711 and 713 are connected to a common word line 719 and the dummy cells 712 and 714 are connected to a common word line 720. The dummy cells 711, 712, 713 and 714 are similar to the memory cells of the body, for example, and are composed, for example, of one capacitor and transistor, which has its gate connected to the word line and its source (or drain) electrode connected too the bit line. The difference from the structure of FIG. 5 of the Embodiment 1 is that plate lines 725, 726, 727, 728 and 729, and 730, 731 and 732 are parallel to the bit lines and are connected in common with the memory cells 701 and 702, 703 and 704 parallel to the bit lines.

Figure 11:
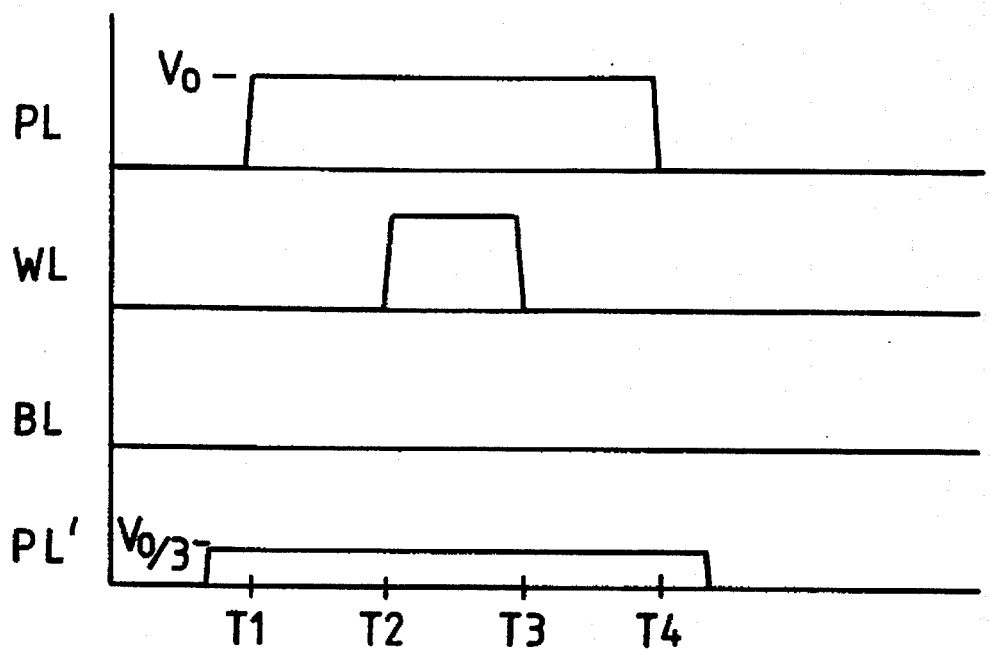
FIG. 11 is a diagram showing the writing waveforms of the memory cell of the Embodiment 3 of the present invention.

FIG. 11 shows examples of the writing waveforms for the structure of the present embodiment in which the plate lines are parallel to the bit lines. The potential of the plate line (PL') of the ferroelectric capacitor left unselected until time T1 is set to Vo/3, for example. Next, a potential Vo is applied to the plate line (PL) of the ferroelectric capacitor selected at the time T1. For the period between the time T1 and the time T2, a potential of 2Vo/3 is applied to two or more series connections of other ferroelectric capacitors which are shared with the plate lines of the selected ferroelectric capacitor, so that a voltage as low as about Vo/3 is applied to the ferroelectric capacitors left unselected. Next, at the time T2, a voltage is applied to the word line (WL). The potential of the bit line (BL) is always held at earth potential during this operation. As a result, the state "0" is written to the selected ferroelectric capacitor during the period between T2 and T3. At this time, moreover, a voltage as low as about Vo/3 is applied to the ferroelectric capacitors which have not been selected. Next, at the time T3, the word line (WL) is turned OFF, and the plate lines (PL and PL') are returned to their initial states. For the writing in the state "0", the waveforms of the plate line (PL) and the bit line (BL) may be interchanged.

Figure 12:
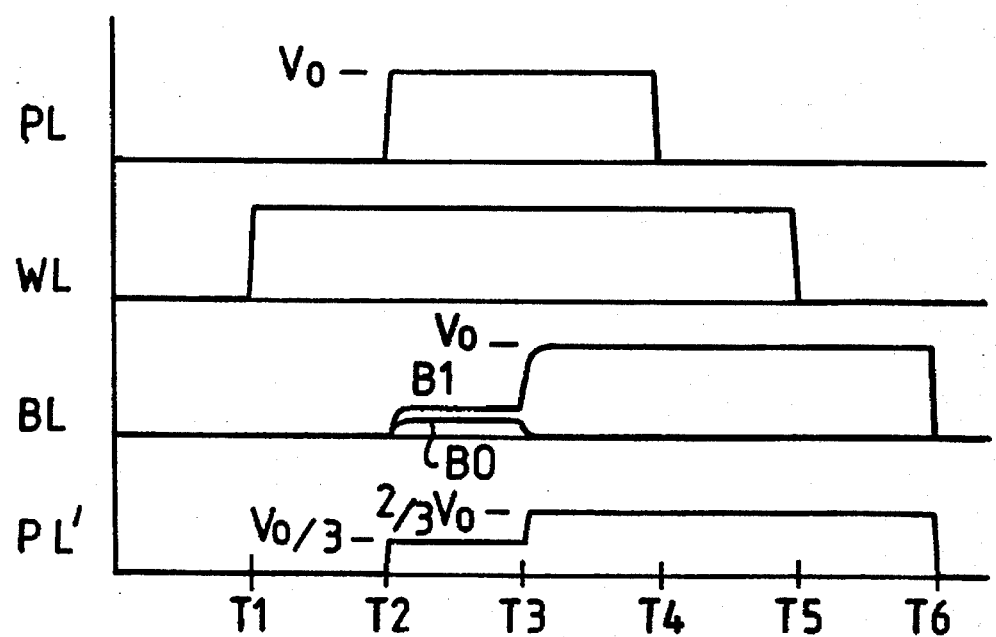
FIG. 12 is a diagram showing reading waveforms of a memory cell of Embodiment 3 of the present invention.

FIG. 12 shows examples of the reading waveforms of the structure, in which the plate lines of the present embodiment are parallel to the bit lines. At time T1, a potential is applied to the word line (WL). Next, at time T2, a potential Vo is applied to the plate line (PL) of the ferroelectric capacitor selected, and the potential Vo/3 is applied to the plate lines (PL') of the ferroelectric capacitors which have not been selected. Then, a potential B (in the state "1") or B0 (in the state "0") appears in accordance with the polarization state of the bit line (BL). Between the time T2 and the time T3, a voltage as low as Vo/3 is applied to the ferroelectric capacitors which have not been selected. At the time T3, the sense amplifier starts to shift the potential B1 to Vo and the potential B0 to the earth potential.

Simultaneously with this, a voltage of 2Vo/3 is applied to the plate lines (PL') of the ferroelectric capacitors which have not been. As a result, a potential as low as Vo/3 is applied to the ferroelectric capacitors which have not been selected. At the time T4, the plate line (PL) returns to the earth potential so that a rewrite operation is accomplished between the time T4 and the time T5. Next, at the time T5, the word line (WL) is turned OFF, and the bit line (BL) and the plate line (PL') return to their initial states. Since a low voltage of e.g. Vo/3 is applied in a series of writing and reading operations to the ferroelectric capacitors left which have not been selected, their polarization states are unlikely to be changed. Since, moreover, the bit line and the plate lines are in parallel in the present structure, it is easy to synchronize the potentials of the bit line and the plate lines.

Figure 13:
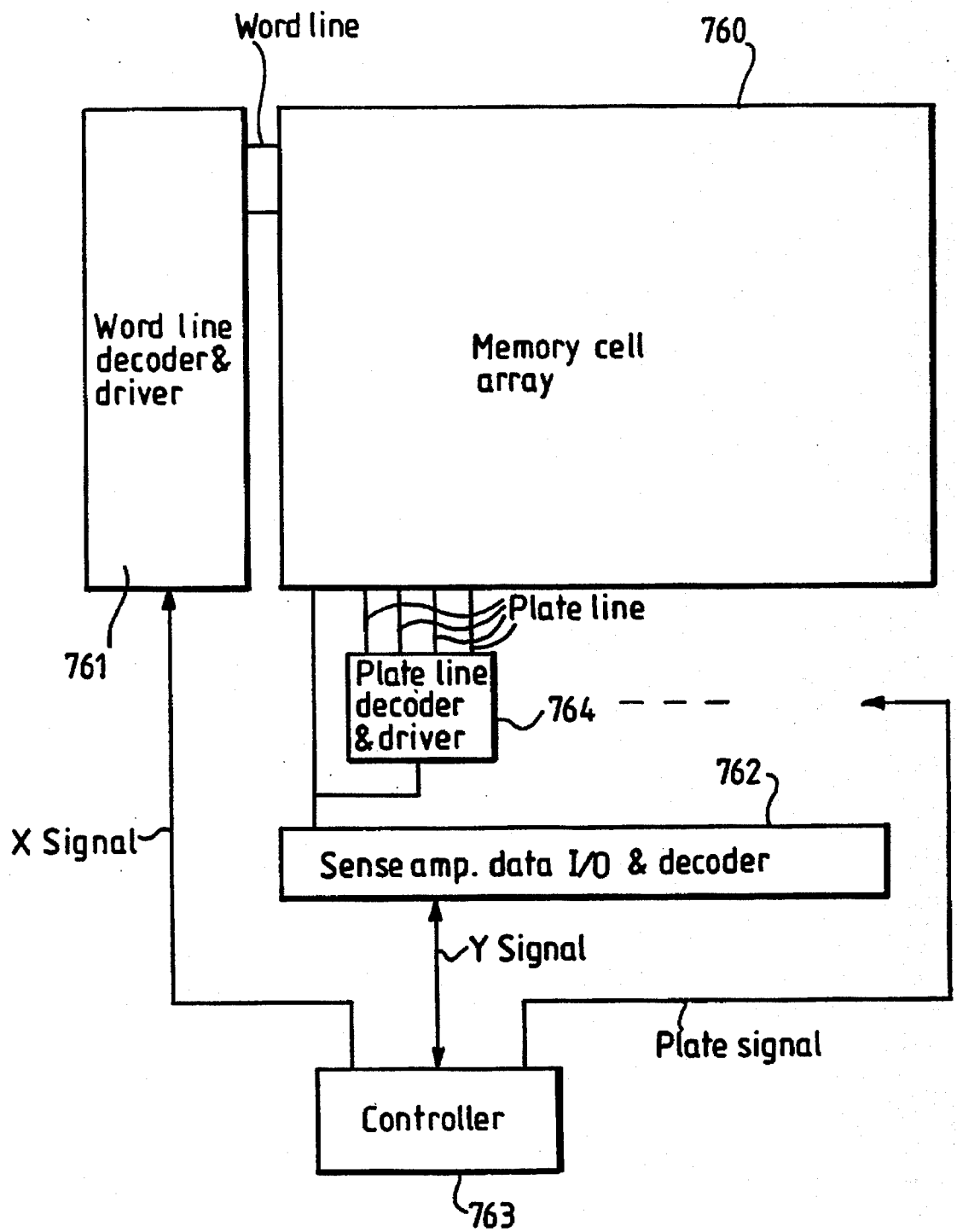
FIG. 13 shows a peripheral circuit arrangement for Embodiment 3 of the present invention.
Figure 14A:
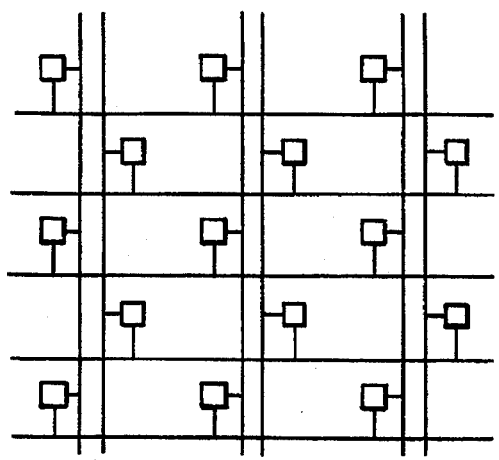
FIGS. 14(a) to 14(f) are circuit diagrams showing Embodiment 4 of the present invention.
Figure 14D:
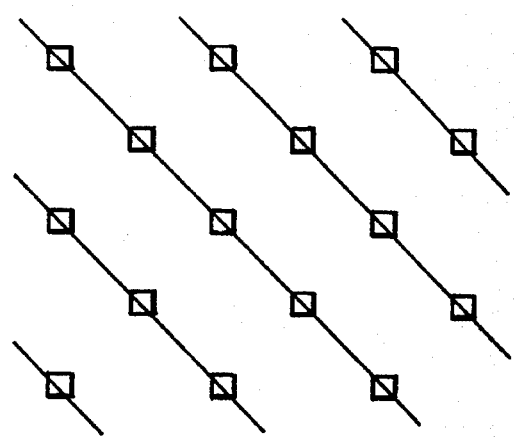
Figure 14B:
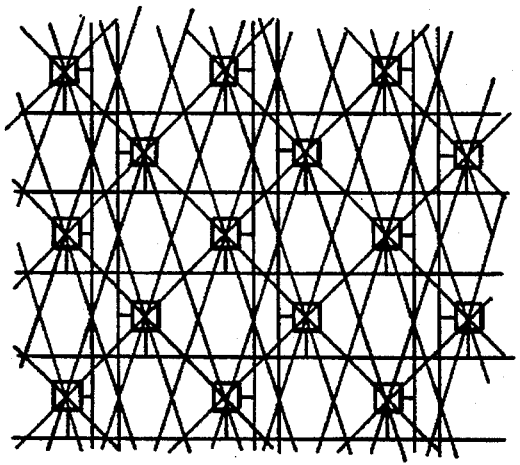
Figure 14E:
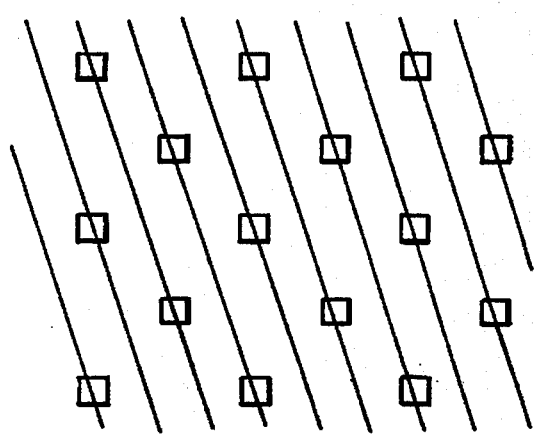
Figure 14C:
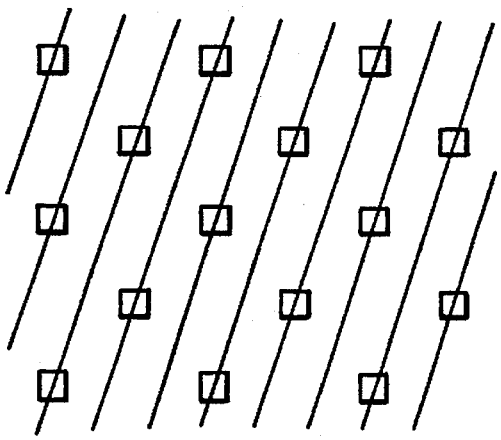
Figure 14F:
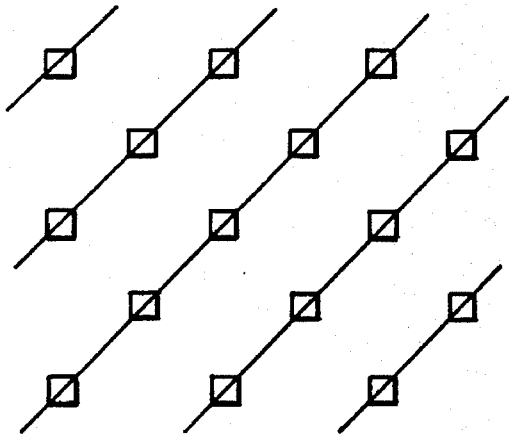

FIG. 13 shows the arrangement of the peripheral circuits for this embodiment in which the bit lines and the plate lines are in parallel. The arrangement is generally similar to that of FIG. 9, in that the memory cell array 760 is connected to a word line decoder and driver 761 and to a sense amplifier 762, which are in turn connected to a controller 763. Furthermore, there is a plate line decoder and driver 764 connected respectively to each group of plate lines. The only difference between the arrangement shown in FIG. 13 and the arrangement shown in FIG. 9 is that, in the arrangement shown in FIG. 13, the plate line decoder and driver 764 is located between the memory cell array 760 and the sense amplifier 762.

Embodiment 4

In this embodiment, the plate lines are not all parallel nor parallel to the word lines. In other words, some of the plate lines are shared among the memory cells which are positioned in parallel with neither the word line direction nor the bit line direction.

FIG. 14 is a circuit connection diagram of the present embodiment. In FIG. 11, each memory cell has a memory capacity of 4 bits and is shown by a rectangular frame. The bit lines, word lines and drive lines are indicated by individual straight lines, but the dummy cell sense amplifiers are omitted. FIG. 11(a) shows only the memory cells, the bit lines and the word lines, which are connected in a similar way to the foregoing embodiments discussed above. FIG. 11(b) shows four plate lines connected to each memory cell. Since the plate lines are preferably formed in a stacked form, as will be described hereinafter, they need not be in parallel, as shown.

In order to clarify the connections of the plate lines, the plate lines and the memory cells in the individual layers are separately shown in FIGS. 11(c), 11(d), 11(e) and 11(f). The stacking order of the plate lines are selected so as to facilitate their formation and to reduce the wiring capacities, while considering the steps.

With such an arrangement a voltage Vo is not applied to two or three serially connected ferroelectric capacitors which have not been selected, unlike the previous embodiments. In other words, the voltage Vo is applied to more serially connected ferroelectric capacitors which have not been selected. As a result, the voltage to be applied to the ferroelectric capacitors which have not been selected is farther reduced that the polarization state is unlikely to change.

In the arrangement thus described, the potential appearing on the bit lines during reading is decided by comparison with the potential of the complementary bit lines which are connected to the dummy cells. For example, however, the potential may be compared by connecting a reference power supply to the complementary bit lines. Moreover, the dummy cells may be formed of suitably set paraelectric The driving of the components of the memory array, as has been described with reference to FIGS. 9, 10 and 13 are accomplished by electric circuits which are around the periphery of the memory cells array. These peripheral circuits are basically similar to those of the prior art.

Thus, these peripheral circuits are exemplified by not only the ordinary input/output buffers but also decoders for selecting the word lines, sense amplifiers for detecting the potentials of the bit lines and Y-selectors for selecting the bit lines. The setting of the potential Vo/2, precharging and floating may be are by methods similar to those known in the prior art. The circuits may be composed of any of CMOS, BiCMOS and Bipolar devices.

The difference from the prior art is that there is one or more selectors (the plate line decoder and driver 364,764) for selecting a specific one of the plate lines. The selection of one specific bit is carried out by selecting a specific individual word line, bit line and plate line. As a result, an address signal is partially inputted to the plate line selector like the decoder and the Y-selector. Thus, the circuit of the plate line decoder and driver is basically identical to a decoder convention and but should have a circuit structure for permitting the generation of the waveforms discussed earlier.

The plate line decoder and driver is arranged, when the drive lines are parallel to the word lines, either in a region identical to that of the decoder or in a region on the opposite side of the memory array to that of the decoder. When the plate line decoder and driver is in the the region identical to that of the decoder, it is easy to arrange address signal wiring lines. In this case, moreover, it is easy to synchronize the drives of the plate lines and the word lines. When it is in a region on the opposite sides of the array to the decoder, it is easy to arrange the elements and the connection wiring lines. When the plate lines are parallel to the bit lines, the plate line decoder and driver is arranged either in the region identical to that of the sense amplifier or in a region on the opposite side of the memory array to the sense amplifier. In this case, it is easy to synchronize the drives of the plate lines and the bit lines. Since the ferroelectric capacitors and the piano lines are desirably stacked, as will be described hereinafter, the area for the memory cells is not increased even if the wiring for each memory cell is increased. In the portion for connecting the plate lines with the plate line decoder and, however, through holes have to be suitably arranged to connect the individual wiring lines with the electrodes of the plate line decoder and driver formed over a semiconductor substrate.

Embodiment 5

Figure 15:
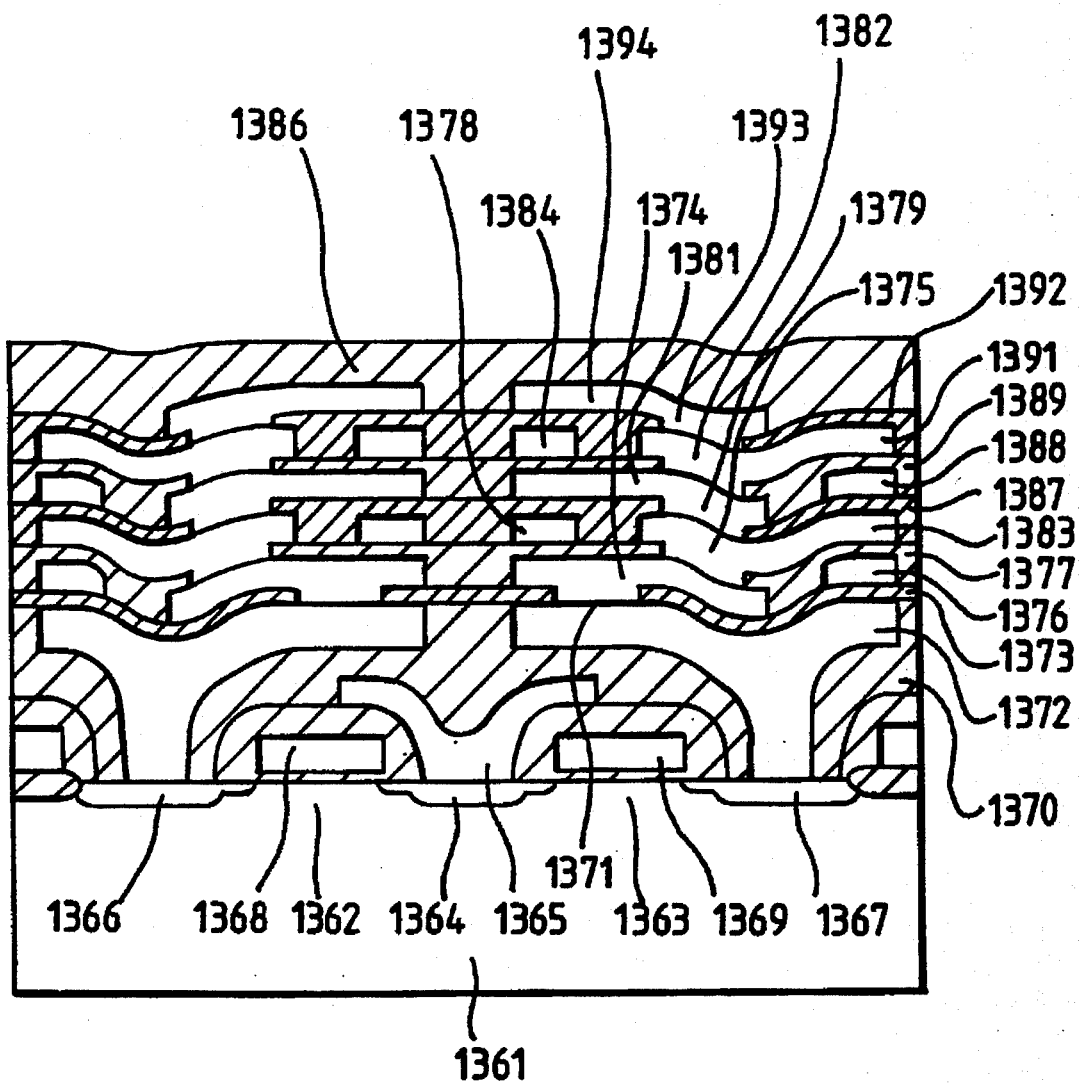
FIG. 15 is a section showing a memory cell of Embodiment 5 of the present invention.

FIG. 15 is a sectional view of another embodiment of the present invention.

FIG. 15 shows two memory cells, each of which has a structure which gives a memory capacity of 4 bits. A semiconductor substrate 1361 has NMOSFETs 1362 and 1363, thereon to form selection transistors. The FETs 1362 and 1363 have their source and drain diffusion layers 1364 shared therebetween and connected to a bit line 1365.

The present embodiment has a bit line shielded structure.

The FETs 1362 and 1363 have their gate electrodes 1368 and 1369 acting as word lines. The other source or drain diffusion layers 1366 and 1367 of the FETs 1362 and 363 are connected to the common electrodes of a plurality of ferroelectric capacitors, as will be described subsequently.

Only the right hand memory cell will now be described in detail because the right hand and left hand memory cells of FIG. 12 have identical structures.

After an interlayer film 1370 and contact holes have been formed, an electrode 372 is formed which is connected to the source or drain electrode 1367 of the FET 1363. The electrode 1372 is then overlaid by a ferroelectric insulating layer 1373. This ferroelectric insulating layer 1373 has a contact hole therein, 1371 and electrodes 374 and 376 are formed thereon. The electrode 374 is connected to the electrode 372, and the electrode 376 is connected to one of the plate lines.

Next, a ferroelectric insulating film 377 is formed. This ferroelectric insulating film 377 has a contact hole 375 therein and electrodes 378 and 383 are formed thereon. The electrode 1383 is connected to the electrode 1374, and the electrode 1378 is connected to one of the plate lines. Likewise, a ferroelectric insulating film 1387 is formed. This ferroelectric insulating film 1387 has a contact hole 1379 therein and electrodes 1381 and 1388 formed therein. The electrode 1381 is connected to the electrode 1383, and the electrode 1388 is connected to one of the plate lines.

Next, a ferroelectric insulating film 1389 is formed. This ferroelectric insulating film 1389 has a contact hole 1382 therein and electrodes 1384 and 1391 formed thereon. The electrodes 1391 is connected to the electrode 1381, and the electrode 384 is connected to one of the plate lines. Moreover, a ferroelectric insulating film 1392 is formed. This ferroelectric insulating film 1392 has a contact hole 1393 therein, and an electrode 1394 thereon. This electrode 1394 is connected to the electrode 1391.

Finally, a passivation insulating film 1386 is formed.

Thus, the electrodes 1372, 1374, 1383, 1381, 1391 and 1394 are connected to form a common electrode, and the plate line 376 is located relative to the common electrode so that the ferroelectric insulating films 1373 and 1377 are there between, to form a ferroelectric capacitors. Likewise, the drive line 378, the plate line 388 and the drive line 384 individually form ferroelectric capacitors through the ferroelectric insulating films 377 and 387, through the ferroelectric insulating films 387 and 389 and through the ferroelectric insulating films 389 and 392, respectively.

These ferroelectric insulating films may be strached with normally paraelective insulating film e.g. SiOz, as will be described. Moreover, a planar step may be suitably inserted. The common electrodes are intrinsic to the memory cells and are independent of one another. It should, however, be noted that the plate lines are connected to those of the adjoining cells.

With these structures, one memory cell of 4 bits according to the present embodiment is formed in an area corresponding substantially to that occupied by one memory cell of 1 bit in the prior art. The stached common electrodes and the plate lines are formed in the vertical direction in the present embodiment but may be stached obliquely. Due to the bit line shielded structure, according to the present embodiment, there is no necessity for forming a contact for taking out the bit line after the ferroelectric capacitor has been formed, so that the area of the ferroelectric capacitor can be increased.

Embodiment 6

Fig. is a section though another embodiment of to the present invention.

Figure 16:
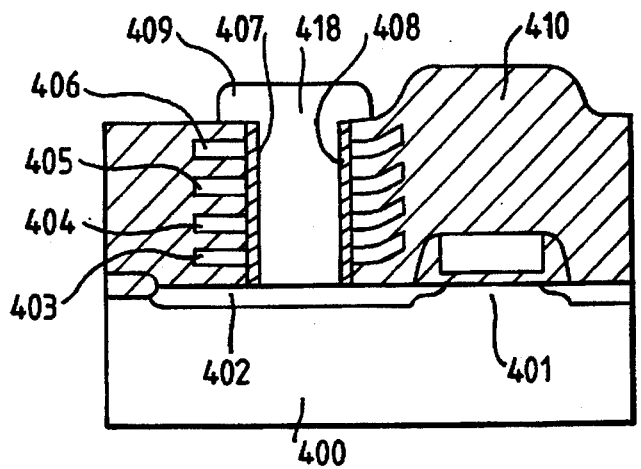
FIG. 16 is a section showing a memory cell of Embodiment 6 of the present invention.

FIG. 16 shows one memory cell which has a structure for storing 4 bits. As for the embodiment of FIG. 15, a semiconductor substrate 400 has an NMOSFET 401 thereon to provide a selection transistor. This FET 401 has its source/drain diffusion layer 402 connected to the common electrode of a plurality of ferroelectric capacitors, as will now be described.

In this embodiment, the insulating films and electrodes are sequentially stached to form plate line electrodes 403, 404, 405 and 406. After this, a contact hole 418 is formed through an insulating film 410 and the plate lines.

Next, a ferroelectric film is deposited isotropically, and etched anisotropically to form ferroelectric sides wall films 407 and 408. Next, an electrode 409 is formed. Thus, ferroelectric capacitors are formed between the drive line electrodes 403, 404, 405 and 406 and the electrode 409.

Figure 17:
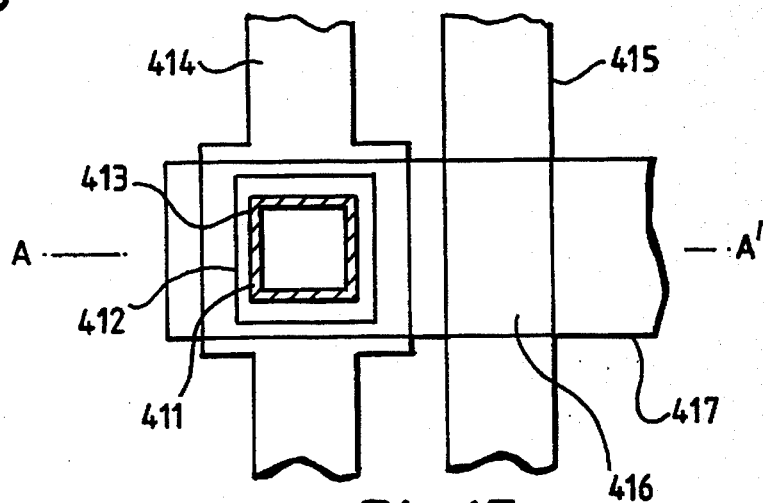
FIG. 17 is a top plan view showing the device of FIG. 13.

FIG. 17 is a top plan view showing the memory cell of this embodiment. FIG. 16 is this a section taken along line A–A' of FIG. 17.

An element forming region 417 has formed with a word line 415 of a selection transistor 417. After a drive line electrode 414 and an insulating film have been formed, a contact hole 413 has a ferroelectric film 411 formed on the sides thereof. Moreover, an electrode 412 is formed to create a sectional structure similar to that of FIG. 11. The plate line electrode 414 may be considered to have four stacked electrodes.

The ferroelectric capacitor thus described desirably has a generally rectangular hysteresis characteristic, as has been described above. Thus, it is desirable that the value of the polarization is unchanged for a voltage equal to or lower than a certain constant value. As a result, the polarization state of ferroelectric capacitors which have not been selected may be maintained for a long time. The "voltage equal to or lower than a certain constant value" should be one to be applied during the operation to the ferroelectric capacitors which have not been selected and is exemplified by one half of the read and write voltage Vo. On the other hand, the write voltage Vo should be sufficient to invert the polarization. In other words, the field resistance of the ferroelectric capacitor is set at Vo or less. As a result, the ferroelectric capacitor has hysteresis characteristics for which the residual polarisation is unchanged for an electric field less than $\tfrac{2}{3}$ of the field resistance, for example.

When the voltage to be applied during the operation to the ferroelectric capacitor which have not been selected is reduced by the driving method or by the voltage setting, it may be possible to use a ferroelectric capacitor which has hysteresis characteristics such that the residual polarisation value will change more easily for an electric field less than $\tfrac{2}{3}$ of the field resistance.

Example 7

Figure 18:
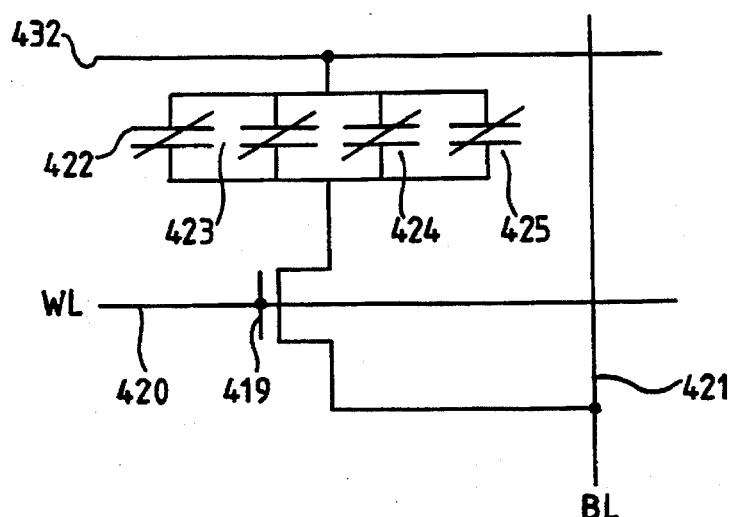
FIG. 18 is an equivalent circuit diagram showing the memory cell of Embodiment 7 of the present invention.

FIG. 18 shows a further embodiment of an equivalent circuit of a memory cell.

As for the multi-bit ferroelectric memories discussed above, the transistor to be used is exemplified by a MOSFET 419, which has its source/drain electrode connected to a bit line 421 and its gate electrode connected to a word line 420. The other source/drain electrode of the FET 419 is connected to one electrode of ferroelectric capacitors 422, 423, 424 and 425. In this embodiment, the ferroelectric capacitors 422, 424 and 425 have their other electrodes connected to a common plate line 435.

Furthermore, the ferroelectric capacitors 422, 423, 424 and 425 have individually different field resistances Ec1, Ec2, Ec3 and Ec4. These field resistances are chosen so that Ec1<Ec2<Ec3<Ec4. These are four ferroelectric capacitors in this embodiment but may be two or more if the field resistances thereof are different.

Figure 19:
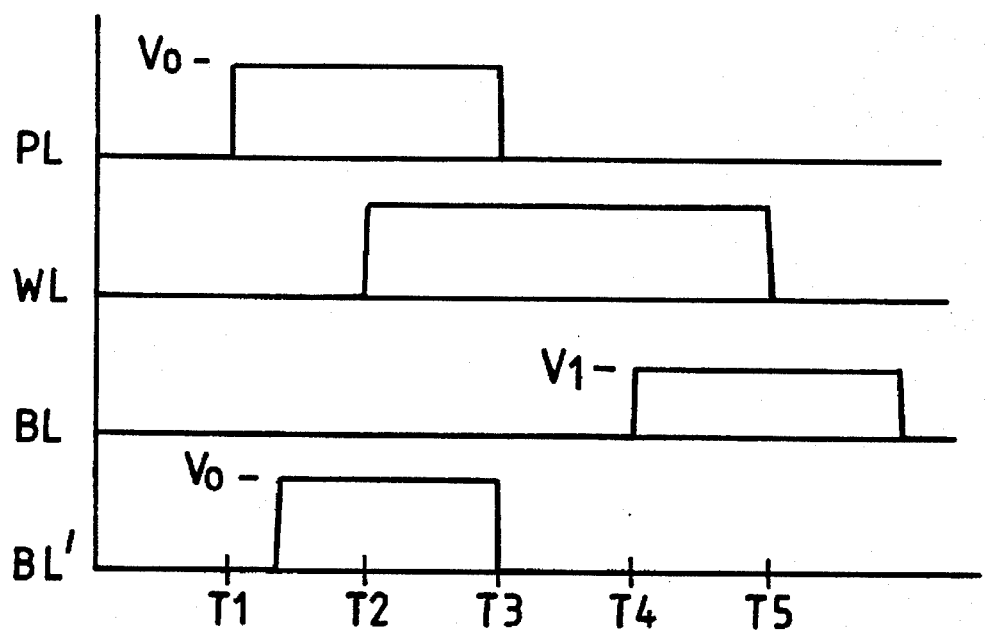
FIG. 19 is a diagram showing writing waveforms of the memory cell of Embodiment 7 of the present invention.

FIG. 19 shows the writing waveforms of the memory cell of the embodiment of FIG. 18, in which the ferroelectric capacitors 422, 423 and 424 are written with the state "1" whereas the ferroelectric capacitor 425 is written with the state "0".

At time T1, a voltage Vo is applied to the drive line 435 (PL). The voltage Vo is set at a value higher than the value Ec4. The bit line 421 (BL) is set to the earth potential. The potential of the bit line (BL') of the memory cell which has not been selected till the time T2 is likewise set to the value Vo.

Next, at the time T2, the voltage is applied to the word line 420 (WL) to turn ON the FET 419. At this time, the positive voltage Vo is applied to the upper electrode, i.e., the plate line of the ferroelectric capacitor of the memory cell selected, so that all the ferroelectric capacitors of the memory cell are set to the state "0". At this time, on the other hand, no voltage is applied to the ferroelectric capacitors of the memory cell connected with the same word line but not selected, because the plate line potential PL and the bit line potential BL' are equal. As a result, those capacitors maintain their states.

Next, at the time T3, the plate line 435 (PL) and the bit line (BL') of the memory cells which have not been selected are simultaneously set to the earth potential. At this time, no voltage is applied to the ferroelectric capacitor of the selected memory cell and to the ferroelectric capacitors of the memory cells which have not been selected.

Next, at the time T4, a voltage V1 is applied to the bit line 421. Also, at the time T4, the voltage V1 is applied to the bit line 421. The voltage V1 is set Ec3<V1<Ec4. As a result, the polarization states of the ferroelectric capacitors 422, 423 and 424 are inverted from "0" to "1", whereas the ferroelectric capacitor 425 is left unchanged.

After this, at the time T5, the word line 420 (WL) is turned OFF. At the time T6, the bit line 421 (BL) is turned OFF, thus completing the writing operation. Thus, the ferroelectric capacitors 422, 423 and 424 are written with the state "1", and the ferroelectric capacitor 425 is written with the state "0". By suitable setting the voltage V1, the number of ferroelectric capacitors to be written with the state "1" can be set to establish five memory cell states. If, on the other hand, the operation waveforms of the plate line 435 (PL) and the bit line 421 (BL) are inverted, all the ferroelectric capacitors are written at first with the state "1", and some ferroelectric capacitors are then written with the state "0" in accordance with the set voltage. In this case, too, the potential of the bit line (BL') of the memory cells which are not selected is given the same waveform as that of the plate line, at least while the word line is ON. Thus, the total number of the memory cell is stored with an information corresponding to 3 bits.

Figure 20:
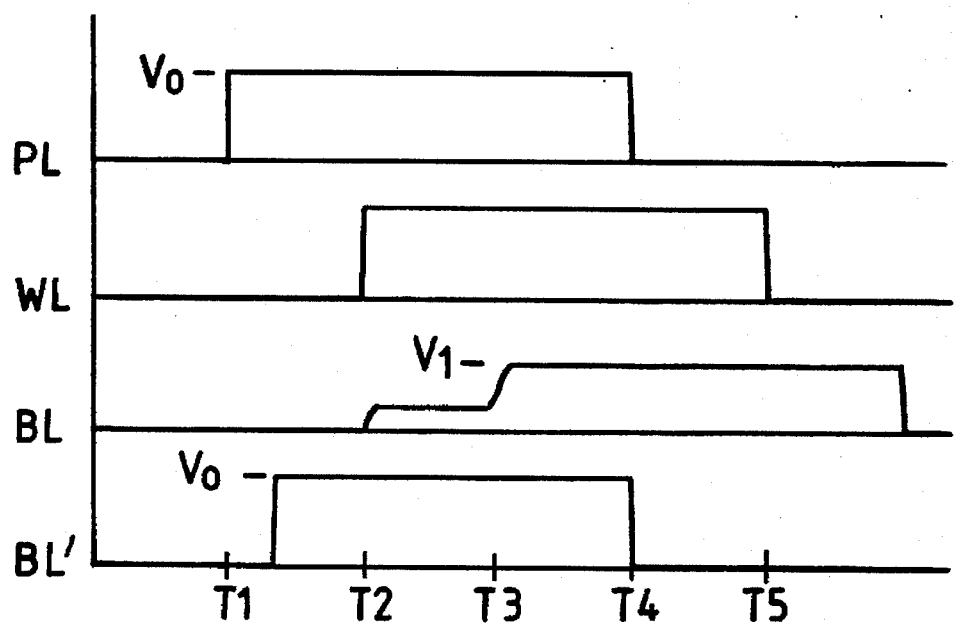
FIG. 20 is a diagram showing reading waveforms of the memory cell of Embodiment 7 of the present invention.

FIG. 20 shows reading waveforms for the memory cell of the embodiment. It is assumed that the ferroelectric capacitors 422, 423 and 424 are written with the state "1" whereas the ferroelectric capacitor 425 is written with the state "0".

At time T1, the voltage Vo is applied to the drive line 435 (PL). The voltage Vo is set higher than the value Ec4. The bit line 120 (BL) is set to the earth potential and then brought into the floating state. Up to the time T2, the potential of the bit line (BL') of the memory cells which are not selected is likewise set to the value Vo.

Next, at the time T2, a voltage is applied to the word line 420 (WL) to turn ON the MOSFET 419. As a result, the positive voltage Vo is applied to the ferroelectric capacitor of the selected memory cell so that all the ferroelectric capacitors are shifted to the state "0". At this time, however, the flow of charges through the bit line is different in dependence upon the state of the ferroelectric capacitor. Specifically, the flow of the charges is small, if the polarization state is unchanged, but gets higher when the state is inverted from "1" to "0". This difference depends on the value of the field resistance. As a result, the total charges are different in accordance with the states of the four ferroelectric capacitors. Thus, the potential to be established on the bit line is different in accordance with the state of the ferroelectric capacitor so that the stored states can be determined. At this time, the stored states are determined by comparison with the potential of the dummy memory cell connected to the complementary bit line or with a reference power supply. In the embodiment eight states have to be identified but this is difficult for the single sense amplifier identical to that of the prior art to determine.

In the present embodiment, for example, the bit line 421 (BL) is connected to seven sense amplifiers so that the states are discriminated by comparisons with the complementary bit line potentials of different levels. Alternatively, the bit line 421 (BL) is connected to three sense amplifiers so that the states are described by shifting the timing for the potential decision.

Next, at the time T3, a rewrite voltage V1 is applied to the bit line 421 (BL) on the basis of the result of the determination of the states. The voltage V1 is set within a range of Ec3<V1<Ec4. Then, at the time T4, the drive line 435 (PL) and the potential of the bit line (BL') of the memory cells which are not selected are simultaneously set to the earth potential. As a result, the polarized states of the ferroelectric capacitors 422, 423 and 424 are inverted from "0" to "1", but the ferroelectric capacitor 425 is left unchanged. After this, the word line 420 (WL) is turned OFF at the time T5, and the bit line 421 (BL) is turned OFF at the time T6, thus ending the reading operation.

Thus, the state of the memory cell is detected, and the ferroelectric capacitors 422, 423 and 424 are rewritten with the state "1" whereas the ferroelectric capacitor 425 is rewritten with the state "0". When the ferroelectric capacitor 425 having a high field resistance is in the state "1" whereas some of the ferroelectric capacitors having lower field resistances are in the state "0", the reading operations are carried out by suitably setting and inverting the waveforms of the drive line and the bit line.

Embodiment 8

In the previous embodiments, a multi-bit memory cell is achieved by providing the cell with a plurality of ferroelectric capacitors. However, it is also possible to make use of a single ferroelectric capacitor if that ferroelectric capacitor is designed to have a plurality of states. The structure of the memory cell may thus be similar to that shown in FIG. 3.

Figure 21:
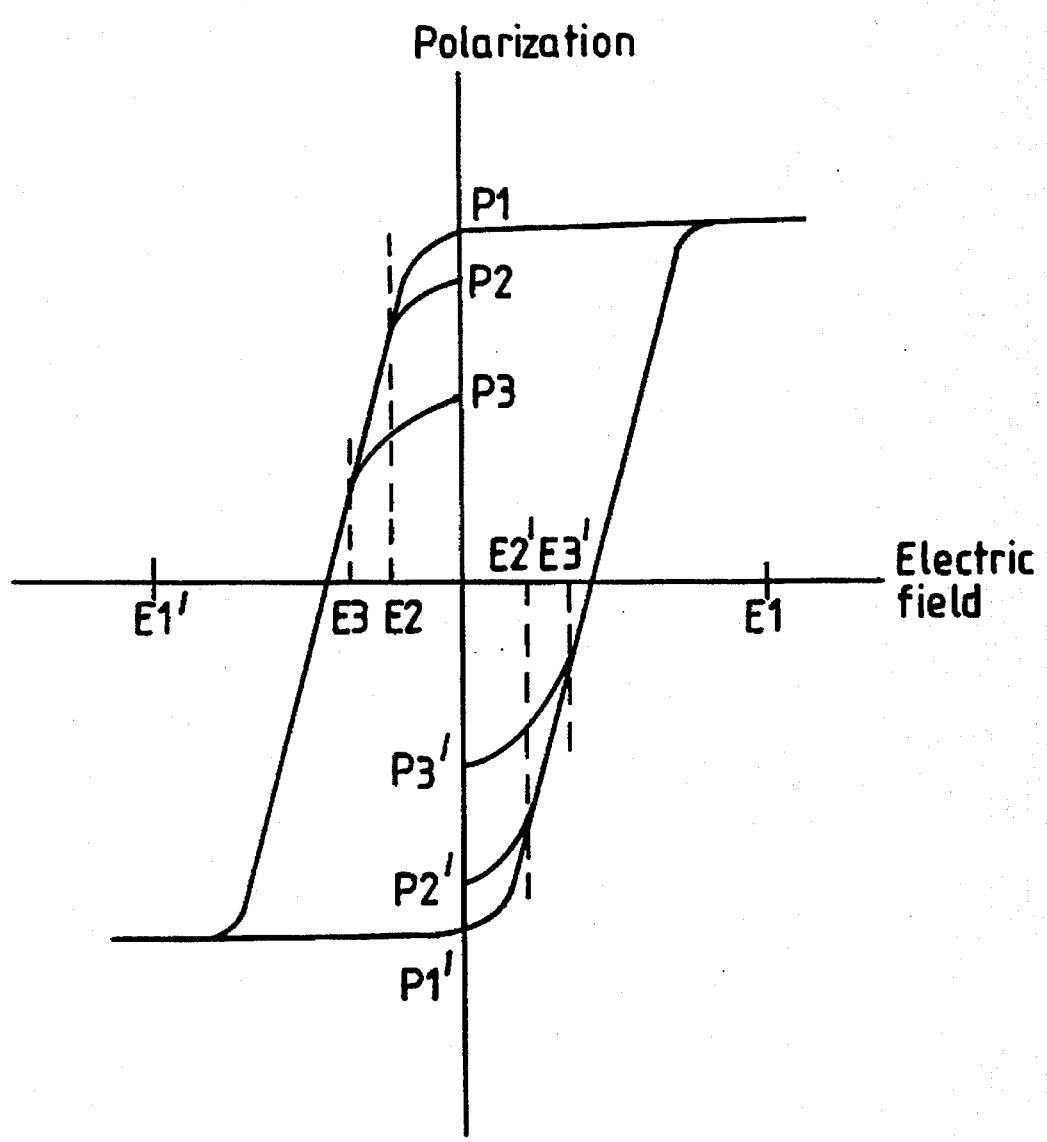
FIG. 21 shows a polarization graph for Embodiment 8 of the present invention.

FIG. 21 shows the hystoresis characteristics of such a ferroelectric memory cell. In the ferroelectric capacitors described previously, if an electric field is applied which is insufficient to reverse the polarization state, the initial polarisation state is restored when the electric field is removed. In this embodiment, however, if the initial polarization state is P1 and an electric field E2 (which does not cause a complete reversal of polarity) is applied and removed, the polarisation state returns to a polarisation P2 rather than P1. The difference between states P1 and P2 can be identified (read) by the difference in voltage when the read operation is carried out. By providing a plurality of polarisation states (P1, P2, P3, P3−, P2− and P1−), and by suitably selecting the electric field applied, a plurality of polarazation states can be identified, and thus a multi-bit memory may be achieved. In the arrangement shown in FIG. 21, a three-bit arrangement is achieved.

The drive method of this embodiment may be generally the same as that exemplified in FIG. 16 or FIG. 17.

Embodiment 9

In this embodiment, a structure is considered, which seeks to reduce the current consumption and to lengthen the lifetime of the ferroelectric capacitor. This will be described with reference to FIG. 22, which shows a circuit equivalent to one memory cell. The present embodiment uses a MOSFET as the transistor.

A MOSFET 431 has its source/drain electrode connected to one electrode of a ferroelectric capacitor 428 and a paraelectric capacitor 427 to provide an electrode node 426 (N). The other electrode of the ferroelectric capacitor 428 is connected to a plate line 429. The MOSFET 431 has its other source/drain electrode connected to a bit line 433 (BL) and its gate electrode connected with the word line 432 (WL). The other electrode of the normally paraelectric capacitor 427 is connected to a reference line 430. This reference line 430 is at a fixed potential such as the earth potential.

As compared with the ferroelectric memory cell of FIG. 1, this embodiment has one electrode of the paraelectric capacity or 427 is connected with the electrode portion 426 and the MOSFET 431 are connected. The capacity of the normally dielectric capacity element 427 is desirably made smaller than that of the ferroelectric capacitor 428, e.g., about one ninth as small.

Figure 23:
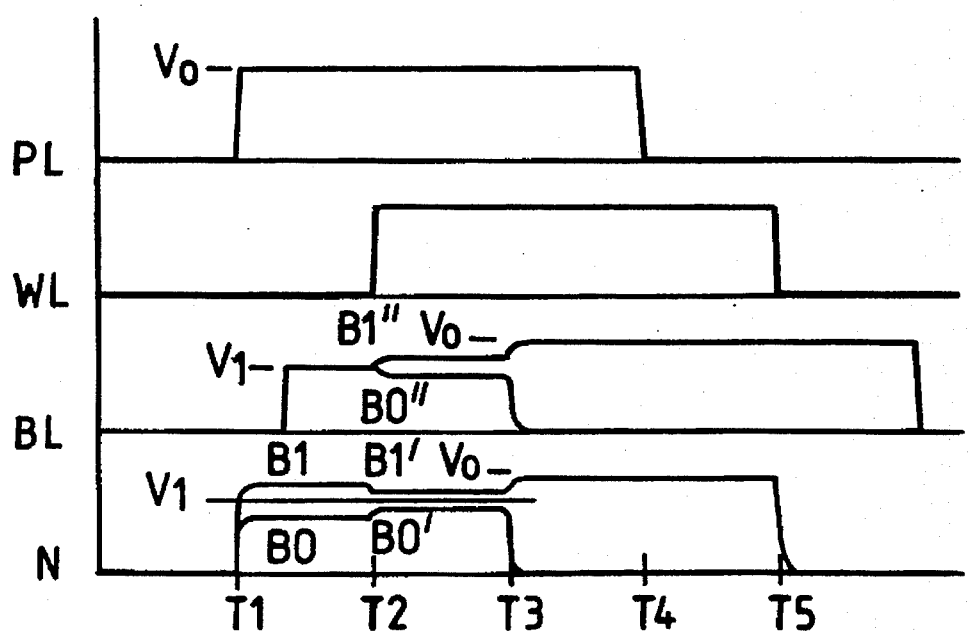
FIG. 23 is a diagram showing reading waveforms of the memory cell of Embodiment 9 of the present invention.

The reading operations of the memory cell of the present embodiment will be described with reference to FIG. 23. Although normal reading methods invert the polarized state, this state is not inverted during the reading operation in this embodiment.

In this embodiment, first of all, the voltage Vo is applied at the time T1 to the plate line 429 (PL). When the voltage Vo is applied, the voltage of the common electrode node 426 (N) is caused to takes a value B1 or B0 depending on the voltage share between the capacitance of the paraelectric capacitor 427 and the capacitance of the ferroelectric capacitor 428 and according to the polarized state of the ferroelectric capacitor 112. Those values B1 or B0 are slightly larger or smaller than a voltage V1. If the capacity of the paraelectric capacitor is about one ninth as high as that of the ferroelectric capacitor 428, for example, the voltage Vo is substantially applied to the paraelectric capacitor 427 so that the voltage V0−B1 or Vo−B0 to be applied to the ferroelectric capacitor 428 is about one tenth of Vo. Thus, the voltage applied to the ferroelectric capacitor 428 has a very small value so that its polarized state is not inverted.

The value of the voltage B1 or B0 is determined according to the hysteresis characteristics of the ferroelectric capacitor 428. When the polarization state is at "0", the direction of voltage application and the direction of polarization are identical so that the polarization value does not change or changes only by a small amount. As a result, the dielectric constant takes a relatively small value so that the capacity is reduced to drop the potential of the electrode node 426, which is determined by the voltage share, to B0. On the other hand, when the polarization state is at "1", the direction of voltage application direction and the polarization are opposite to each other so that the value of polarization is changed significantly. As a result, the dielectric constant takes a relatively large value so that the capacity is increased to raise the potential of the electrode node 426, which is determined by the voltage share, to B1. As a result, the central value V1 between B1 and B0 is one which is determined in advance by the hysteresis characteristics of the ferroelectric capacitor 428.

Up to the time T2, the bit line 433 (BL) and other bit lines including the complementary bit lines are precharged to the voltage V1 and brought into the floating states. The bit line 433 (BL) and its complementary bit lines are desirably equalized to the same potential by the well-known equalization method.

At the time T2, the voltage is applied to the word line 432 (WL) to turn ON the MOSFET 431 thereby to connect the common electrode node 428 (N) and the bit line 433 (BL). Then, the shift of the charges, i.e., the charge sharing occurs due to the potential difference between the common electrode node 426 (N) and the bit line 433 (BL) so that the common electrode node 426 (N) takes a potential B1' or B0' approximate to V1 whereas the bit line 433 (BL) takes a potential of B1" or B0". Since there is no memory cell between the complementary bit line and the word line 432 (WL), the potential of the complementary bit line remains at V1 so that the potential of B1" or B0" is identified to be at "1" or "0" respectively. In order to ensure the determination of "1" or "0", the potential of B1" or B0" has to be suitably set by considering noise margins. At the time T3, the sense amplifier is activated to change the potential B1" to Vo and the potential B0" to the earth potential.

If between the time T3 and the time T4 the polarized state of the ferroelectric capacitor 428 is initially at "0" at the beginning, the voltage Vo is applied to the plate line 429 (PL) whereas the earth potential is applied to the common electrode node 426 (N), so that the initial polarization direction and field direction are identical so that no change in the state occurs. If, on the other hand, the polarized state of the ferroelectric capacitor 428 is initially at "1" the voltage Vo is applied to the plate line 429 (PL) and the bit line 433 (BL), i.e., the common electrode node 426 (N), so that no electric field is applied and again there is no change in the state. At the time T4, the potential of the plate line is grounded to the earth potential.

Then, if the polarized state of the ferroelectric capacitor 428 is initially at "0", for the time period between the time T4 and the time T5, the earth potential is applied to the drive line 429 (PL) and to the bit line 433 (BL), i.e., the common electrode node 426 (N), the electric field does not change, so that there is no change in the state. If, on the other hand, the polarized state of the ferroelectric capacitor 428 is initially at "1" the earth potential is applied to the drive line 429 (PL) whereas the voltage Vo is applied to the bit line 433 (BL), i.e. the common electrode node 426 (N), so that the initial polarization direction and field direction are identical to effect the rewriting operation. Since, at this time, the reading voltage is low, the polarization value is not significantly changed, reducing the current consumption.

Since there is no large change in the polarization value, moreover, the polarized state, i.e., the crystal state of the ferroelectric capacitor 428 is not changed significantly so that the ferroelectric capacitor 428 is does not deteriorate so that its lifetime is lengthened.

Next, at the time T5, the word line 432 (WL) is turned OFF to return the bit line to the initial state. Thus, the current consumption is reduced during the reading operation and the lifetime of the ferroelectric capacitor.

Figure 22:
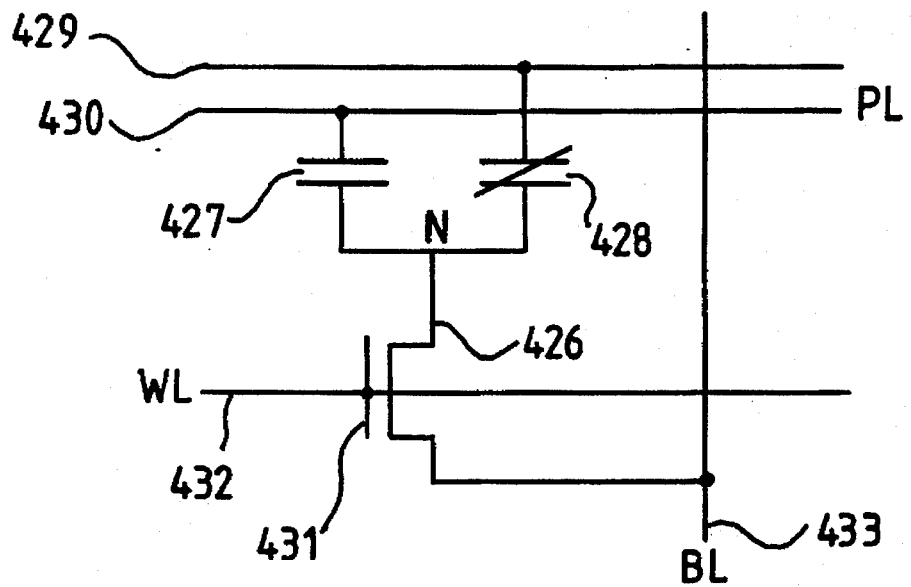
FIG. 22 is an equivalent circuit diagram showing the memory cell of Embodiment 9 of the present invention.

This reading method can be applied not only to the present embodiment shown in FIG. 22 but also to a memory cell which is constructed by adding a paraelectric capacitor to the common electrode node of the multi-bit ferroelectric memory according to another embodiment of the present invention. The paraelectric capacitor may be formed of a paraelectric insulating film e.g. $SiO_2$, SiN, SiON, or a stacked film as for a known DRAM. Alternatively, the paraelectric capacitor may be in the form of a pn junction between the semiconductor substrate and the source/drain electrode of the MOSFET 432 connected to the common electrode node 426 (N) and formed in the semiconductor substrate. In either case, the capacitance has to be suitably set to reduce the voltage to be applied to the ferroelectric capacitor during the reading operation and to provide a bit line with sufficient noise margins for reading.

Embodiment 10

Figure 24:
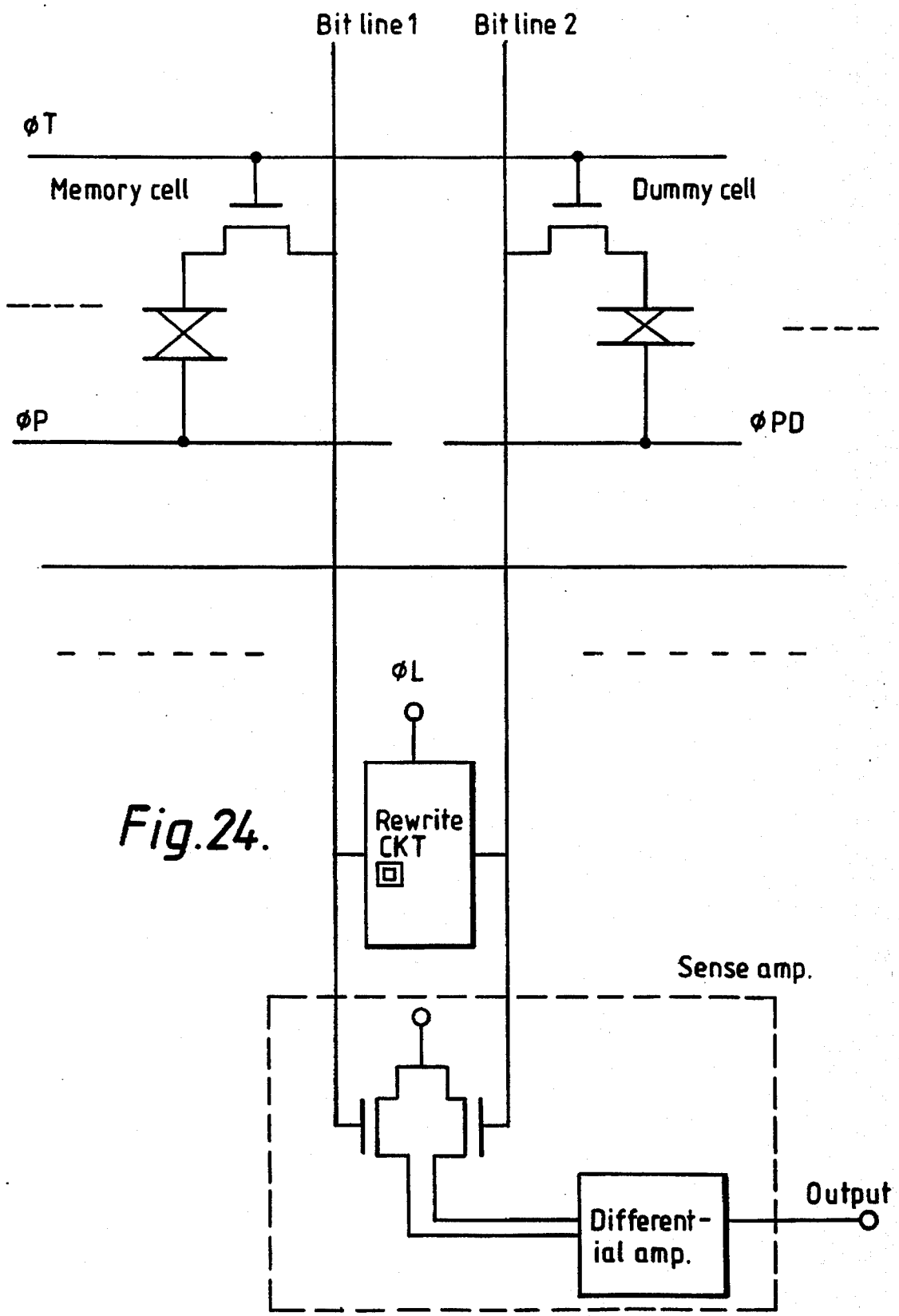
FIG. 24 is an equivalent circuit diagram showing a circuit from the memory cell to the sense amplifier of Embodiment 10 of the present invention.
Figure 25:
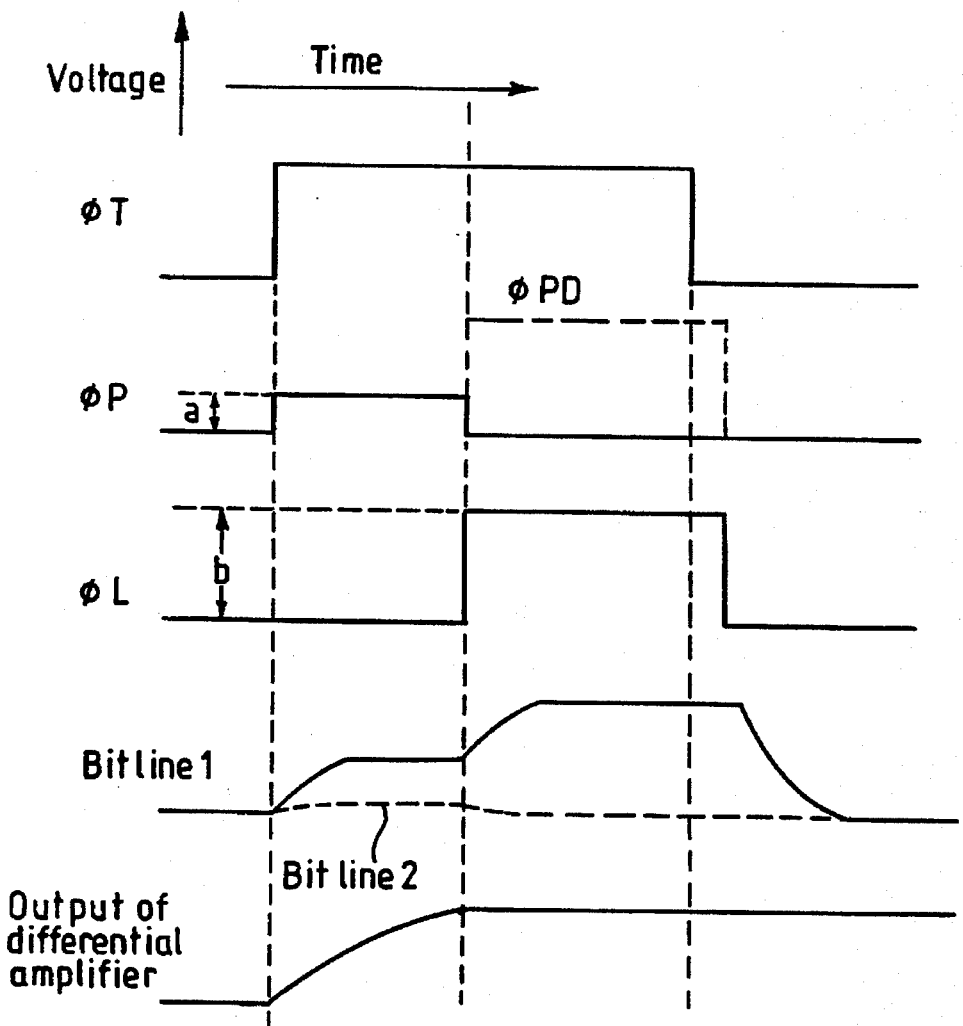
FIG. 25 is a diagram showing synchronizing pulses to be used in the circuit of FIG. 24.
Figure 26:
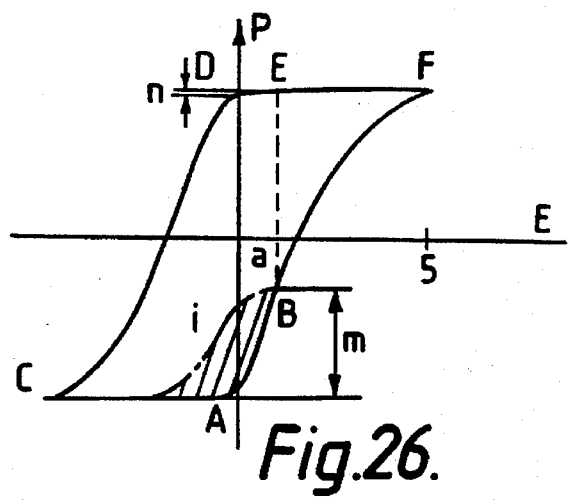
FIG. 26 is a diagram showing the characteristics of a ferroelectric capacitor to be used in Embodiment 10 of the present invention.

FIG. 24 shows the structure of another embodiment from the memory cell to the sense amplifier. The waveforms of the synchronizing pulses to be used in this circuit are shown in FIG. 25. FIG. 26 is a diagram showing the characteristics of the ferroelectric capacitor used in this embodiment. This embodiment will now be described taking as an example a method, in which the memory cell and the dummy cell are simultaneously read out to detect a potential difference due to the difference between the amounts of charges generated at that time.

The state of the dummy cell is always held in a state D, as shown in FIG. 26. It is assumed that the state of the memory cell selected is in a state A. In this state, the selection transistor is turned ON with a pulse $\phi T$ to apply a potential a to the plate line. At this time, charge corresponding to polarization m in FIG. 26 flow into a bit line 1, whereas charge corresponding to polarization n flow into a bit line 2. Since m>>n, as seen from FIG. 26, the bit line 1 takes a higher potential. If this potential difference is received by the sense amplifier and amplified, the information of the memory cell can be read out.

Next, the rewrite circuit is operated. Simultaneously with this, the potential of the drive line is reduced to 0. The rewrite circuit is a kind of latch circuit to raise the higher potential side to a far higher level (e.g., approximate to the supply potential) and to drop the lower potential side to a far lower level (e.g., the potential 0). At this time, the ferroelectric capacitor of the memory cell takes state C in FIG. 26 until it is returned to the state A by turning OFF the selection transistor.

On the other hand, the dummy cell has its state charged from E to F, as shown in FIG. 26, until it is returned to the state D, i.e., the initial state.

Thus, it becomes possible to identify the state of the ferroelectric capacitor, by comparison with the dummy cell. If, when the voltage A is applied, there is a large difference in the change in polarization of he ferroelectric capacitor relative to the dummy cell, then the ferroelectric capacitor is in state A. If, on the otherhand, the change is small, the ferroelectric capacitor is in state D. Since the voltage a is not sufficient to reverse the polarization of the ferroelectric capacitor, the removal of that voltage a causes the ferroelectric capacitor to return to its initial state, whichever that initial state was. Thus, in this embodiment, during the reading operation, it is not necessary for the polarization state of the ferroelectric capacitor to be reversed, and then its initial state be rewritten.

Thus, the consumption of the energy by the reading operation is that designated by a region, as hatched in FIG. 20, which is lower than the region corresponding to the known ferroelectric memory, which is defined by points A, B, F, E, D and C, so that the energy consumption can be reduced. Thus, it is possible to perform the reading operation at a high speed while preventing ageing of the ferroelectric material.

Dummy cells are used in the present embodiment but need not be used if the selection transistor is opened with the bit line potential being given in advance.

The field of application of a memory element having the structure in the embodiments described above can be exemplified by three kinds of random access memories (RAM), as will now be described.

The first application is a nonvolatile ferroelectric RAM (FRAM) making use of the hysteresis characteristics of the ferroelectric material and requiring no electric backup.

The access time in this case is of the order of microseconds and is 1/1000 of the access time of a nonvolatile memory such as the magnetic disc or optical disc (which are of the order of milliseconds). Moreover, the recording density per unit area is superior to that of the nonvolatile memory such as the magnetic disc or optical disc so that a memory having a larger capacity can be provided. On the other hand, the bit cost of known FRAMS is about 1000 times that of a magnetic disc or optical disc but the present invention may permit that to be reduced to about 10 times and possibly to an equal level so that the high effect can be enjoyed. If a multi-bit memory cell is adopted, the effect is improved. Moreover, the nonvolatile RAM (FRAM) of the present embodiment is superior to an EEPROM in operation speed, in storage capacity and in the ease of manufacture.

The second application kind is a dynamic RAM (DRAM) which makes use of the fact that the dielectric factor is remarkably high although lacking the hysteresis characteristics.

Because of the volatility, in this case, the information refreshing operation and the electric backup are required as in a known DRAM. Even if, however, a complicated structure such as the trench structure is not adopted as one memory element, a fine structure can be easily fabricated to give an advantage that a DRAM of large capacity having a smaller risk of soft error than that of the known DRAM can be provided at a reasonable cost.

Systems using the first and second applications will now be described in connection with Embodiments 11 and 12.

Embodiment 11

FIG. 22 is a block diagram showing the structure of a DRAM or nonvolatile RAM according to the present invention.

Figure 27:
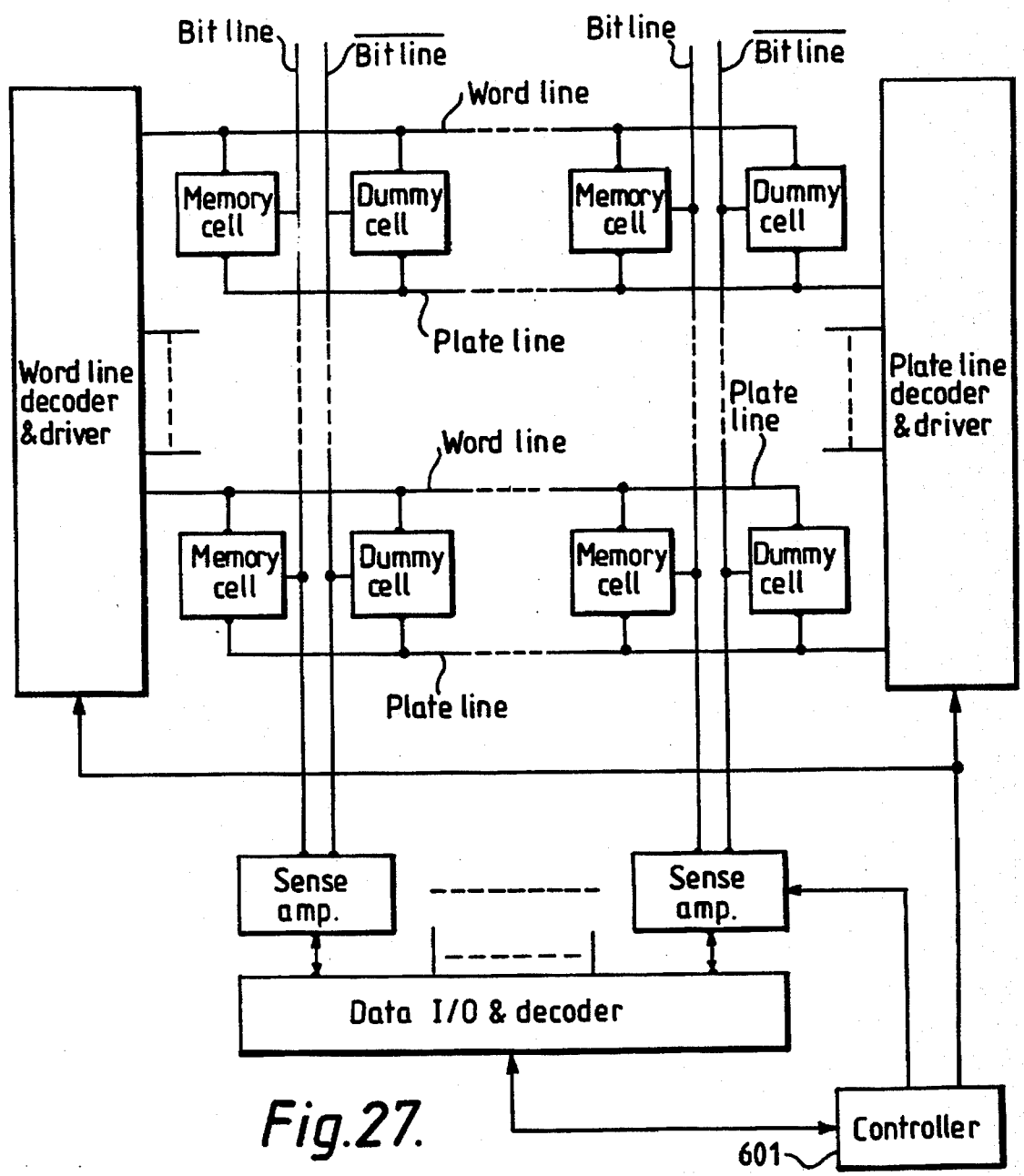
FIG. 27 is a block diagram showing a RAM of Embodiment 11 of the present invention.

In FIG. 27, square blocks in solid lines indicate a memory cell or dummy memory cell, which is composed of one selection transistor and one ferroelectric capacitor. The word lines and drive plate are fed with potentials by input signals which are indicated at the I/O signal block (controller 601) of FIG. 27. In order to read out information from the individual memory cells, it is sufficient to perform operations similar to those of embodiment 10.

Thus, it is possible to fabricate a DRAM or nonvolatile RAM is which highly resistant to radioactive rays.

Embodiment 12

Figure 28:
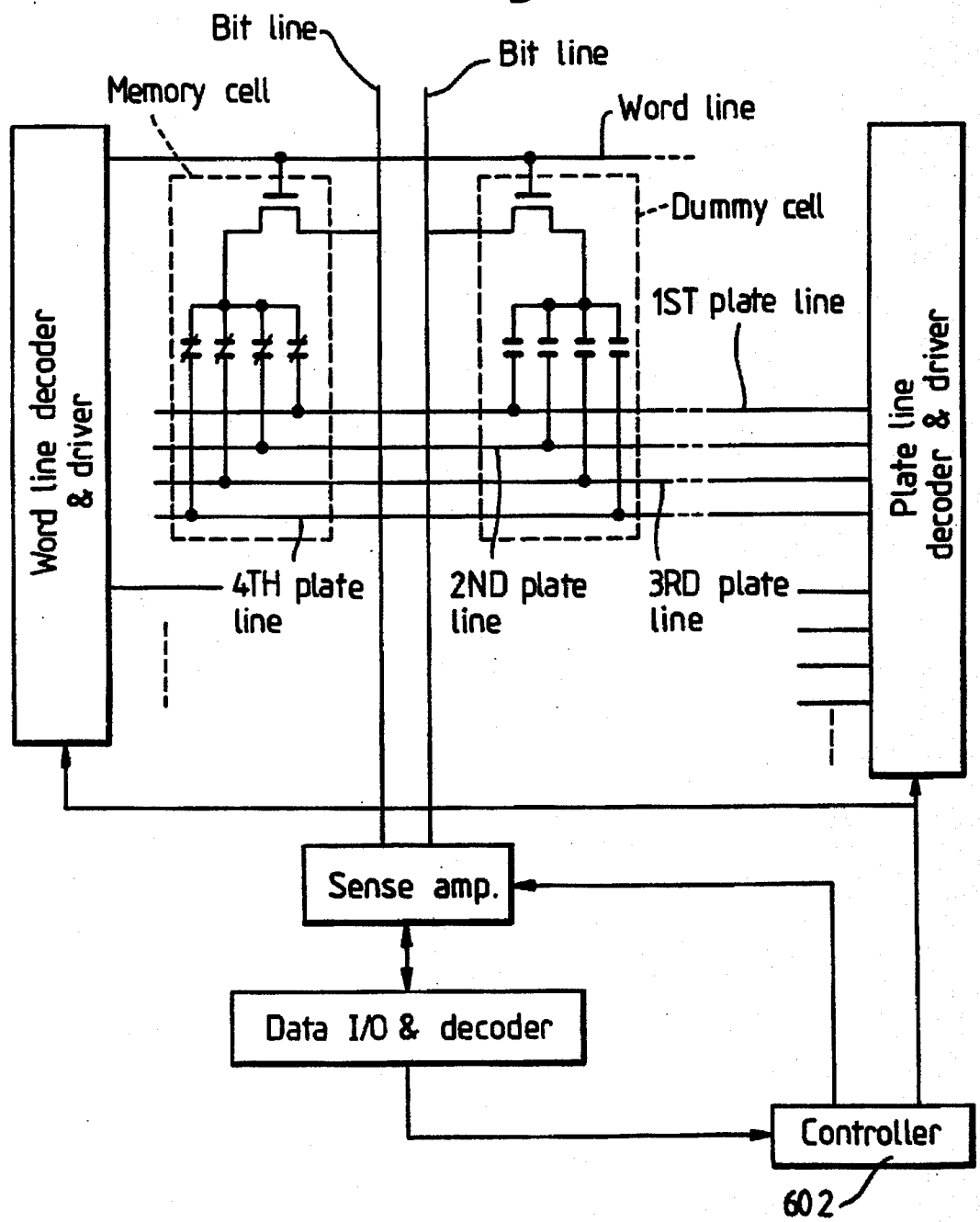
FIG. 28 is a block showing a RAM of Embodiment 12 of the present invention.

FIG. 28 is a block diagram showing one embodiment of the structure of a DRAM or nonvolatile RAM, which may enabled to read/write information of multiple bits with one memory cell.

This embodiment has a structure of 4 bits. In FIG. 28, rectangular blocks shown by broken lines indicate a multi-bit memory cell or dummy memory cell, which is composed of one selection transistor and four ferroelectric capacitors. Potentials are applied to the word lines and plate lines by the input signals which are indicated by an I/O block (controller 602) in FIG. 24.

The operations for reading out informations from the individual memory cells may be similar to those of the Embodiment 1, 2 3 or 10.

Thus, it is possible to fabricate a DRAM or nonvolatile RAM or large capacity, which is highly resistant to radioactive rays.

Embodiment 13

The third arrangement of RAM is a static RAM (SRAM) which does not have a capacity as high as that of the DRAM but requires no memory refreshing operation and can operate at a high speed. In this case, too, there can be attained the advantages that a higher reliability, a larger capacity and a lower cost than those of a known SRAM can be simultaneously achieved, as has been described above in connection with the DRAM.

Figure 29:
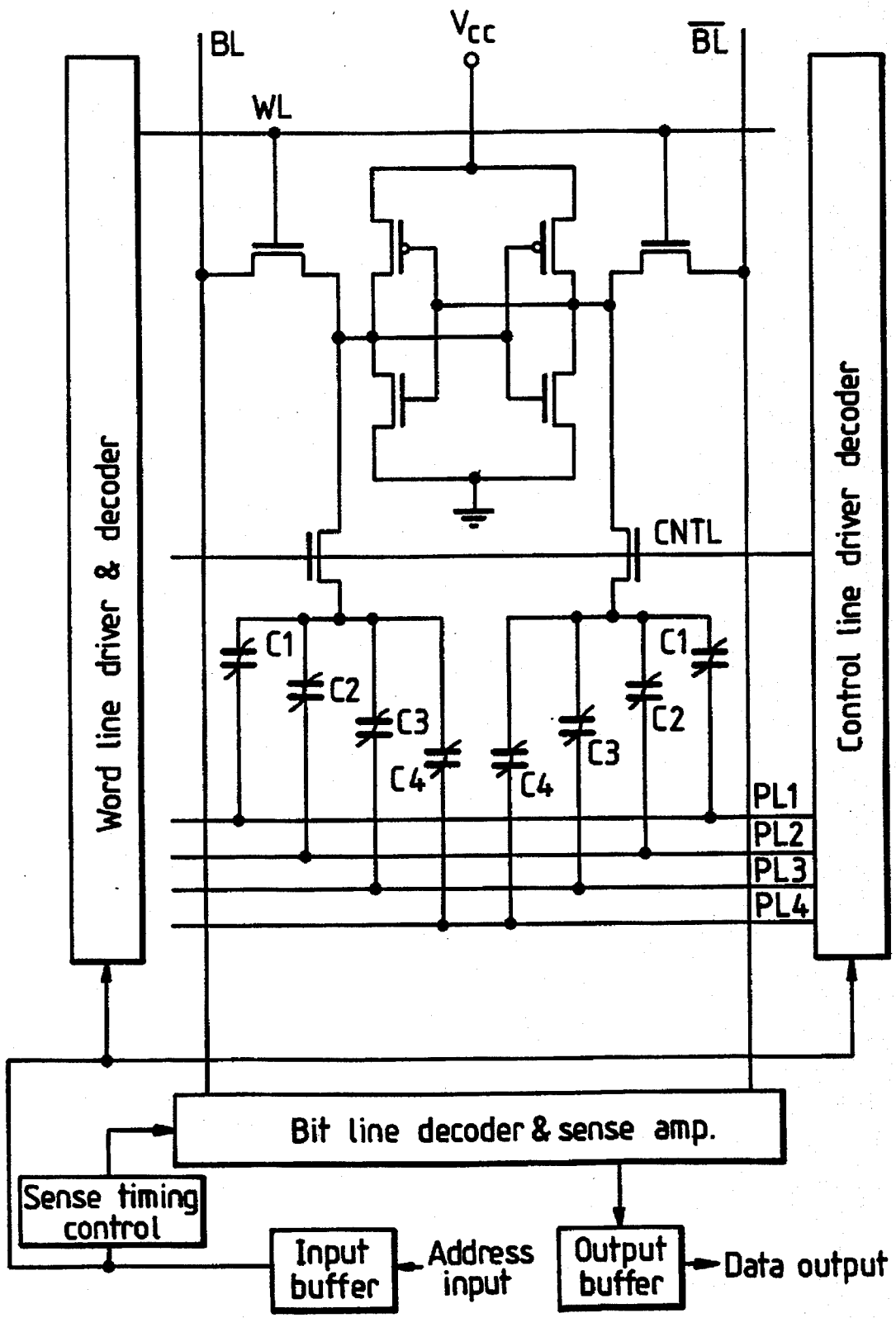
FIG. 29 is a diagram for explaining Embodiment 13 of the present invention.

FIG. 29 is a block diagram showing one embodiment of the structure of the SRAM which is enabled to read/write informations of multiple bits with one memory cell. The present embodiment is exemplified by a structure of 4 bits.

FIG. 29 shows four kinds of memories such as SRAMs of CMOS type. Those other than the quaternary memory can be matched by changing ferroelectric capacitors Cn and Cn and a plate line PLn.

Although an nMOS type device can be other than of CMOS construction, the CMOS construction is desirable because of its low power consumption.

Embodiment 14

The above embodiments have all discussed the structure of a memory device, incorporating ferroelectric capacitors. However, as was mentioned earlier, the present invention also seeks to improve the structure of the ferroelectric capacitor itself, and such embodiments will now be described.

Figure 30:
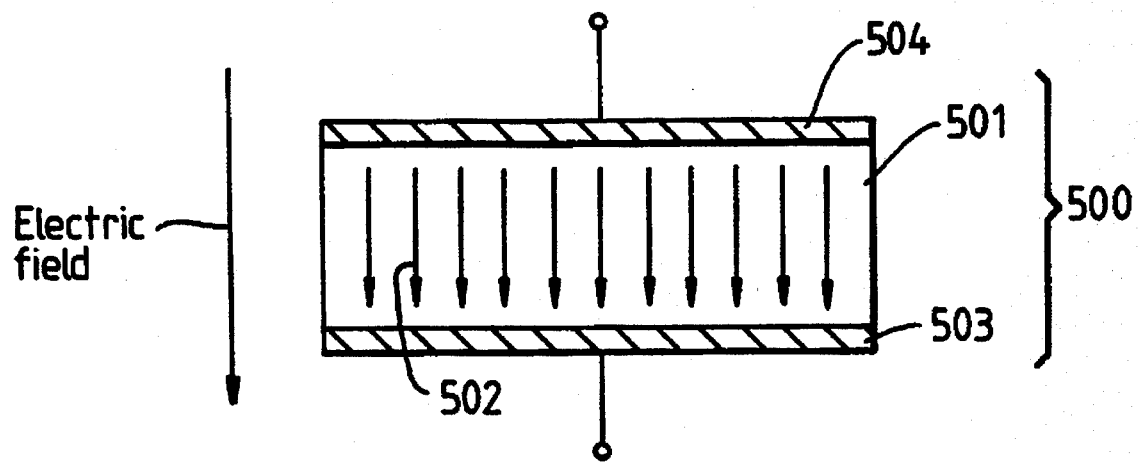
FIG. 30 is a diagram showing the crystal axis of a ferroelectric capacitor to be used in Embodiment 14 of the present invention.
Figure 31:
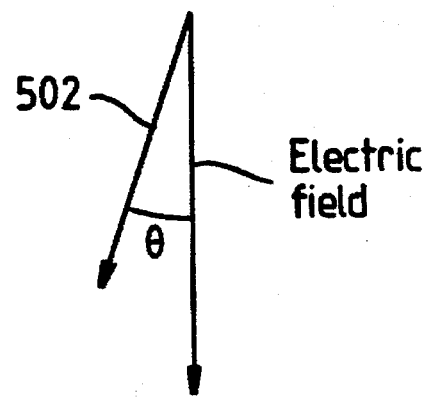
FIG. 31 is a diagram showing the relationship between the crystal axis of a ferroelectric capacitor to be used in Embodiment 14 of the present invention and the applied electric field.

FIG. 30 shows a crystal axis 502 which has a direction parallel (or in inverted parallel) to the voluntary polarization of a ferroelectric crystal 501 in a ferroelectric capacitor 500.

The ferroelectric capacitor 500 corresponds to any of the ferroelectric capacitors 112 to 115, for example, as shown in FIG. 4, and may have one electrode connected with a plate line and its other electrode of the drain of a MOSFET.

The net magnitude of the residual polarization of the ferroelectric crystal 501 is determined by the sum of the projection of the crystal axis 502 on the applied electric field vector. Therefore, when the crystal axes 502 are dispersed, the net residual polarization is small. In order to improve the reliability of the stored information, therefore, it is necessary for the area of such a capacitor 500 to be kept. Because of the small number of polarization domain, which participate in the polar inversions, these inversions occur under a weak electric field. Therefore, the ferroelectric capacitor 500 does not exhibit clear hysteresis characteristics, and is prone to disturbance. Moreover, memory errors are liable to occur if such a ferroelectric capacitor 500 is used as the nonvolatile memory element making use of the residual polarization.

In the present embodiment, therefore, the part of the ferroelectric crystal 501 for which the angle $\Theta$ between the direction of the crystal axis 502 and the applied electric field is not more than 5 degrees, is no less than 80% of the whole of ferroelectric crystal 501 composing the capacitor 500. As a result, the net residual polarization is increased to 1.8 times as large as that of the case, in which the crystal axis 502 is completely disturbed, as shown in FIG. 21, thereby to increase the field resistance.

Figure 32:
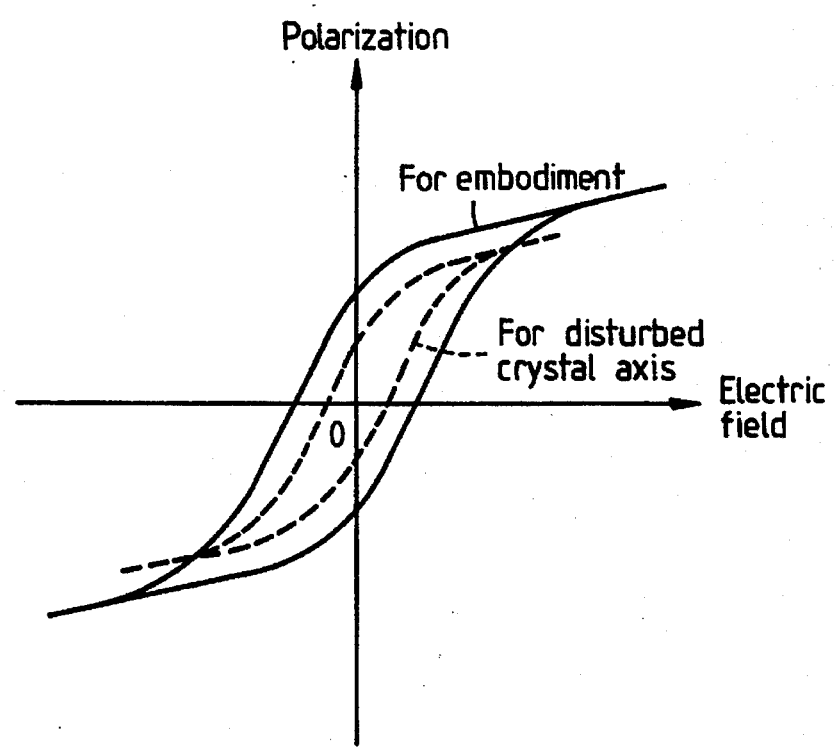
FIG. 32 is a diagram showing the hysteresis characteristics of a ferroelectric capacitor to be used in the Embodiment 14 of the present invention.

As a result, the hysteresis characteristics obtained are more definite, as shown in FIG. 32. This improves the reliability of the stored information while reducing the memory errors. In order to achieve an identical residual polarization, moreover, the area of the capacitor may be 60% of that of a capacitor with disturbed crystal axes to give the advantage that the size of the memory element can be reduced. Incidentally, one electrode of the capacitor 500 is connected with the drain in the present embodiment but may be connected to the source electrode.

If the capacitor 500 is made of a ferroelectric material, the dielectric factor is far larger than that of the known dielectric material (e.g., $SiO_2$ or $Ta_2O_5$). As a result, there is the advantage that the charges to be stored in the capacitor 500 can be increased to reduce the surface area of the electrode significantly. Therefore, this effect will now be described, with the ferroelectric crystal to be used being $BaTiO_3$.

The specific dielectric factor of the $BaTiO_3$ is of the order of several thousands at room temperature and is about one thousand times as large as that (i.e., 4.6) of $SiO_2$ and one thousand times or more as large as that (i.e., 12) of $Ta_2O_5$. As a result, the surface area of the electrode can be reduced to $\frac{1}{100}$ to $\frac{1}{1,000}$.

When the dielectric material used is $SiO_2$, the area to be used as the capacitor becomes the smaller for a finer memory element. In order to store the capacitor with charges sufficient for eliminating the soft errors, the structure is made to be three dimensional by forming the capacitor above the gate electrode of the MOSFET via an insulating film. Another possibility is to use a trench structure, in which the capacitor is constructed by forming a deep trench adjacent the source or drain electrode. These devices are necessary for increasing the surface area of the electrode of the capacitor and the charges to be stored in the capacitor.

Another option is to use $Ta_2O_5$ which has a higher specific factor than that of $SiO_2$. Even after these options have been used however, it there remains the difficulty that the ratio of the capacitor to the top plan area of the whole memory element exceeds 50% and that the fabrication process is complicated.

On the contrary, no hysteresis is exhibited by making the capacitor of a ferroelectric material such as $BaTiO_3$ as in the present embodiment, the electrode surface area is drastically reduced because of it extremely high dielectric factor, so that sufficient charge can be stored without using a complicated structure such as the trench structure. Thus, there is then the advantage that the fabrication process is facilitated. Moreover, the ratio of the electrode area of the capacitor to the whole top plan area of the memory element is sufficient, even when it is as low as 30% or less, which is significantly advantageous for achieving a finer structure for the memory element.

Embodiment 15

Next, the optimum crystallizability and polarization structure of the ferroelectric material will be described.

Figure 33:
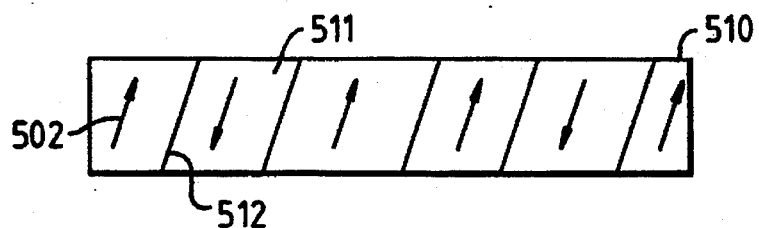

FIG. 33 is a diagram showing crystal faces in a polycrystalline ferroelectric material 510. The ferroelectric material 510 has its crystal face 512 oriented in parallel with the crystal axis 502 in the present embodiment. The crystal face of the prior art is shown in FIG. 34.

Figure 34:
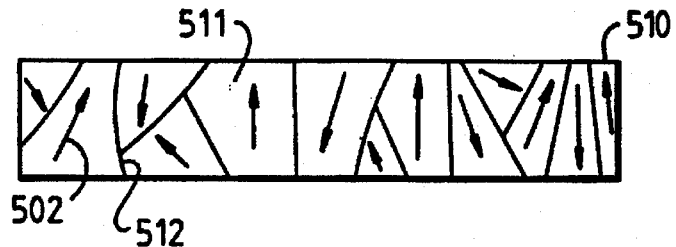
FIG. 34 is a diagram showing the crystal grain of known ferroelectric material.

When the crystal face 512 and the crystal axis 502 are not in parallel from the lower to upper faces of the ferroelectric material 510, as shown in FIG. 34, polarization occurs at the crystal face 512. In order to rewrite the information recorded in the ferroelectric material 510, there is applied an electric field for inverting the net polarization of the ferroelectric material 510. If, however, the ferroelectric material 510 is rewritten many times, stresses concentrate in the crystal faces 512 thereby shortening the lifetime of the ferroelectric material 510. This is a more serious problem than the reduction of the net residual polarization and the deterioration of the hysteresis characteristics.

If, on the contrary, the crystal faces of the ferroelectric material 510 is parallel to the crystal axis 502, as in the present embodiment, no polarization takes place at the crystal face 512 so that the concentration of stress on the crystal face 512 is reduced. This lengthens the lifetime of the ferroelectric film. Since the direction of the polarization axis is also defined in this way, moreover, the net residual polarization can be high enough to give excellent hysteresis characteristics.

Embodiment 16

Figure 35:
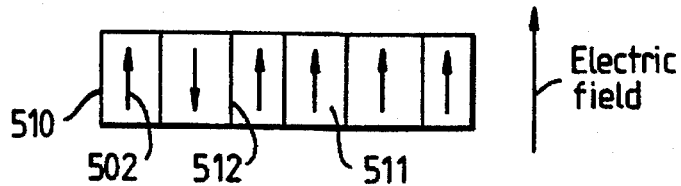
FIG. 35 is a diagram showing the crystal grain of ferroelectric material to be used in Embodiment 16 of the present invention.

In addition to the foregoing embodiments, the crystal face 512 of the ferroelectric material 510 may be parallel to the direction of application of the electric field, as shown in FIG. 35. Then, the stress concentration is reduced and the hysteresis characteristics are improved. In order to orientate the crystal faces 512 and the field application direction, a micro single crystalline region 511 of polycrystals may be grown from one electrode to the other electrode into a column shape in the direction of the crystal axis 512 in parallel with the polarization axis by a sputtering or vacuum deposition method and additionally by thermally annealing the formed film.

Embodiment 17

When the ferroelectric film is amorphous, and only the crystal axis relating to the polarization is oriented in the embodiment, similar effects can be attained by making a structure similar to that of the embodiment of the polycrystalline ferroelectric film even if another axis is wholly disturbed without holding the order of long distance.

Embodiment 18

Even if the ferroelectric is made of a single crystal, the direction of voluntary polarization is known to have a polarized structure. The ferroelectric material to be used to make the capacitor may desirably have a high polarization inversion rate and should exert no adverse affect upon the semiconductor material (especially Si) and the impurity distribution of that material. Particularly suitable is an inorganic ferroelectric material having a crystal structure of perovskite type for phase transition of displacement—non-displacement. When exhibiting ferroelectricity, the ferroelectric material has a cubic form which has a crystal structure deformed slightly more in the paired crystal axes than in another crystal axis.

Figure 36A:
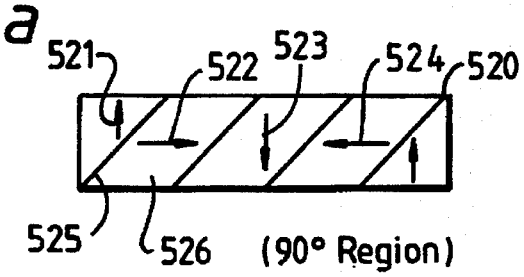
FIGS. 36(a) and 36(b) are diagrams showing the ferroelectric region of ferroelectric material to be used in Embodiment 18 of the present invention.
Figure 36B:
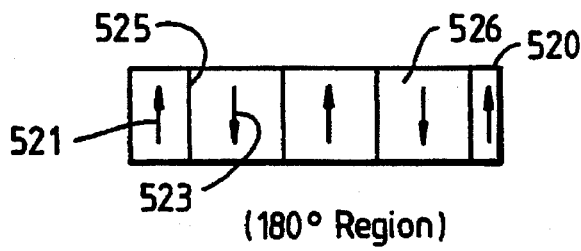

As shown in FIGS. 36a and 36b, the ferroelectric region in this case is such that the polarization axis contacts at an angle of 90 degrees (i.e., the structure of 90-degree region) or at an angle of 180 degrees (i.e., the structure of 180-degree region). If an electric field is applied from the outside to the ferroelectric material 520, an interface region 525 moves to extend the polarization (assumed to be upward) having a direction approximate to that of electric field. When the applied electric field is equal to the field resistance, the upper and lower regions have an equal area so that the net polarization is 0. If the electric field is further applied, the upward region is increased untill all the regions are directed upward. In this case, the polarization axis and the applied electric field are desirably in parallel for the same reasoning as that described in the embodiment using polycrystalline ferroelectric material. In the present embodiment, therefore, the angle contained between the region boundary 525 and the applied electric field is set to 0 degrees (or 180 degrees). As a result, the polarization axis 521 is oriented in parallel (or in reverse parallel) to the electric field to improve the net residual polarization and to provide excellent hysteresis characteristics. The angle between the region boundary and the applied electric field may be 45 degrees.

In the embodiments described above, there has been described the method of achieving the excellent hysteresis characteristics. When a hysteresis is present, a high crystal axis anisotropy is present in the dielectric factor. In other words, the dielectric factor is highly different between the polarization axis and a perpendicular axis.

Embodiment 19

For a DRAM making no use of the hysteresis characteristics, the dielectric factor is desirably isotropic. In case, therefore, the DRAM may be made of a ferroelectric material in which the voluntary polarization is not uniform. In other words, the DRAM is desirably made of an amorphous ferroelectric film with completely no orientation.

Embodiment 20

Figure 37:
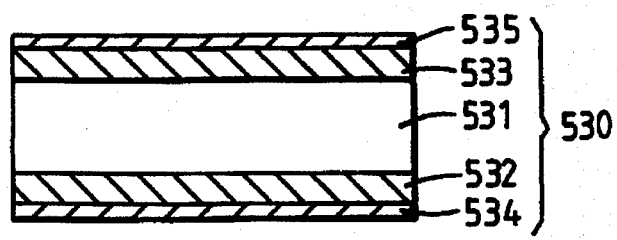
FIG. 37 is a section showing a ferroelectric capacitor to be used in Embodiment 20 of the present invention.

Next, the structure of a ferroelectric capacitor will be described in which the dielectric material of the capacitor is made by stacking a ferroelectric material and a paraelectric material. FIG. 37 shows a section of such a capacitor 530. Paraelectric materials 532 and 533 are desirably formed as insulating films between the ferroelectric material 531 and the electrodes 534 and 535, so as to suppress chemical reaction between the electrodes 534 and 535 and the ferroelectric film 531, to suppress the leakage current of the ferroelectric film 531, to improve the adhesion between the electrodes 534 and 535, to exert no adverse affect upon the MOSFET, and to prevent any adverse affect due to heat treatment.

In this embodiment, the ferroelectric material 532 used is exemplified by $BaTiO_3$, and the paraelectric materials 532 and 533 used are exemplified by silicon oxide (SiO). The films 532 and 533 of SiO are determined from the dielectric factor of $BaTiO_3$ 531. For $BaTiO_3$, for example, the specific dielectric factor is about 6000 in dependence upon the fabrication method. Since SiO has a specific dielectric factor of about 5, the SiO films 532 and 533 have a thickness of about $1/100$ of that of the $BaTiO_3$ film 531 so as to apply an electric field of ten times as high as that of the $BaTiO_3$ film 531 to the SiO films 532 and 533. More specifically, the SiO films 532 and 533 are desirably 0.8 nm if the $BaTiO_3$ film 531 has a thickness of 0.1 μm.

Next, a suitable fabrication method will be described. First, the lower electrode 534 is formed by a sputtering method, for example, and the SiO film 532 is formed by e.g. Chemical Vapor Deposition (CVD) method. In this case, the substrate temperature is set to form a SiO film of high quality. Next, the BaTiO$_3$ film 531 is formed by e.g. a sputtering method. The SiO film 533 is formed over the film 531. If, at this time, a high temperature is established in a reducing atmosphere containing hydrogen, oxygen will go out of the BaTiO$_3$ 531 to deteriorate the characteristics as the ferroelectric material. Since, moreover, the dielectric factor itself may possibly be reduced, the substrate temperature should not be accidentally raised during the forming of the upper SiO film 533. In the present embodiment, a microwave plasma CVD method may be used so that a SiO film of high quality may be formed at a low temperature. Next, the upper electrode 535 is formed by a sputtering method to remove the unnecessary regions. After this, necessary processes are carried out.

By this method, there can be formed the capacitor 500 in which the paraelectric film and the ferroelectric film are stacked. The advantage of the stacking of the paraelectric film and the ferroelectric film is the capability of controlling the electric field to be applied to the BaTiO$_3$ film. Specifically, the thickness of this BaTiO$_3$ film is required to be 0.1 μm or less, from consideration of the size of the memory element. Since, however, the voltage to be applied is several volts, the electric field may be as high as several hundreds kV/cm, with the risk of dielectric breakdown. In the present embodiment, on the contrary, the electric field to be applied to the ferroelectric film can be controlled by sandwiching the ferroelectric film between the paraelectric films. As a result, there is no possibility of causing dielectric breakdown.

Moreover, the magnitude of the applied electric field can be less than the field resistance. In the present embodiment, for example, the thickness of the SiO films 532 and 533 may be 2 nm or less so that the magnitude of the electric field to be applied to the BaTiO$_3$ film 531 may be of the order of several kV/cm.

This embodiment has been described for the case where the paraelectric film is made of SiO, but this may be replaced by silicon nitride (SiN) with similar effects.

Embodiment 21

Next, the composition of the ferroelectric thin film will be described.

The ferroelectric thin film is usually made of a material such as BaTiO or its substitute, or Pb (Ti$_x$Zr$_{1-x}$)O$_3$. In particular, Pb(Ti$_x$Zr$_{1-x}$)O$_3$ may be used to make a ferroelectric capacitor for use in the present invention because it has a high Curie point and a high residual polarization. Moreover, a ferroelectric thin film having superior dielectric characteristics can be formed by a tertiary system which contains (A$_{1/2}$, A$_{1/2}$)TiO$_3$, Pb(B$_{1/3}$, B$_{2/3}$)O$_3$, Pb(B$_{1/2}$, B$_{1/2}$)O$_3$, Pb(B$_{1/2}$, B$_{1/2}$)O$_3$ and Pb(B$_{1/4}$, B$_{3/4}$)O$_3$ in addition to PbTiO$_3$—PbZrO$_3$. Here, in the aforementioned composite compound, A$^{1+}$: Li, Na, K or Ag; A$^{3+}$: Bi, La, Ce or Nd; B$^{1+}$: Li or Cu; B$^{2-}$: Mg, Ni, Zn, Mn, Co, Sn, Fe, Cd or Cu; B$^{3+}$: Mn, Sb, Al, Yb, In, Fe, Co, Sc, Y or Sn; B$^{5+}$: Nb, Sn, Ta or Bi; and B$^{6+}$: W, Te or Re. Of these, the tertiary thin film of PbTiO$_3$—PbZrO$_3$—Pb(Mg$_{1/3}$, Nb$_{2/3}$)O$_3$ exhibits excellent dielectric characteristics. Moreover, by containing several mol % of La$_2$O$_3$, Nd$_2$O$_3$, Nb$_2$O$_5$, Ta$_2$O$_3$, Bi$_2$O$_3$ or WO$_3$ in the Pb(Ti$_x$Zr$_{-x}$)O$_3$, the migration of the region wall especially important in a memory element, is facilitated. Thus, the writing and erasing procedures of the memory element, the internal strain caused due to the polarization can be dispersed to reduce ageing.

The above ferroelectric thin film can be formed:

(i) by sputtering method such as magnetron sputtering, microwave plasma sputtering or ion beam sputtering;

(ii) by a CVD method such as the vacuum CVD, high frequency plasma CVD or microwave plasma CVD method;

or (iii) by a sol-gel method (i.e., a method in which an alkylate or an organic compound containing Pb or Ti is mixed into an organic solvent, the mixture is applied thinly to the substrate, and the film is heated or irradiated with light to set and form the film). Since these ferroelectric materials are oxides, as has been described above, the state of oxygen at the time of forming the thin film plays a remarkably significant role. As a result, a ferroelectric polycrystalline thin film having well arranged crystal axes can be formed by the high frequency magnetron sputtering or Electron Cyclotron Resonance (ECR) microwave plasma sputtering method for forming excited oxygen radicals or ions to a high density.

When forming the film by one of those sputtering method, the temperature is desirably 450° C. or less. At a higher temperatures, the adhesion coefficient of Pb or 0 is reduced to offset the chemical stoichiometry. If the diffusion layer forms an electrode, as has been described above, the method of forming the paraelectric thin film as a lower layer may be remarkably advantageously exemplified by the aforementioned magnetron sputtering or ECR microwave plasma sputtering method because the oxidation of the Si surface can be promoted by the oxygen in the plasma during the sputtering operation to form an SiO$_2$ film having an excellent dielectric breakdown voltage. The SiO$_2$ film thus diffused from the interface between the ferroelectric thin film and the normally dielectric thin film (SiO$_2$) has a stable dielectric breakdown voltage and advantageous dielectric characteristics.

If a sol-gel method is used, a ferroelectric thin film having an excellent coverage can be formed on the side walls of the contact parts of the source/drain electrodes of the MOSFET. The ferroelectric thin film can then be formed:

(i) by mixing at a predetermined ratio the metallic alcoxide composed of Pb(OR$_1$)$_2$, Ti(OR$_2$)$_3$ and Zn(OR$_3$)$_4$ (wherein R$_1$, R$_2$ and R$_3$ designate the alkyl group including C$_3$H$_7$ and C$_4$H$_9$) to prepare an organic solvent such as alcohol having a density of 0.1 to 0.01 mol/litter;

(ii) by repeating the application and drying of the liquid; and (iii) by annealing the liquid in an electric furnace.

At the time of this drying step, a ferroelectric capacitor having an excellent dielectric breakdown voltage can be formed by irradiation with ultraviolet rays at a temperature of about 150° C. in an atmosphere of O$_2$. This is because the oxygen defect of the ferroelectric thin film is less established partly because the reaction of the alcoxide is promoted by the ultraviolet rays and partly because ozone is generated. The film thus formed may then be annealed in the oxygen atmosphere at 600° to 800° C. By this annealing step, an oxide film is formed at the interface of the aforementioned Si diffused layer so that the laminated film having a stable interface and composed of paraelectric material and the ferroelectric thin film can be formed.

Embodiment 22

Figure 38:
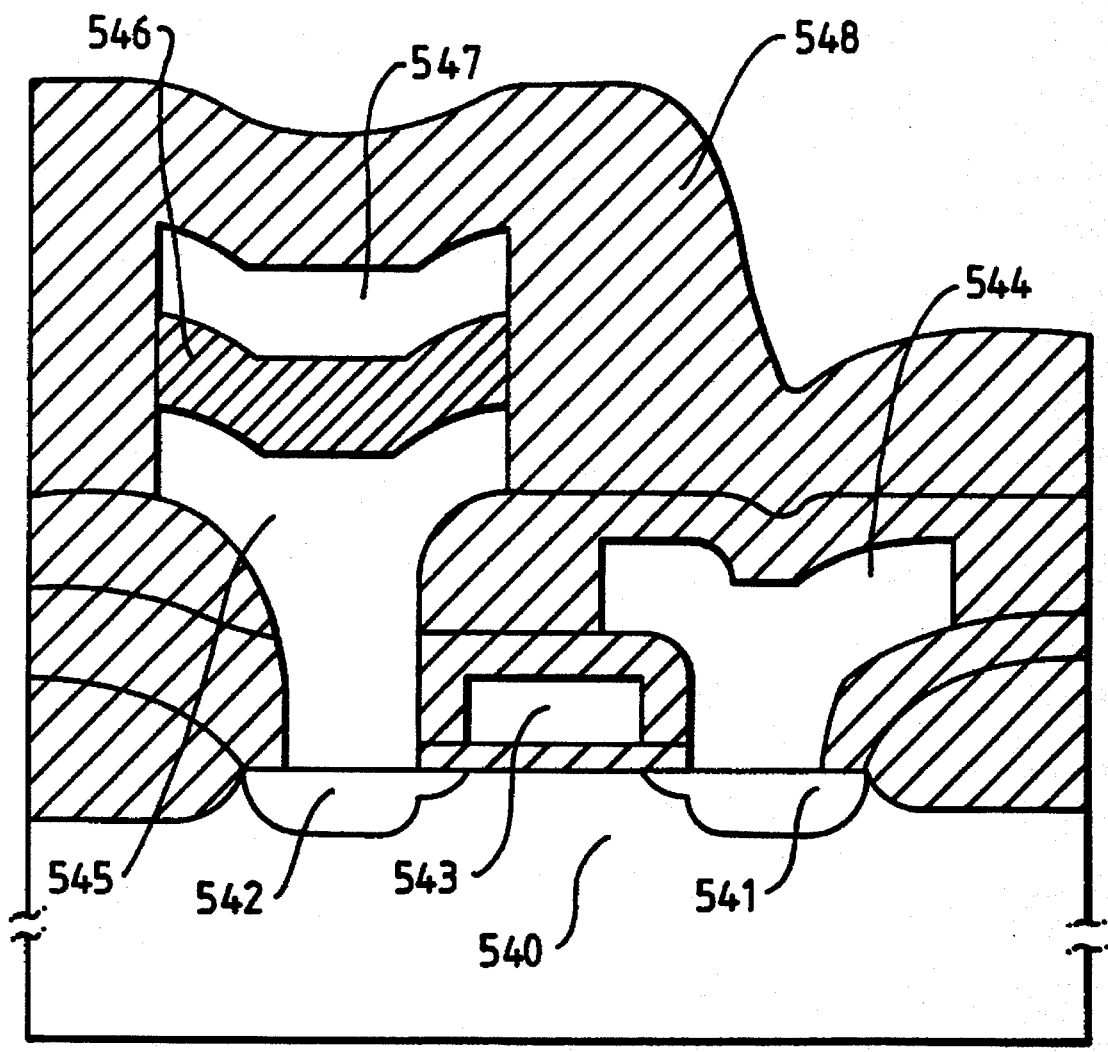
FIG. 38 is a section showing a memory cell device of Embodiment 22 of the present invention.

Next, an example of the structure of a single memory element will be described with reference to FIG. 38.

In this embodiment, a capacitor is formed above the drain region of the MOSFET. The method of forming this capacitor will be briefly described. First a source region 541 and a drain region 542 are formed in a Si substrate 540. Then, a gate oxide film and a gate electrode 543 are formed and are covered with an insulating film 548. A contact hole is opened in this film 548 adjacent in the source region 541, and a source electrode 544 is formed and is covered with further insulating film 548. Next, a contact hole is formed at the drain side, and an electrode 545 is formed. Ferroelectric material 546 is grown thereover and is formed thereover with an electrode 547, thus forming the capacitor. This capacitor is covered with further insulating film 548.

By this structure, a memory element using the ferroelectric material in the capacitor can be easily fabricated by an ordinary memory fabricating process. In order to improve the degree of integration, the source region 541 is desirably shared between two memory elements. In this case, the structure is made symmetric across the source electrode 544. It is also possible to form the ferroelectric material 547 not over the electrode 546 but directly over the drain region 542. It can be noted that the capacitor is formed over the drain in the present embodiment but it may alternatively be formed at the source side.

Embodiment 23

A system using a memory element as described in the embodiments described above will be described.

Figure 39:
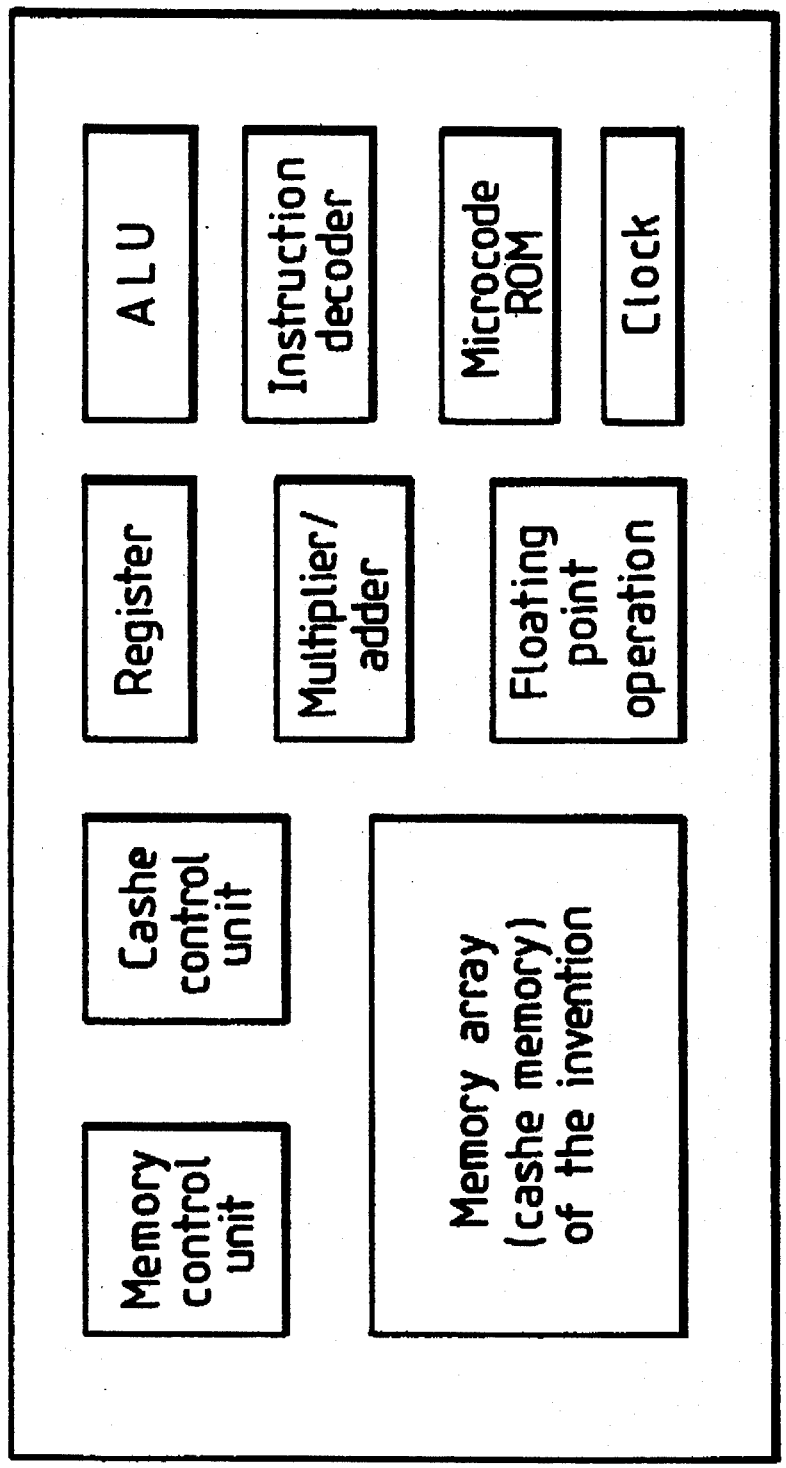
FIG. 39 is a diagram showing a logical element, in which a cache memory of Embodiment 23 of the present invention is packaged.

FIG. 39 shows a logical element (e.g., a microprocessor) having a FRAM, DRAM and SRAM according to the present invention packaged as its cache memories. If the memory element is used as a packaged cache memory as in the present invention, the capacity is drastically increased, and the power consumption can be reduced. As a result, there can be attained the advantage that a logical element having a high-grade function with a low power consumption may be constructed.

Another effect is that the microprocessor obtained is resilient to soft errors.

Embodiment 24

Figure 40:
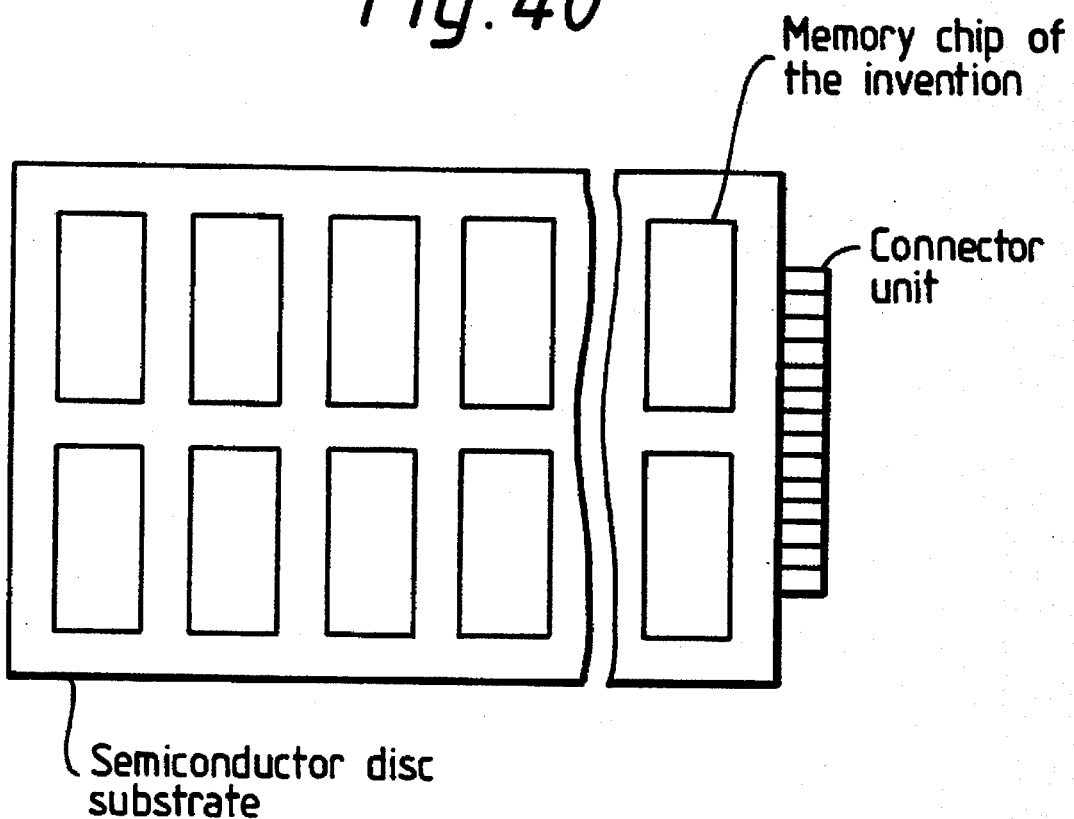
FIG. 40 is a diagram showing a semiconductor disc of Embodiment 24 of the present invention.

If a FRAM, DRAM and SRAM of the present invention are used as a semiconductor disc, as shown in FIG. 40, the resilient solid recording medium can be remarkably useful, as it has reasonable cost and high capacity, as is apparent from the foregoing description above. If a FRAM disc is used, no electric backup is required even for interruption of service, because of the nonvolatility of the device, so that the stored contents need not be copied for backup in another nonvolatile memory medium (such as a magnetic disc or tape). Because there are no moving parts, the resistance to shocks is improved, as is the power consumption.

Moreover, there is the further advantage that a semiconductor disc can be obtained which is resistant to soft errors.

Embodiment 25

Figure 41:
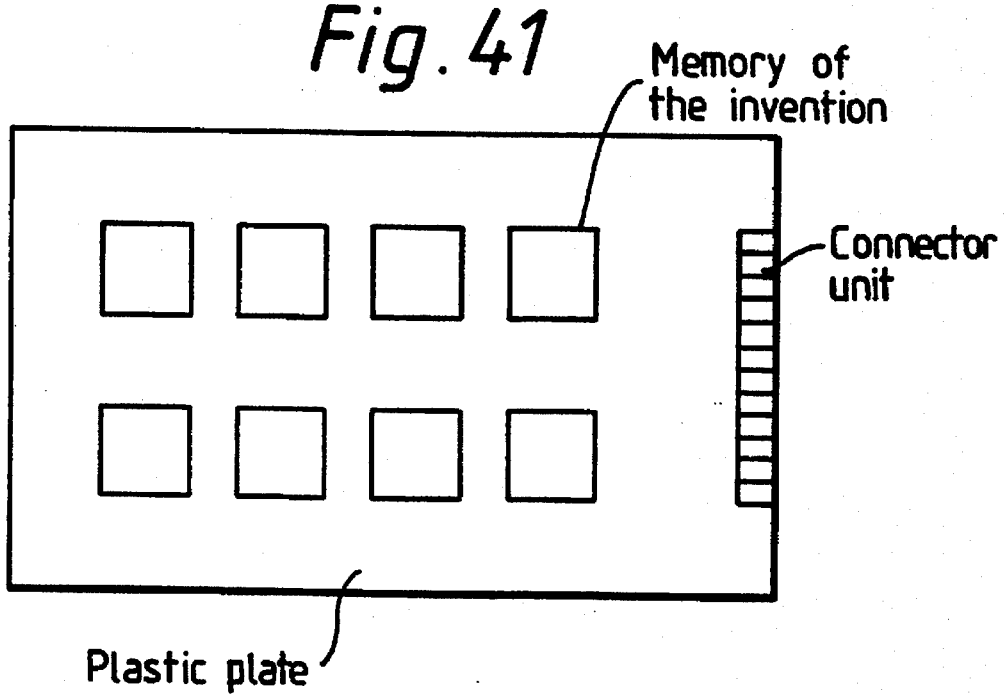
FIG. 41 is a diagram showing a memory card of Embodiment 25 of the present invention.

A FRAM and SRAM using ferroelectric material can be applied not only to the semiconductor disc but also a memory card, as shown in FIG. 41.

A card using the FRAM (i.e., the FRAM card) need not have any memory holding cell packaged in the card unlike a known memory card. Thus, the FRAM card is advantageous in that it can be used like a floppy disc and that it has a larger capacity and a higher speed access than such a floppy disc.

As a result, if the aforementioned memory card using the FRAM and SRAM is used like a floppy disc as an exchangeable auxiliary memory medium in a smaller-sized or portable computer system or a work station, the disc need not be turned, so that no rotary mechanism is required and thus the system can be small-sized. At the same time, the power consumption can be reduced to read/write large amounts of information at a high speed. Thus, the advantage can be achieved that the processing ability of the total system is improved.

Another advantage is that it is possible to provide a memory card having a larger capacity and a lower production cost than those of known memory cards using a SRAM. If a FRAM is used in the memory card, a memory holding power supply need not be packaged in the card unlike in the known SRAM memory card so that the reliability is improved. Other advantages are that the holding capacity is high and that the production cost is low.

Embodiment 26

A logical element (e.g., microprocessor), discussed above, a memory element (e.g., FRAM, DRAM or SRAM) according to the present invention, a semiconductor disc according to the present invention, and a memory card according to the present invention are highly effective if they are used in supercomputers, large-sized, general-purpose, medium-sized and small-sized computers, work stations, personal computers, portable computers, laptop computers, and note-type (or book-type) personal computers.

Figure 42:
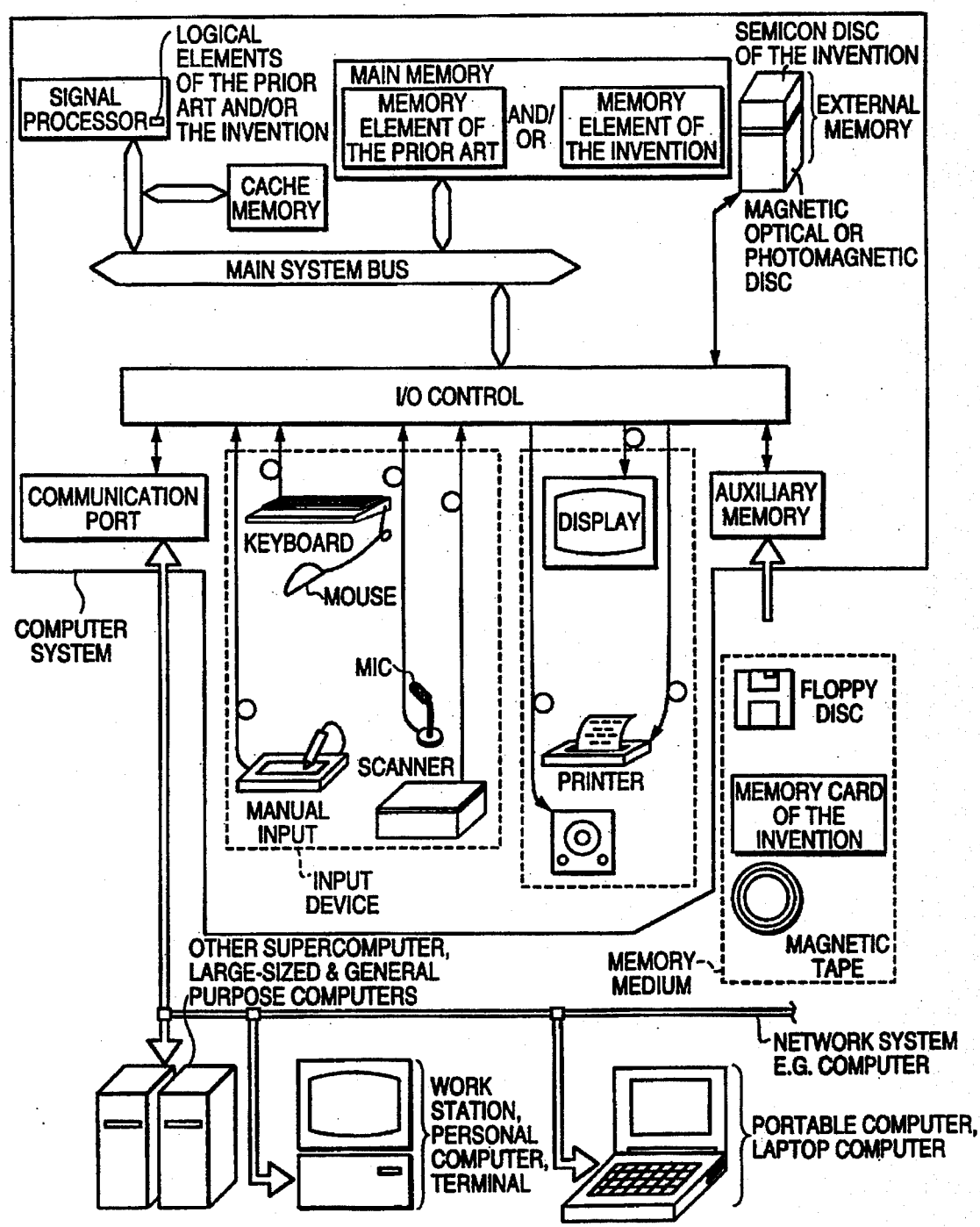
FIG. 42 is a diagram showing a computer system of Embodiment 26 of the present invention.

A computer system illustrating such an embodiment is shown in FIG. 42. In FIG. 42, DRAM and SRAM discs are used as semiconductor discs in a similar way to the known arrangements but have a larger capacity and are less expensive than the known discs so that they give the advantages of enhancing the performance, in respect of, e.g. the processing ability, they are particularly advantageous in medium, small-sized or larger computers.

On the other hand, FRAM discs have the advantages of nonvolatility, large capacity and low power consumption than the known semiconductor discs. Since no electric backup is required, because of the nonvolatility, no battery power supply is needed to allow for interruption of service, as in the medium-, small-sized or larger computers, thus giving the advantage that the whole system can be small-sized. Moreover, the stored contents need not be copied in a magnetic disc having a lower access speed. Thus, more information can be processed at a higher speed than in the known the system, thus giving the further advantage that it is possible easily to increase the speed, enhance the performance, and reduce the size and price of the whole system.

Moreover, not only portable personal computers but also note-type computers need not require any magnetic disc so that they can be made vibration. Because of their low power consumption, the computers can be run using the battery for a long time, and may be conveniently carried and used with safety even in a running car.

If, moreover, logical elements (e.g., the microprocessor) according to the present invention are used in a signal processor or if memory elements according to the present invention are used in a main memory, a large amount of information can be accessed at a high speed. Thus, there is then the further advantage that remarkably high and complicated information processing can be accomplished in a short time.

Embodiment 27

Moreover, a system using logical elements (e.g., the microprocessor) and memory elements, semiconductor discs or memory cards according to the present invention may be exemplified not only by such a computer system but also an OA system such as a word processor.

Figure 43:
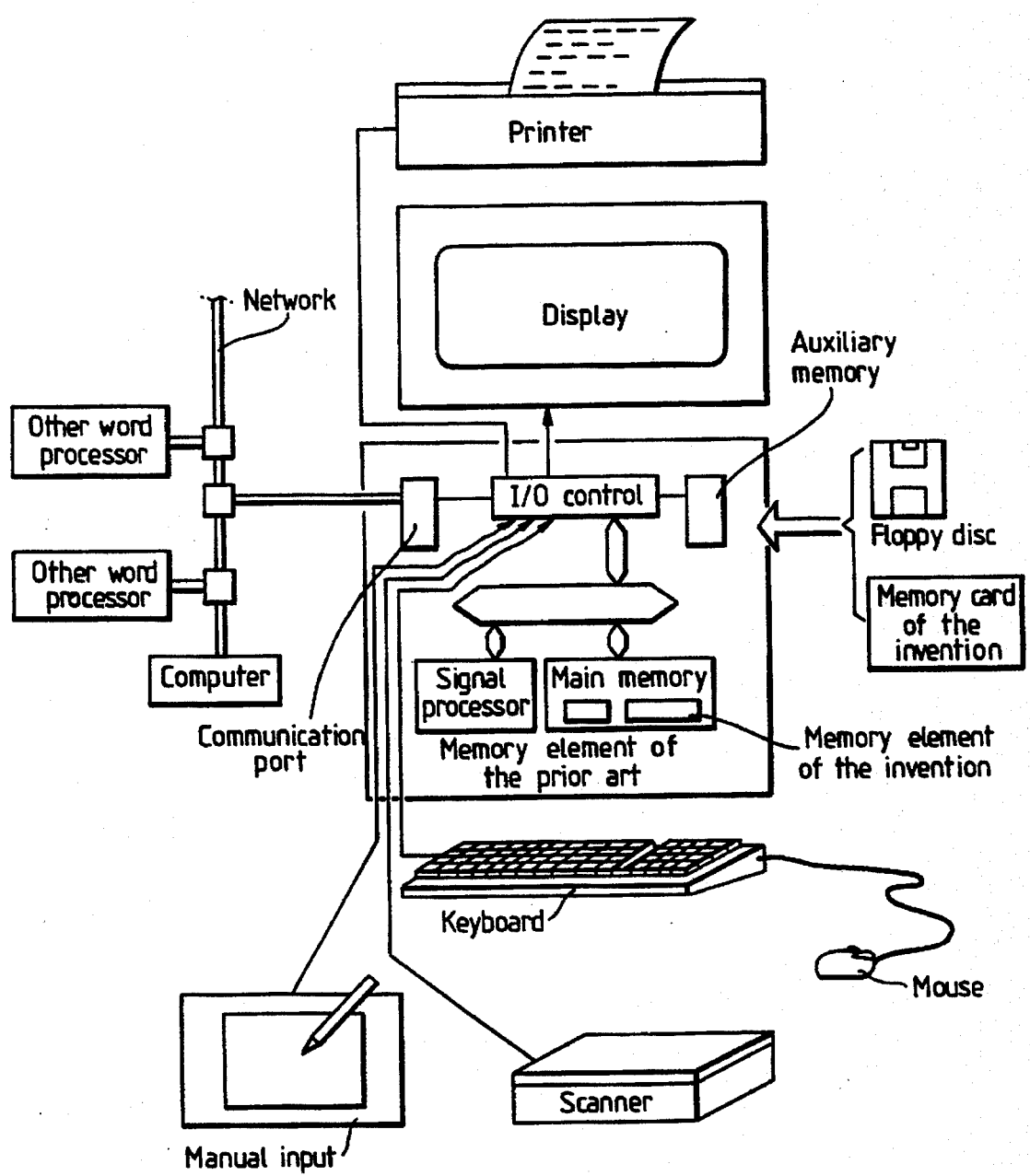
FIG. 43 is a diagram showing a word processor of Embodiment 27 of the present invention.

FIG. 43 shows an example of the structure of the word processor for explaining the present embodiment.

Figure 44:
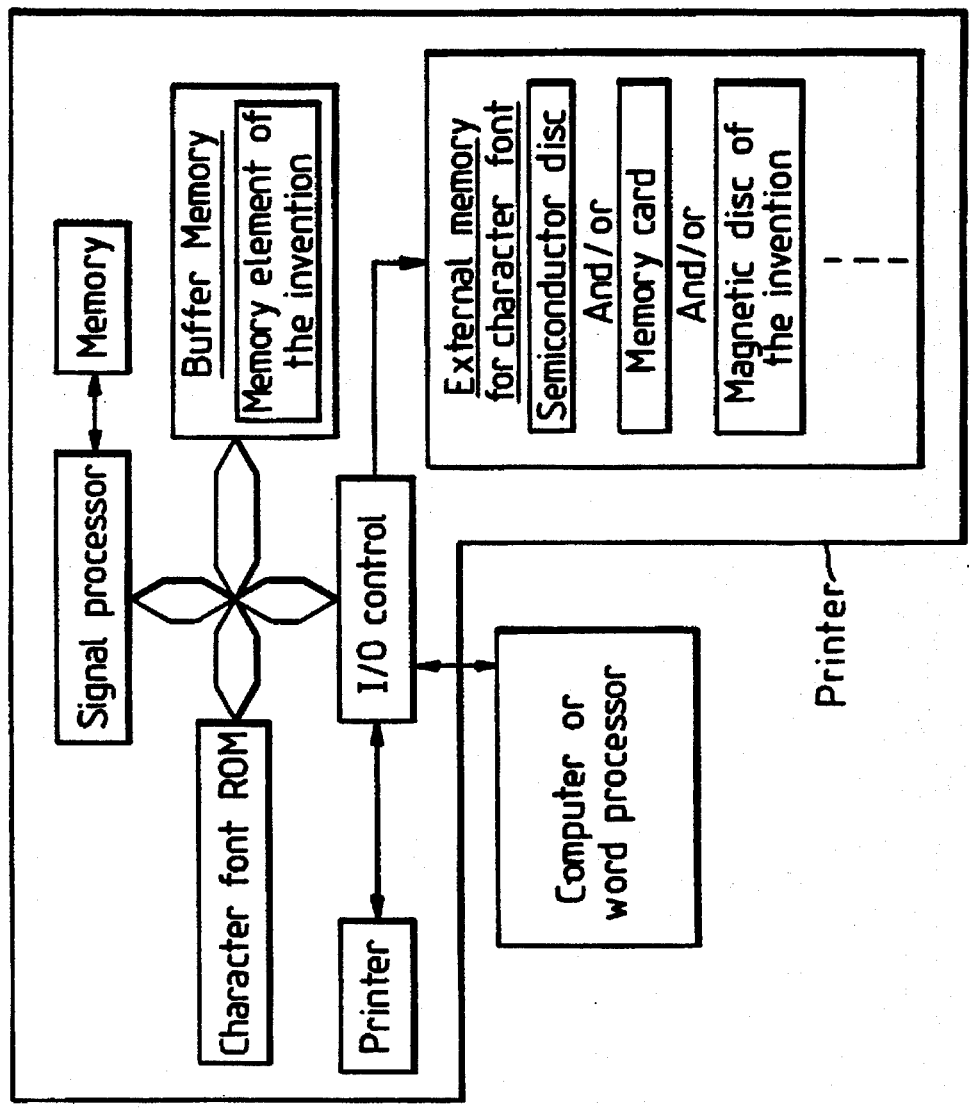
FIG. 44 is a diagram showing a printer of Embodiment 27 of the present invention.

FIG. 44 is a diagram showing the structure of a printer.

In known OA system, as for a small-sized or portable computer system, an the auxiliary memory system of large capacity is formed by a magnetic disc system, and an interchangeable auxiliary memory system of small capacity is provided by a floppy disc system. By the same reasoning as was applied to the computer system, the whole system can be easily speeded up, made small-sized, made inexpensive and made highly reliable by using memory elements, semiconductor discs and memory cards according to the present invention.

Embodiment 28

Figure 45:
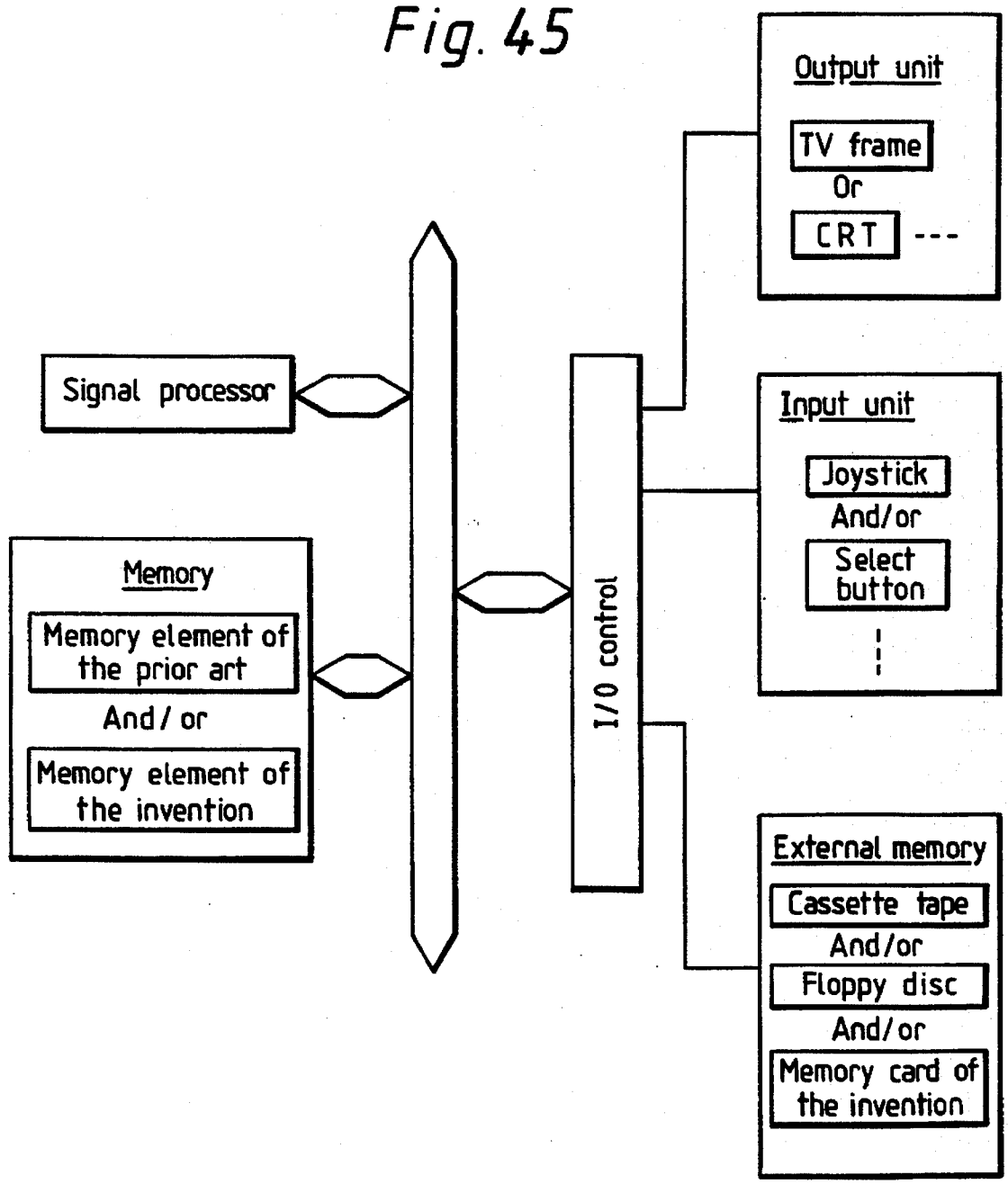
FIG. 45 is a diagram showing a game computer system of Embodiment 28 of the present invention.

Another example of the present invention is exemplified by a game computer system, as shown in FIG. 45. Since a memory of large capacity can be provided at a reasonable cost by use of the present invention, a game of high complexity can easily be designed, and the program may be operated at a high speed. This effect is especially advantageous in a portable game system.

Embodiment 29

Figure 46:
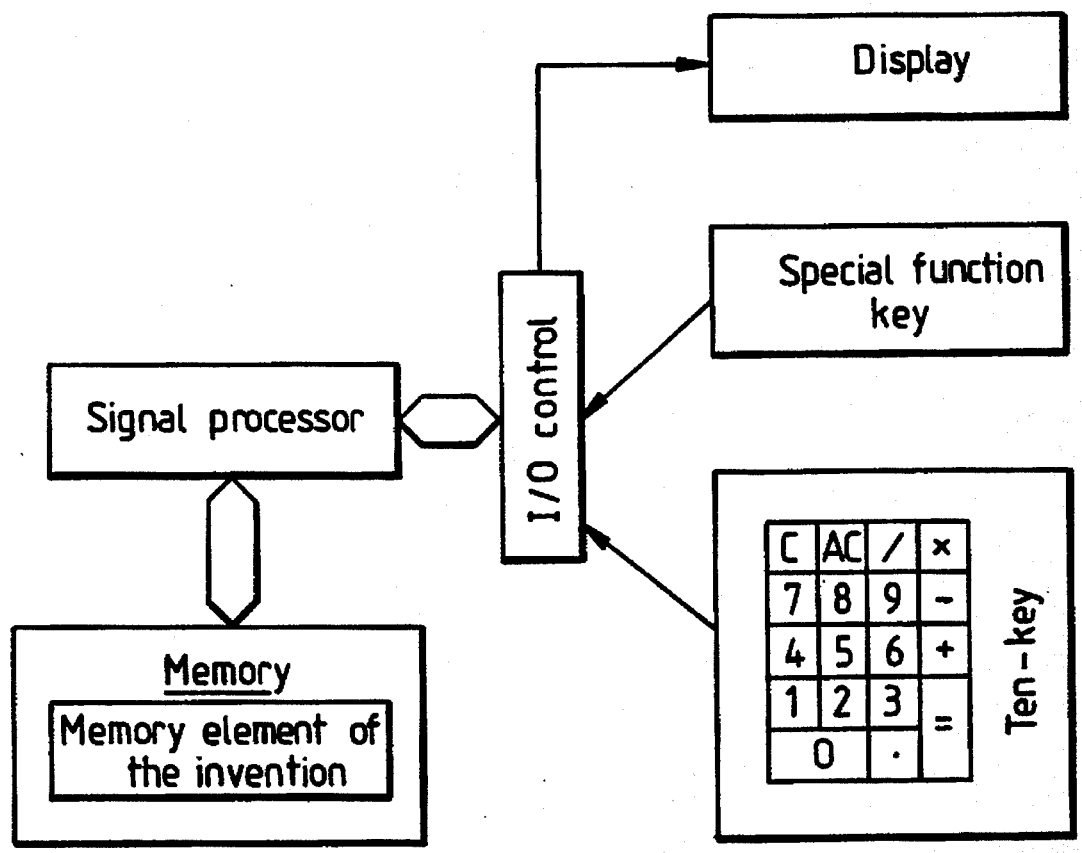
FIG. 46 is a diagram showing an electronic desk computer of Embodiment 29 of the present invention.
Figure 47:
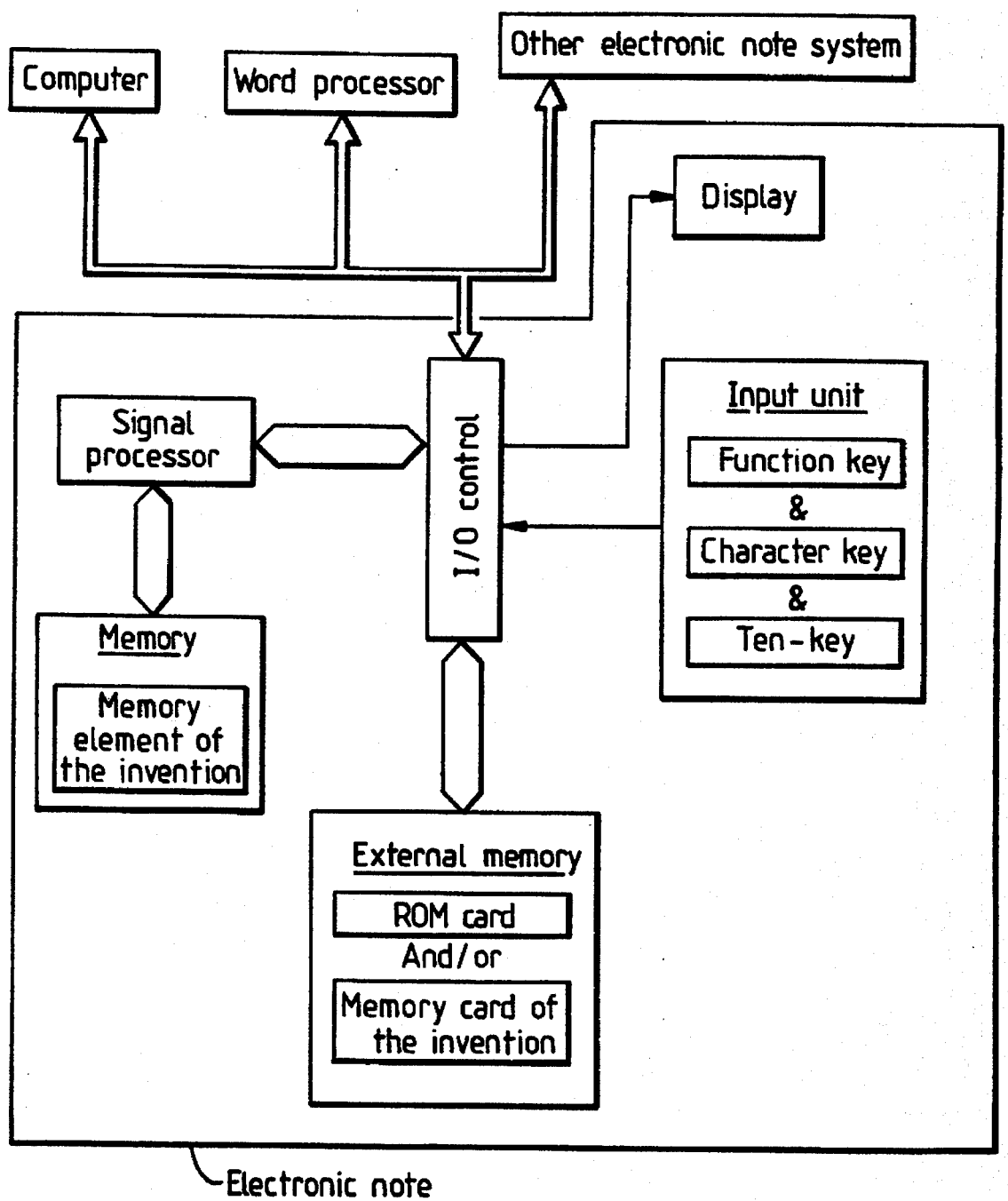
FIG. 47 is a diagram showing an electronic node of Embodiment 29 of the present invention.
Figure 48:
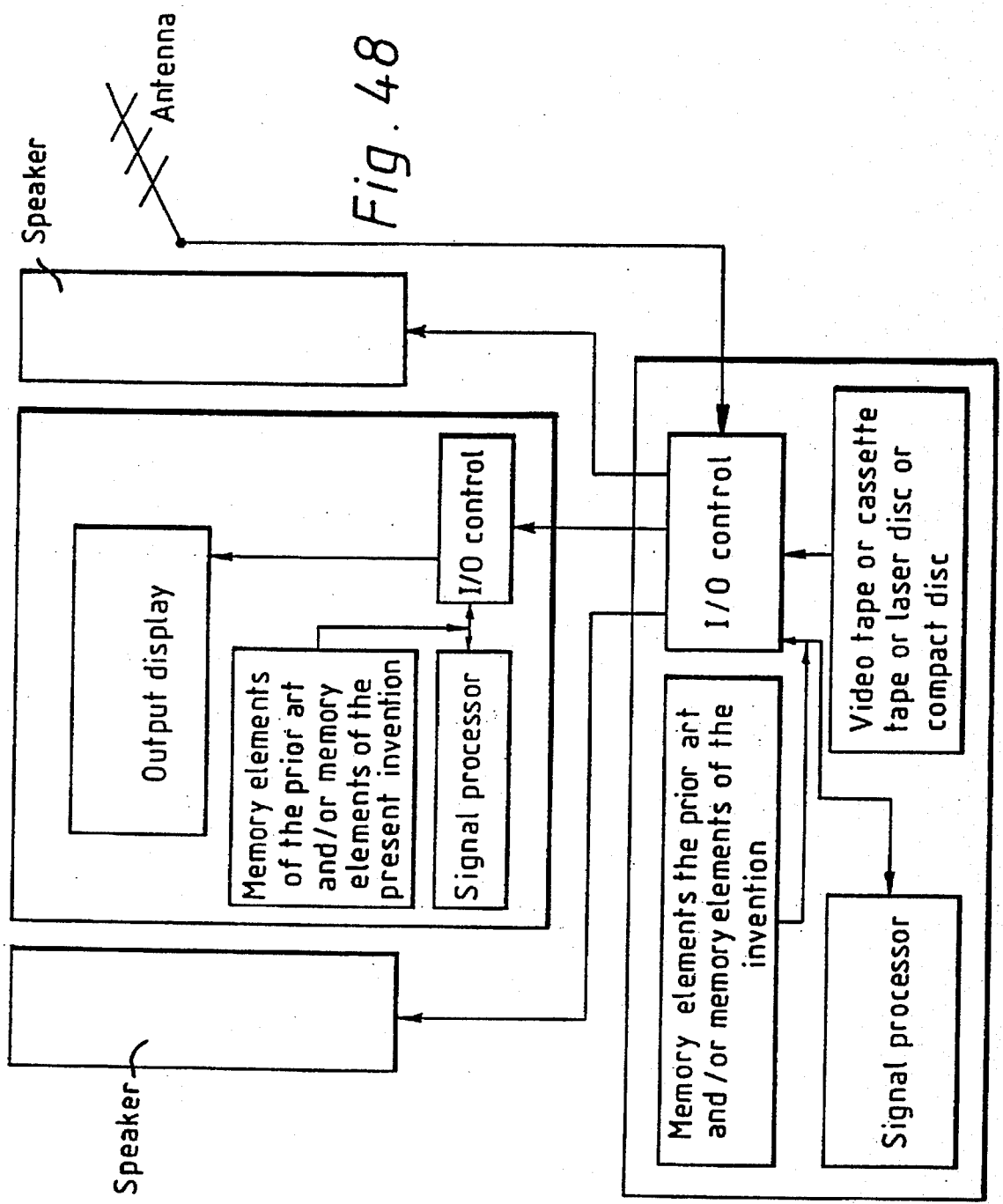
FIG. 48 is a diagram showing an instrumental device of Embodiment 29 of the present invention.

A further embodiment of the present invention is an electronic desk computer system as illustrated in FIG. 46, or an electronic node shown in FIG. 47 or an instrumental device shown in FIG. 48, which use semiconductor memory elements such as a DRAM or SRAM or a system using an external auxiliary memory device such as a memory cards. The advantages of use of the present invention are remarkable as in the embodiments described above.

Embodiment 30

Figure 49:
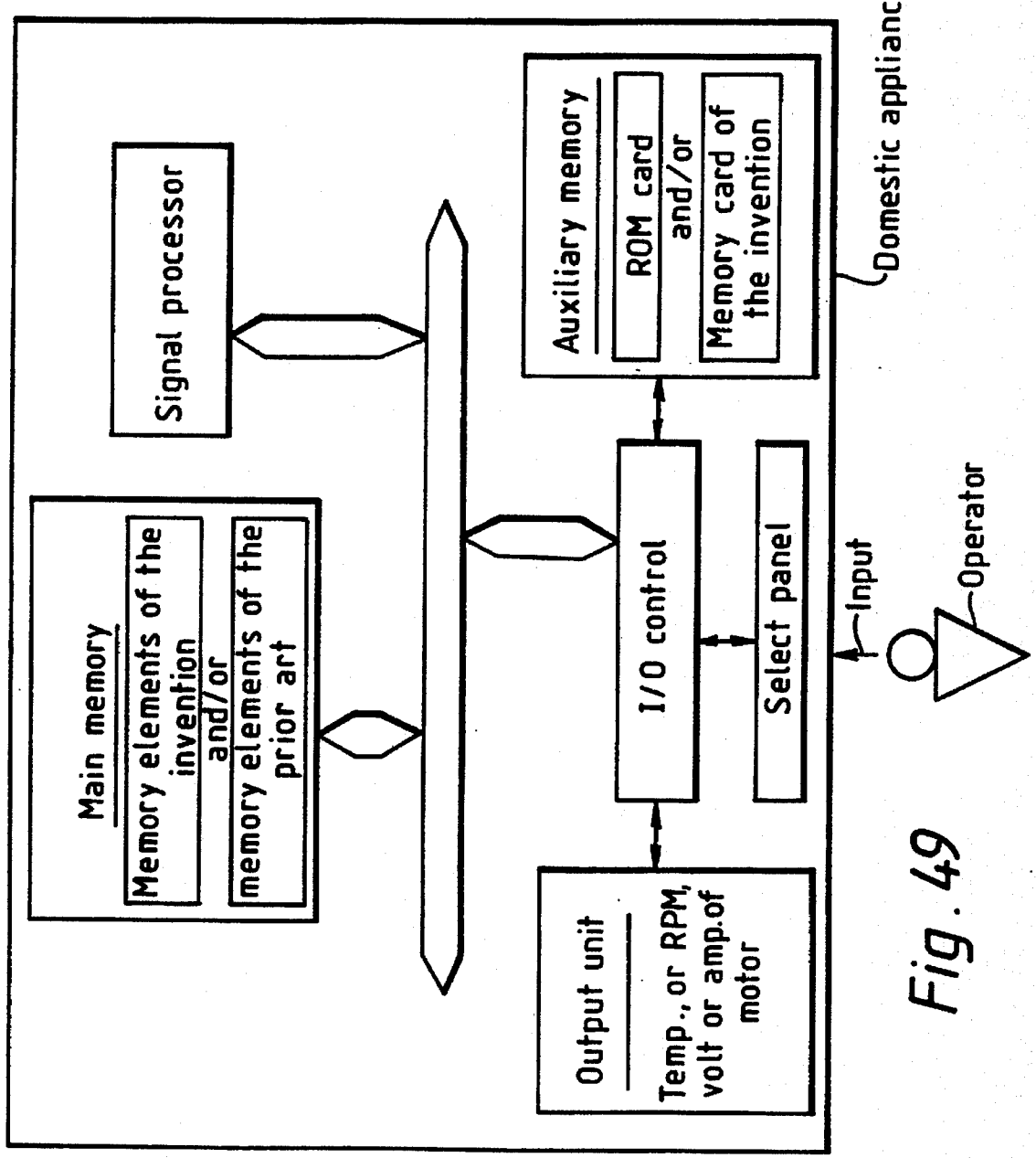
FIG. 49 is a diagram showing an audio-video system of the Embodiment 30 of the present invention.
Figure 50:
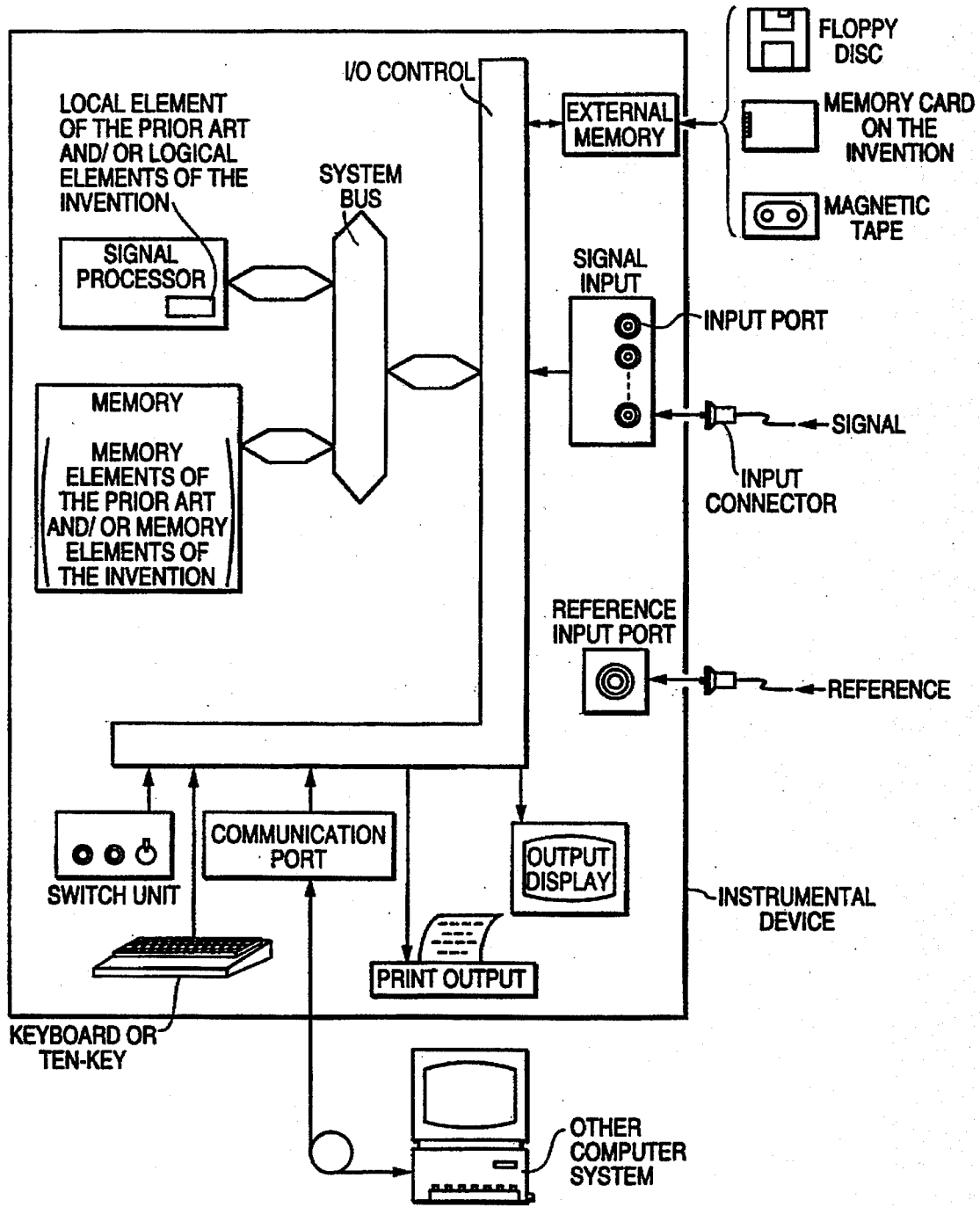
FIG. 50 is a diagram showing a domestic appliance of the Embodiment 30 of the present invention.

A further embodiment of the present invention is in a domestic electric appliance such as a TV set. Such a domestic electric appliance have been developed to include more and more electronic parts, and the capacities of the memories to be used are increasing with the improvement in the performances. Since however, existing DRAMs have a high bit cost, systems of higher performances have the higher prices. If, on the other hand, memory elements according to the present invention are used as in the audio video systems shown in FIG. 49 or the example of the schematic structures of a domestic electric appliance shown in FIG. 50, even systems of high performance can be provided at a reasonable cost because of the low bit cost.

Embodiment 31

Figure 51:
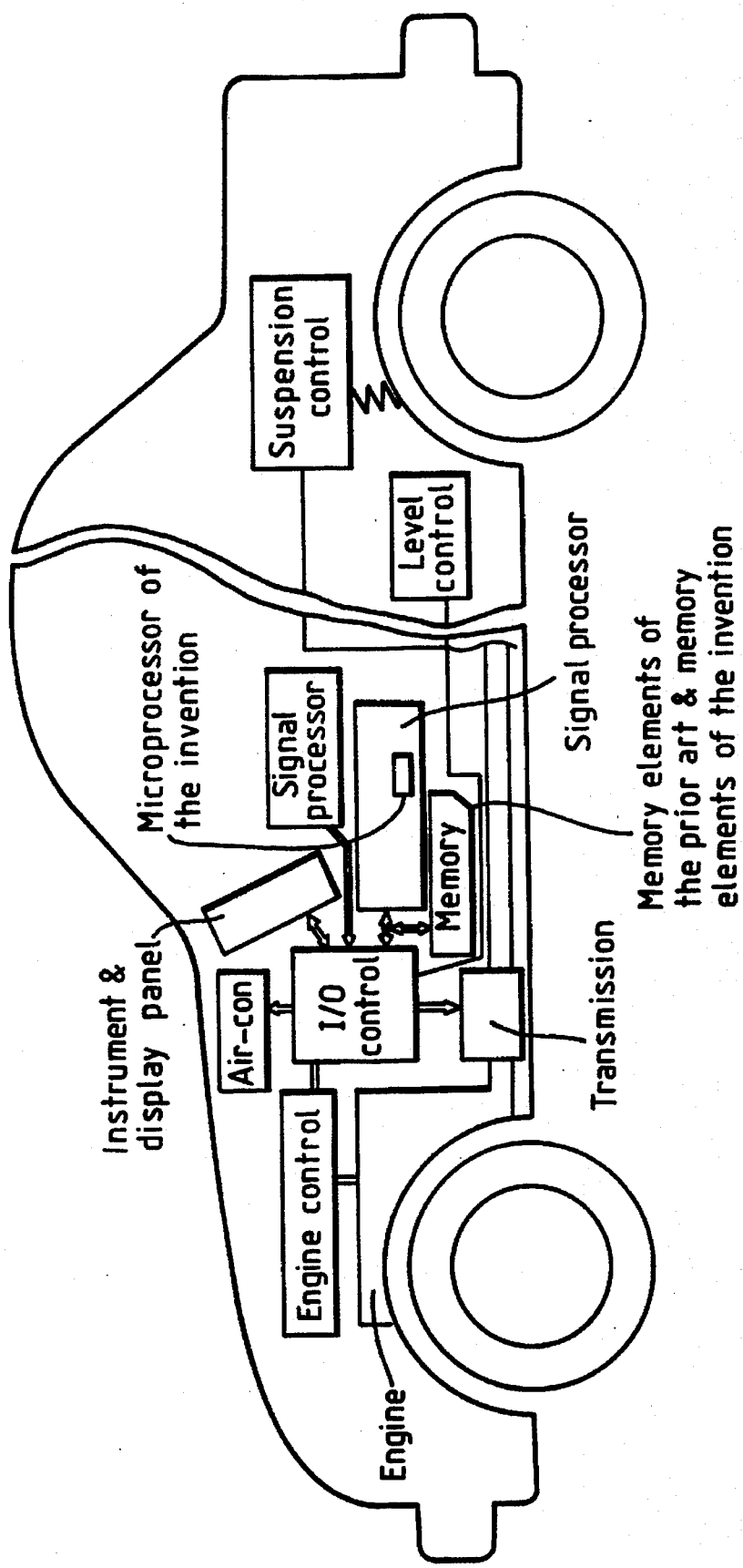
FIG. 51 is a diagram showing an automotive control system of Embodiment 31 of the present invention.

As schematically shown in FIG. 51, moreover, a system for controlling the engine or suspension of an automobile electronically can be devised. This system has an important advantage being the reliability of the stored contents. Resistance to disturbances can be enhanced (i.e., soft errors) by using DRAMs made of a ferroelectric material having a high dielectric factor according to the present invention so that the problem of reliability can be solved.

Since, moreover, a memory of large capacity can be provided, such a control system may be given a high-grade processing ability with a smaller number of parts.

If, moreover, FRAMs are used, the power consumption is reduced so that the total power consumption of the control system can be reduced to a low level thereby to improve the mileage.

Embodiment 32

Figure 52:
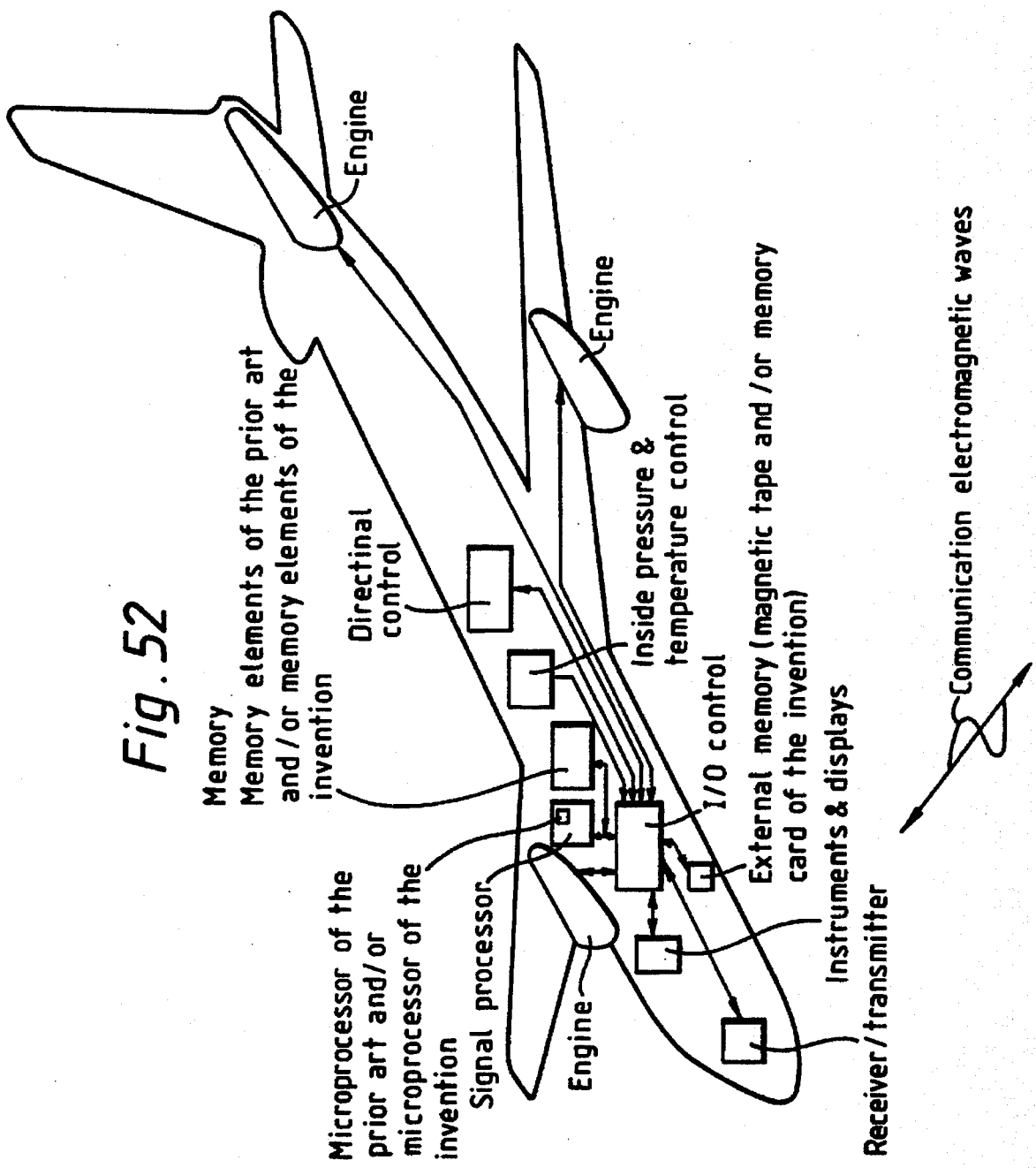
FIG. 52 is a diagram showing an aeroplane control system of Embodiment 32 of the present invention.
Figure 53:
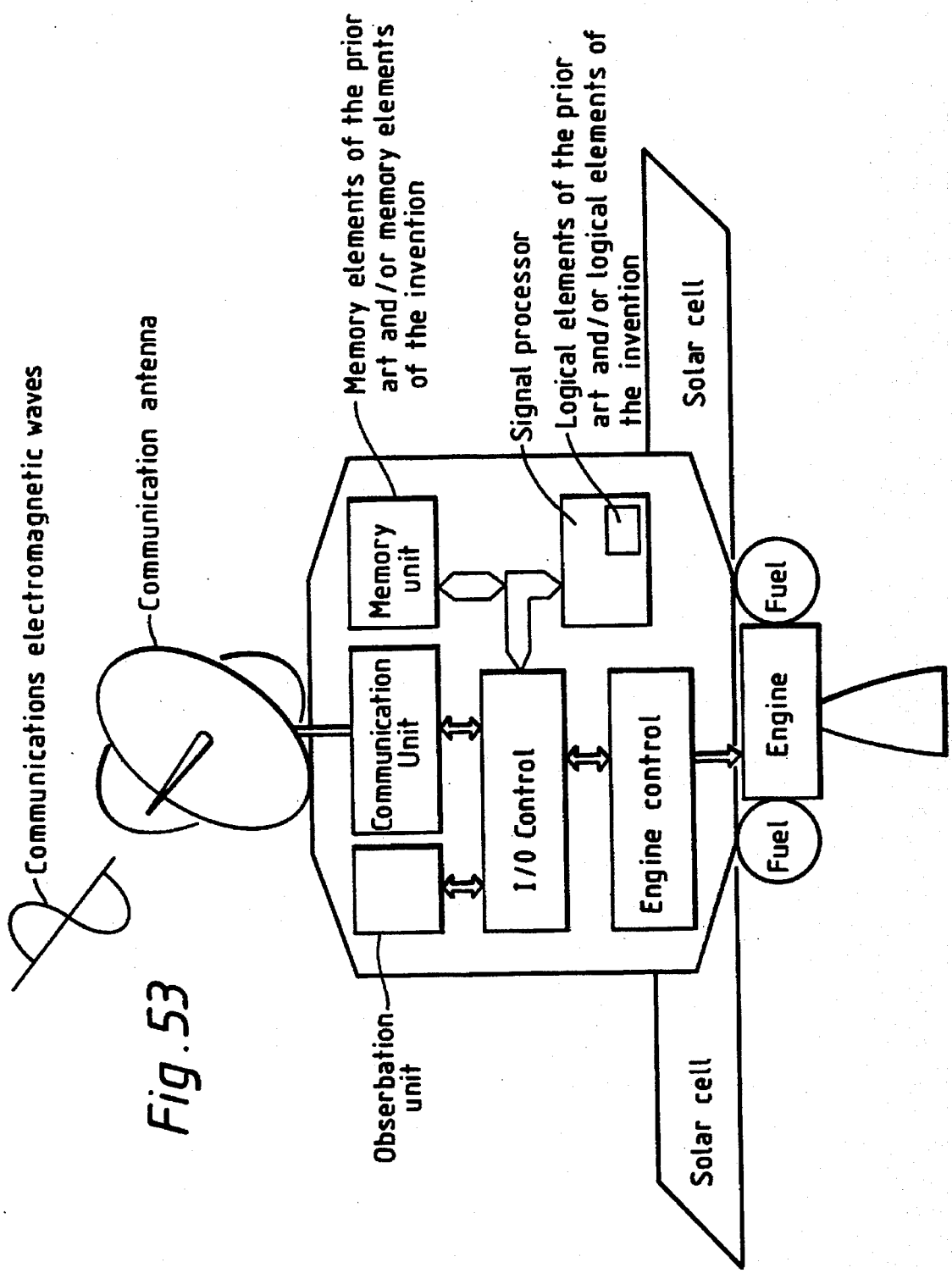
FIG. 53 is a diagram showing an artificial satellite control system of Embodiment 32 of the present invention.
Figure 54:
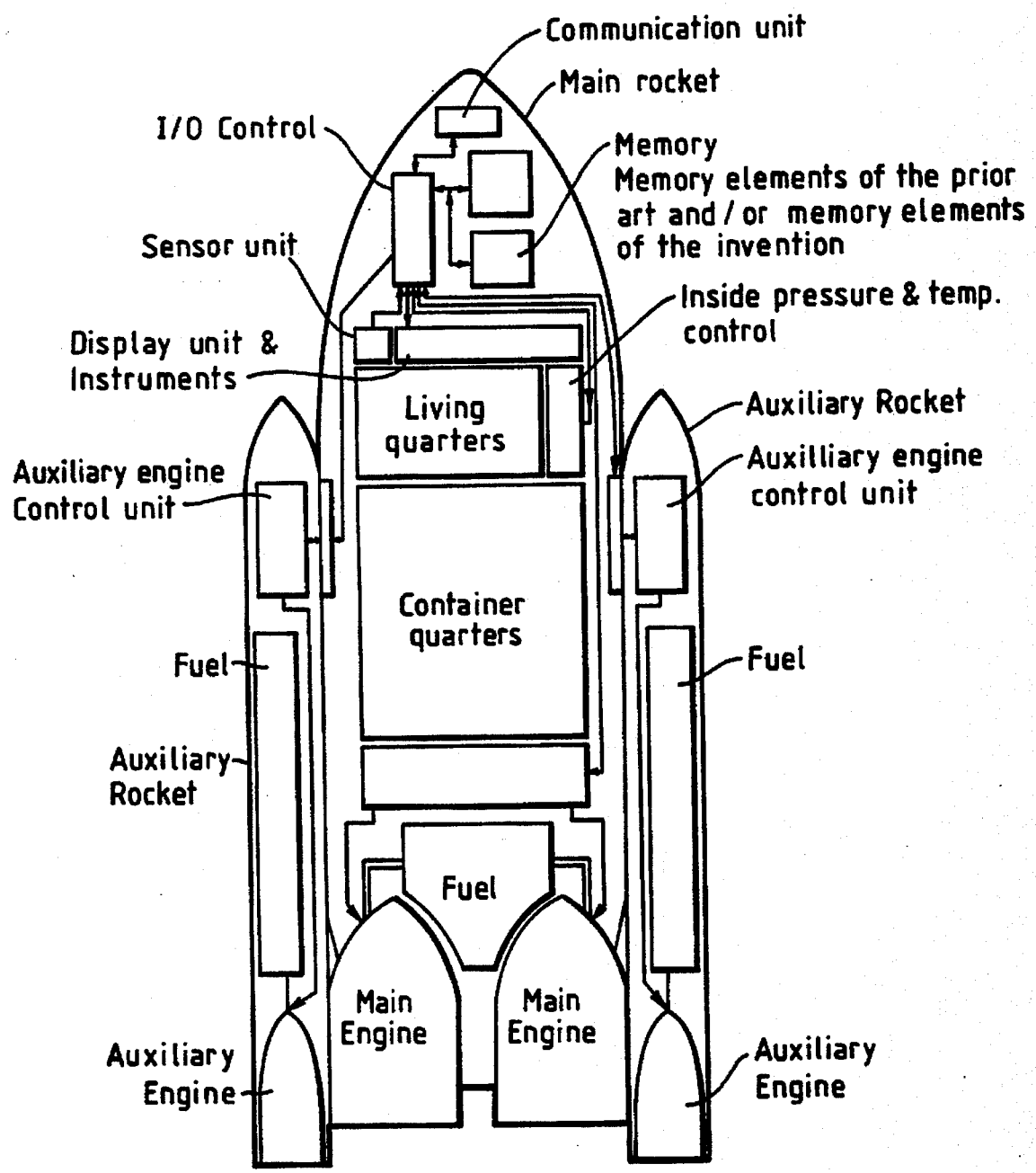
FIG. 54 is a diagram showing a rocket control system of Embodiment 32 of the present invention.

Memory elements of the present invention can be applied, using the same reasoning as that for the control system of an automobile deacribed above, to control systems for aeroplanes, as schematically shown in FIG. 52, artificial satellites or space stations, as schematically shown in FIG. 53, or rockets, as schematically shown in FIG. 54. For artificial satellites, space stations or rockets, the control systems have to be operated in space where the radiation density is far higher than on the earth. Since, however, known memory systems are not highly reliable due to radioactive rays, RAMs of large capacity cannot be provided, and the whole system may have to be large. If DRAMs or FRAMs according to the present invention are used, on the other-hand, the control system can more readily be operated in space even if it has a large capacity, because it is highly resistant to radioactive rays. Since, moreover, it is possible to provide a control system having a high processing ability, a small size, a light weight, and a low power consumption, it is suitable for the aeroplanes, artificial satellites, space stations and rockets.

With the present invention, it becomes possible to provide a structure and drive method for facilitating the increase in the capacity of a semiconductor device having a nonvolatile memory.

Also it is possible to provide a structure and drive method for improving the lifetime of a semiconductor device having a nonvolatile memory. It is further possible to provide a structure and drive method for improving the resistance to external effects of a semiconductor device having a memory.

The present invention also includes making use of such a semiconductor device.

What is claimed is:

1. A semiconductor memory having:
   a) at least one memory cell having at least one ferroelectric capacitive element, said at least one ferroelectric capacitive element having first and second polarization states and being switchable therebetween by respective first and second voltages;
   b) a control circuit for:
      applying said first voltage across said ferroelectric capacitive element, thereby to cause said ferroelectric capacitive element to be in said first state; and
      applying a further voltage across said ferroelectric capacitive element so as to cause said ferroelectric capacitive element to change from said first state to a further state said further voltage being different from that corresponding to said second state; and
   c) measuring means for measuring the change of polarization across said at least one ferroelectric capacitive element between said first state and said further state.

2. A memory device according to claim 1, wherein said at least one memory cell has a switching element having first second and control terminals, and said first terminal of said switching element is connected to a first terminal of said ferroelectric capacitive element.

3. A memory device according to claim 1, having a further memory cell having at least one further ferroelectric capacitive element; wherein said control circuit is arranged to apply a predetermined voltage across said at least one further ferroelectric capacitive element, thereby to cause said at least one further ferroelectric capacitive element to be in a predetermined state, and apply said further voltage across said further ferroelectric capacitive element; and wherein said measuring means is arranged to compare said change in polarization of said at least one ferroelectric capacitive element and said change in polarization of said at least one further ferroelectric capacitive element, thereby to determine whether said first state corresponds to said predetermined state.

4. A memory device according to claim 1, having a plurality of said ferroelectric capacitive elements, and
said plurality of ferroelectric capacitive elements have a first terminal electrically connected together.

5. A memory device according to claim 4, wherein said plurality of ferroelectric capacitive elements have a second terminal electrically connected together and at least two of said plurality of ferroelectric capacitive elements have different ferroelectric properties.

6. A memory device according to claim 1, wherein said at least one memory cell has at least one further capacitive element being other than a ferroelectric capacitive element and said at least one ferroelectric capacitive element have a terminal electrically connected together.

7. A memory device according to claim 1, wherein said at least one memory cell has means for establishing electric fields in a predetermined direction across said at least one ferroelectric capacitive element in response to said first and further voltages, and the polarization axis of said at least one ferroelectric capacitive element is substantially parallel to said predetermined direction.

8. A memory device according to claim 1, wherein said at least one ferroelectric capacitive element has:
a body of ferroelectric material having opposite surfaces;
an insulation layer on each of said opposite surfaces; and
a conductive layer on each of said insulation layers.

9. A semiconductor memory device having at least one memory cell, said at least one memory cell comprising:
at least one switching element having first, second and control terminals; and
a plurality of capacitive elements each having a first terminal connected to said first terminal of said switching element;
wherein at least one of said plurality of capacitive elements is a ferroelectric capacitive element, and at least another of said plurality of capacitive elements is a capacitive element other than a ferroelectric capacitive element.

10. A memory device according to claim 9, wherein the capacitance of said ferroelectric capacitive element is greater than the capacitance of said at least another of said plurality of capacitive elements which is other than a ferroelectric capacitive element.

11. A memory device according to claim 9, wherein more than one of said plurality of capacitive elements is a ferroelectric capacitive element.

12. A semiconductor memory device comprising:
a) at least one memory cell having at least one switching element, said at least one switching element having first, second and control terminals, and a plurality of capacitive elements, each of said plurality of capacitive elements having a first terminal connected to said first terminal of said switching element, and at least two of said plurality of capacitive element being ferroelectric capacitive elements; and
b) control means for:
establishing respective first operating states, for each of said capacitive elements, said respective first operating states of said at least two of said plurality of capacitive elements corresponding to a respective first polarization; and
selectively applying a first voltage to a second terminal of a selected at least one of said capacitive elements and a second voltage, different from said first voltage, to a second terminal of said capacitive elements other than said selected at least one of said capacitive elements; whereby said control means is arranged to change said selected one of said capacitive elements to a second operating state corresponding to a second polarization, and to hold said capacitive elements other than said selected at least one of said capacitive elements in said respective first operating state.

13. A memory device according to claim 12, wherein more than one of said plurality of capacitive elements of said at least one memory cell is a ferroelectric capacitive element.

14. A memory device according to claim 13, wherein said ferroelectric capacitive elements of said at least one memory cell are stacked.

15. A memory device according to claim 14, wherein said ferroelectric capacitive elements are stacked above said switching element of said at least one memory cell.

16. A memory device according to claim 12 having a plurality of said memory cells, wherein a second terminal of a first one of said plurality of capacitive elements of a first one of said memory cells is connected to a second terminal of a first one of said plurality of capacitive elements of a second one of said memory cells, and a second terminal of said first one of said plurality of capacitive elements of said first one of said memory cells is connected to a second terminal of one of said plurality of capacitive elements of a third one of said memory cells.

17. A semiconductor memory device having at least one memory cell; said at least one memory cell having at least one capacitive element and means for establishing an electric field in a predetermined direction across said capacitive element;
wherein the capacitive element of each said memory cell has a ferroelectric body, and the polarization axis of said body is substantially parallel to said predetermined direction.

18. A semiconductor memory device according to claim 17 wherein said ferroelectric body comprises a plurality of ferroelectric crystals and each of said crystals has a surface parallel to said polarization axis.

19. A semiconductor memory device having at least one memory cell; said at least one memory cell having at least one capacitive element and means for establishing an electric field in a predetermined direction across said capacitive element;
wherein said at least one capacitive element of each said memory cell has a ferroelectric body for which at least 80% of thereof has a polarization axis within 5% of said predetermined direction of said electric field.

20. A semiconductor memory device having at least one memory cell; said at least one memory cell having at least one capacitive element and means for establishing an electric field in a predetermined direction across said capacitive element;
wherein the capacitive element of each said memory cell has a ferroelectric body, said ferroelectric body has a plurality of ferroelectric crystals each having a polarization axis and each of said crystals has a surface parallel to the polarization axis of the corresponding crystal.

21. A semiconductor memory device having at least one memory cell, each memory cell having at least one ferroelectric capacitive element, wherein said ferroelectric capacitive element has the polarization axes thereof arranged randomly such that the ferroelectric capacitive element has an isotropic dielectric characteristic.

* * * * *